US010739828B2

(12) United States Patent
Reed et al.

(10) Patent No.: US 10,739,828 B2
(45) Date of Patent: Aug. 11, 2020

(54) COMPUTING DEVICE USING BYPASS ASSEMBLY

(71) Applicant: Molex, LLC, Lisle, IL (US)

(72) Inventors: Bruce Reed, Maumelle, AR (US); Brian Keith Lloyd, Maumelle, AR (US); Gregory Fitzgerald, Merrimack, NH (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/561,100

(22) PCT Filed: May 4, 2016

(86) PCT No.: PCT/US2016/030757
§ 371 (c)(1),
(2) Date: Sep. 25, 2017

(87) PCT Pub. No.: WO2016/179263
PCT Pub. Date: Nov. 10, 2016

(65) Prior Publication Data
US 2018/0120906 A1 May 3, 2018

Related U.S. Application Data

(60) Provisional application No. 62/182,161, filed on Jun. 19, 2015, provisional application No. 62/167,036, (Continued)

(51) Int. Cl.
*G06F 1/18* (2006.01)
*H01R 13/514* (2006.01)
(Continued)

(52) U.S. Cl.
CPC .............. *G06F 1/181* (2013.01); *G06F 1/189* (2013.01); *H01R 13/514* (2013.01);
(Continued)

(58) Field of Classification Search
None
See application file for complete search history.

(56) References Cited

U.S. PATENT DOCUMENTS 3,007,131 A 10/1961 Dahlgren et al.
3,594,613 A 7/1971 Prietula
(Continued)

FOREIGN PATENT DOCUMENTS

CN 1316802 A 10/2001
CN 2624465 Y 7/2004
(Continued)

OTHER PUBLICATIONS

Amphenol TCS, "Amphenol TCS expands the XCede Platform with 85 Ohm Connectors and High-Speed Cable Solutions," Press Release, Published Feb. 25, 2009, http://www.amphenol.com/about/news_archive/2009/58.
(Continued)

*Primary Examiner* — Xanthia C Cunningham
(74) *Attorney, Agent, or Firm* — Molex, LLC

(57) ABSTRACT

A computing device includes a first connector near a first wall. The first connector is in communication with a chip package positioned apart for the first wall via a first cable. The chip package includes a chip supported by a support layer. The chip can be supported by a substrate and/or a circuit board. A second connector can be positioned near a second wall and can also be in communication with the chip package via a second cable. If desired, the substrate or circuit board can include a signal board connector that is configured to engage board connectors terminated to ends of the first and second cables.

22 Claims, 55 Drawing Sheets

Related U.S. Application Data filed on May 27, 2015, provisional application No. 62/156,602, filed on May 4, 2015, provisional application No. 62/156,708, filed on May 4, 2015.

(51) Int. Cl.
*H01R 13/6583* (2011.01)
*H01R 24/60* (2011.01)
*H05K 7/14* (2006.01)
*H01R 13/512* (2006.01)
*H01R 12/79* (2011.01)

(52) U.S. Cl.
CPC ......... *H01R 13/6583* (2013.01); *H01R 24/60* (2013.01); *H05K 7/1485* (2013.01); *H05K 7/1487* (2013.01); *H01R 12/79* (2013.01); *H01R 13/512* (2013.01)

(56) References Cited

U.S. PATENT DOCUMENTS

| | | | |
|---|---|---|---|
| 3,963,319 A | 6/1976 | Schumacher et al. | |
| 4,025,141 A | 5/1977 | Thelissen | |
| 4,072,387 A | 2/1978 | Sochor | |
| 4,083,615 A | 4/1978 | Volinskie | |
| 4,157,612 A | 6/1979 | Rainal | |
| 4,290,664 A | 9/1981 | Davis et al. | |
| 4,307,926 A | 12/1981 | Smith | |
| 4,346,355 A | 8/1982 | Tsukii | |
| 4,417,779 A | 11/1983 | Wilson | |
| 4,508,403 A | 4/1985 | Weltman | |
| 4,611,186 A | 9/1986 | Ziegner | |
| 4,615,578 A | 10/1986 | Stadler | |
| 4,639,054 A | 1/1987 | Kersbergen | |
| 4,656,441 A | 4/1987 | Takahashi et al. | |
| 4,657,329 A | 4/1987 | Dechelette | |
| 4,679,321 A | 7/1987 | Plonski | |
| 4,697,862 A | 10/1987 | Hasircoglu | |
| 4,724,409 A | 2/1988 | Lehman | |
| 4,889,500 A | 12/1989 | Lazar | |
| 4,924,179 A | 5/1990 | Sherman | |
| 4,948,379 A | 8/1990 | Evans | |
| 4,984,992 A | 1/1991 | Beamenderfer et al. | |
| 4,991,001 A | 2/1991 | Takubo et al. | |
| 5,112,251 A | 5/1992 | Cesar | |
| 5,197,893 A | 3/1993 | Morlion et al. | |
| 5,332,979 A | 7/1994 | Roskewitsch | |
| 5,387,130 A | 2/1995 | Fedder et al. | |
| 5,402,088 A | 3/1995 | Pierro et al. | |
| 5,435,757 A | 7/1995 | Fedder et al. | |
| 5,441,424 A | 8/1995 | Morlion et al. | |
| 5,487,673 A | 1/1996 | Hurtarte | |
| 5,509,827 A * | 4/1996 | Huppenthal | H01R 12/775 333/260 |
| 5,554,038 A | 9/1996 | Morlion et al. | |
| 5,598,627 A | 2/1997 | Saka et al. | |
| 5,632,634 A | 5/1997 | Soes | |
| 5,691,506 A | 11/1997 | Miyazaki et al. | |
| 5,781,759 A | 7/1998 | Kashiwabara | |
| 5,784,644 A * | 7/1998 | Larabell | G06F 13/409 710/14 |
| 5,813,243 A * | 9/1998 | Johnson | G06F 1/20 361/678 |
| 5,876,239 A | 3/1999 | Morin et al. | |
| 6,004,139 A | 12/1999 | Dramstad | |
| 6,053,770 A | 4/2000 | Blom | |
| 6,083,046 A | 7/2000 | Wu et al. | |
| 6,095,872 A | 8/2000 | Lang et al. | |
| 6,098,127 A * | 8/2000 | Kwang | H01R 31/005 361/679.4 |
| 6,144,559 A | 11/2000 | Johnson et al. | |
| 6,156,981 A | 12/2000 | Ward et al. | |
| 6,203,376 B1 | 3/2001 | Magajne et al. | |
| 6,216,184 B1 * | 4/2001 | Fackenthall | G06F 1/181 710/301 |
| 6,255,741 B1 | 7/2001 | Yoshihara | |
| 6,266,712 B1 | 7/2001 | Henrichs | |
| 6,273,753 B1 | 8/2001 | Ko | |
| 6,273,758 B1 | 8/2001 | Lloyd | |
| 6,366,471 B1 | 4/2002 | Edwards et al. | |
| 6,368,120 B1 | 4/2002 | Scherer | |
| 6,371,788 B1 | 4/2002 | Bowling et al. | |
| 6,452,789 B1 | 9/2002 | Pallotti et al. | |
| 6,489,563 B1 | 12/2002 | Zhao et al. | |
| 6,535,367 B1 | 3/2003 | Carpenter | |
| 6,538,903 B1 * | 3/2003 | Radu | G06F 1/181 174/359 |
| 6,574,115 B2 | 6/2003 | Asano et al. | |
| 6,575,772 B1 | 6/2003 | Soubh et al. | |
| 6,592,401 B1 | 7/2003 | Gardner et al. | |
| 6,652,296 B2 | 11/2003 | Kuroda et al. | |
| 6,652,318 B1 | 11/2003 | Winings et al. | |
| 6,667,891 B2 * | 12/2003 | Coglitore | G06F 1/18 361/784 |
| 6,685,501 B1 | 2/2004 | Wu et al. | |
| 6,692,262 B1 * | 2/2004 | Loveless | H01R 24/50 439/581 |
| 6,705,893 B1 | 3/2004 | Ko | |
| 6,780,069 B2 | 8/2004 | Scherer | |
| 6,797,891 B1 | 9/2004 | Blair et al. | |
| 6,824,426 B1 | 11/2004 | Spink, Jr. | |
| 6,843,657 B2 | 1/2005 | Driscoll et al. | |
| 6,859,854 B2 * | 2/2005 | Kwong | G06F 3/0607 361/679.33 |
| 6,882,241 B2 | 4/2005 | Abo et al. | |
| 6,903,934 B2 | 6/2005 | Lo | |
| 6,910,914 B1 | 6/2005 | Spink, Jr. | |
| 6,916,183 B2 | 7/2005 | Alger et al. | |
| 6,955,565 B2 | 10/2005 | Lloyd | |
| 6,969,270 B2 | 11/2005 | Renfro | |
| 6,969,280 B2 | 11/2005 | Chien | |
| 6,971,887 B1 | 12/2005 | Trobough | |
| 7,004,765 B2 | 2/2006 | Hsu | |
| 7,004,793 B2 | 2/2006 | Scherer | |
| 7,008,234 B1 * | 3/2006 | Brown | H01R 13/518 439/61 |
| 7,044,772 B2 | 5/2006 | McCreery | |
| 7,052,292 B2 | 5/2006 | Hsu et al. | |
| 7,056,128 B2 | 6/2006 | Driscoll et al. | |
| 7,066,756 B2 | 6/2006 | Lange et al. | |
| 7,070,446 B2 | 7/2006 | Henry | |
| 7,108,522 B2 | 9/2006 | Verelst et al. | |
| 7,148,428 B2 | 12/2006 | Meier et al. | |
| 7,168,961 B2 | 1/2007 | Hsieh | |
| 7,175,446 B2 | 2/2007 | Bright | |
| 7,192,300 B2 | 3/2007 | Hashiguchi et al. | |
| 7,214,097 B1 | 5/2007 | Hsu et al. | |
| 7,223,915 B2 * | 5/2007 | Hackman | H01R 13/6658 174/36 |
| 7,234,944 B2 * | 6/2007 | Nordin | H04Q 1/136 439/49 |
| 7,244,137 B2 | 7/2007 | Renfro et al. | |
| 7,280,372 B2 | 10/2007 | Grundy et al. | |
| 7,307,293 B2 | 12/2007 | Fjelstad et al. | |
| 7,331,816 B2 * | 2/2008 | Krohn | H01R 13/6471 439/502 |
| 7,384,275 B2 | 6/2008 | Ngo | |
| 7,394,665 B2 | 7/2008 | Hamasaki et al. | |
| 7,402,048 B2 | 7/2008 | Meier et al. | |
| 7,431,608 B2 | 10/2008 | Sakaguchi et al. | |
| 7,445,471 B1 | 11/2008 | Scherer et al. | |
| 7,462,924 B2 | 12/2008 | Shuey | |
| 7,489,514 B2 | 2/2009 | Hamasaki | |
| 7,534,142 B2 | 5/2009 | Avery | |
| 7,540,773 B2 | 6/2009 | Ko | |
| 7,549,897 B2 | 6/2009 | Fedder et al. | |
| 7,621,779 B2 | 11/2009 | Laurx et al. | |
| 7,637,767 B2 | 12/2009 | Davis | |
| 7,654,831 B1 | 2/2010 | Wu | |
| 7,658,654 B2 | 2/2010 | Ohyama | |
| 7,690,930 B2 | 4/2010 | Chen et al. | |
| 7,719,843 B2 * | 5/2010 | Dunham | G11B 33/128 312/223.1 |

(56) References Cited

U.S. PATENT DOCUMENTS

| | | | |
|---|---|---|---|
| 7,737,360 B2* | 6/2010 | Wiemeyer | H04Q 1/13 |
| | | | 174/481 |
| 7,744,385 B2 | 6/2010 | Scherer | |
| 7,744,403 B2 | 6/2010 | Barr | |
| 7,744,414 B2 | 6/2010 | Scherer et al. | |
| 7,748,988 B2 | 7/2010 | Hori | |
| 7,771,207 B2 | 8/2010 | Hamner et al. | |
| 7,789,529 B2 | 9/2010 | Roberts | |
| 7,813,146 B1* | 10/2010 | Phan | G06F 1/189 |
| | | | 361/792 |
| 7,819,675 B2 | 10/2010 | Ko et al. | |
| 7,824,197 B1 | 11/2010 | Westman | |
| 7,857,629 B2 | 12/2010 | Chin | |
| 7,857,630 B2 | 12/2010 | Hermant et al. | |
| 7,862,344 B2 | 1/2011 | Morgan | |
| 7,892,019 B2 | 2/2011 | Rao et al. | |
| 7,906,730 B2 | 3/2011 | Atkinson et al. | |
| 7,931,502 B2 | 4/2011 | Iida | |
| 7,985,097 B2 | 7/2011 | Gulla | |
| 7,997,933 B2 | 8/2011 | Feldman | |
| 8,002,583 B2 | 8/2011 | van Woensel | |
| 8,018,733 B2 | 9/2011 | Jia | |
| 8,036,500 B2 | 10/2011 | McColloch | |
| 8,089,779 B2* | 1/2012 | Fietz | H05K 7/1487 |
| | | | 361/740 |
| 8,096,813 B2* | 1/2012 | Biggs | H01R 31/06 |
| | | | 439/76.1 |
| 8,157,573 B2 | 4/2012 | Tanaka | |
| 8,162,675 B2 | 4/2012 | Regnier | |
| 8,187,038 B2 | 5/2012 | Kamiya | |
| 8,192,222 B2* | 6/2012 | Kameyama | H01R 9/03 |
| | | | 439/404 |
| 8,226,441 B2 | 7/2012 | Regnier | |
| 8,308,491 B2 | 11/2012 | Nichols et al. | |
| 8,337,243 B2* | 12/2012 | Elkhatib | H01R 12/594 |
| | | | 439/581 |
| 8,338,713 B2 | 12/2012 | Fjelstad et al. | |
| 8,398,433 B1 | 3/2013 | Yang | |
| 8,419,472 B1 | 4/2013 | Swanger | |
| 8,435,074 B1 | 5/2013 | Grant | |
| 8,439,704 B2 | 5/2013 | Reed | |
| 8,449,312 B2 | 5/2013 | Lan | |
| 8,449,330 B1 | 5/2013 | Schroll | |
| 8,465,302 B2 | 6/2013 | Regnier | |
| 8,480,413 B2 | 7/2013 | Minich | |
| 8,517,765 B2 | 8/2013 | Schroll | |
| 8,535,069 B2 | 9/2013 | Zhang | |
| 8,540,525 B2 | 9/2013 | Regnier | |
| 8,575,529 B2 | 9/2013 | Asahi | |
| 8,553,102 B2* | 10/2013 | Yamada | H05K 1/0216 |
| | | | 348/222.1 |
| 8,575,491 B2 | 11/2013 | Gundel et al. | |
| 8,585,442 B2* | 11/2013 | Tuma | G06F 1/185 |
| | | | 361/737 |
| 8,588,561 B2 | 11/2013 | Zbinden | |
| 8,597,055 B2 | 12/2013 | Regnier | |
| 8,651,890 B2 | 2/2014 | Chiarelli | |
| 8,672,707 B2 | 3/2014 | Nichols et al. | |
| 8,687,350 B2* | 4/2014 | Santos | G06F 1/183 |
| | | | 361/679.02 |
| 8,690,604 B2 | 4/2014 | Davis | |
| 8,715,003 B2 | 5/2014 | Buck | |
| 8,740,644 B2 | 6/2014 | Long | |
| 8,747,158 B2 | 6/2014 | Szczesny | |
| 8,753,145 B2 | 6/2014 | Lang | |
| 8,758,051 B2 | 6/2014 | Nonen et al. | |
| 8,764,483 B2 | 7/2014 | Ellison | |
| 8,784,122 B2 | 7/2014 | Soubh | |
| 8,787,711 B2 | 7/2014 | Zbinden | |
| 8,794,991 B2 | 8/2014 | Ngo | |
| 8,804,342 B2 | 8/2014 | Behziz et al. | |
| 8,814,595 B2 | 8/2014 | Cohen et al. | |
| 8,834,190 B2 | 9/2014 | Ngo | |
| 8,864,521 B2 | 10/2014 | Atkinson et al. | |
| 8,888,533 B2 | 11/2014 | Westman et al. | |
| 8,905,767 B2 | 12/2014 | Putt, Jr. et al. | |
| 8,911,255 B2 | 12/2014 | Scherer et al. | |
| 8,926,342 B2 | 1/2015 | Vinther | |
| 8,926,377 B2 | 1/2015 | Kirk | |
| 8,992,236 B2 | 3/2015 | Wittig | |
| 8,992,237 B2 | 3/2015 | Regnier | |
| 8,992,258 B2 | 3/2015 | Raschilla | |
| 9,011,177 B2 | 4/2015 | Lloyd | |
| 9,028,281 B2 | 5/2015 | Kirk | |
| 9,035,183 B2 | 5/2015 | Kodama et al. | |
| 9,040,824 B2 | 5/2015 | Guetig et al. | |
| 9,054,432 B2 | 6/2015 | Yang | |
| 9,071,001 B2 | 6/2015 | Scherer et al. | |
| 9,119,292 B2 | 8/2015 | Gundel | |
| 9,136,652 B2 | 9/2015 | Ngo | |
| 9,142,921 B2 | 9/2015 | Wanha et al. | |
| 9,155,214 B2 | 10/2015 | Ritter | |
| 9,160,123 B1 | 10/2015 | Pao | |
| 9,160,151 B2 | 10/2015 | Vinther | |
| 9,161,463 B2 | 10/2015 | Takamura | |
| 9,166,320 B1 | 10/2015 | Herring | |
| 9,196,983 B2 | 11/2015 | Saur et al. | |
| 9,203,171 B2 | 12/2015 | Yu | |
| 9,209,539 B2 | 12/2015 | Herring | |
| 9,214,756 B2 | 12/2015 | Nishio | |
| 9,214,768 B2 | 12/2015 | Pao | |
| 9,232,676 B2 | 1/2016 | Sechrist et al. | |
| 9,246,251 B2 | 1/2016 | Regnier | |
| 9,277,649 B2 | 3/2016 | Ellison | |
| 9,292,055 B2* | 3/2016 | Wu | G06F 1/185 |
| 9,312,618 B2* | 4/2016 | Regnier | H01R 9/2408 |
| 9,331,432 B1 | 5/2016 | Phillips | |
| 9,350,108 B2 | 5/2016 | Long | |
| 9,356,366 B2 | 5/2016 | Moore | |
| 9,385,455 B2 | 7/2016 | Regnier | |
| 9,391,407 B1 | 7/2016 | Bucher | |
| 9,401,563 B2 | 7/2016 | Simpson | |
| 9,413,090 B2 | 8/2016 | Nagamine | |
| 9,413,097 B2 | 8/2016 | Tamarkin et al. | |
| 9,413,112 B2 | 8/2016 | Helster | |
| 9,431,773 B2 | 8/2016 | Chen | |
| 9,437,981 B2 | 9/2016 | Wu | |
| 9,455,538 B2 | 9/2016 | Nishio | |
| 9,484,671 B2 | 11/2016 | Zhu | |
| 9,484,673 B1 | 11/2016 | Yang | |
| 9,490,587 B1 | 11/2016 | Phillips | |
| 9,496,655 B2 | 11/2016 | Huang | |
| 9,515,429 B2 | 12/2016 | DeGeest | |
| 9,525,245 B2 | 12/2016 | Regnier | |
| 9,543,688 B2 | 1/2017 | Pao | |
| 9,553,381 B2* | 1/2017 | Regnier | H01R 13/6473 |
| 9,559,465 B2 | 1/2017 | Phillips | |
| 9,565,780 B2 | 2/2017 | Nishio | |
| 9,608,388 B2 | 3/2017 | Kondo | |
| 9,608,590 B2 | 3/2017 | Hamner | |
| 9,627,818 B1 | 4/2017 | Chen | |
| 9,660,364 B2* | 5/2017 | Wig | H01R 12/53 |
| 9,666,998 B1 | 5/2017 | deBoer | |
| 9,673,570 B2 | 6/2017 | Briant | |
| 9,705,258 B2* | 7/2017 | Phillips | H01R 13/6581 |
| 9,812,799 B2 | 11/2017 | Wittig | |
| 9,985,367 B2* | 5/2018 | Wanha | H01R 13/6477 |
| 2001/0016438 A1 | 8/2001 | Reed | |
| 2002/0111067 A1 | 8/2002 | Sakurai et al. | |
| 2002/0157865 A1 | 10/2002 | Noda | |
| 2002/0180554 A1 | 12/2002 | Clark et al. | |
| 2003/0064616 A1 | 4/2003 | Reed et al. | |
| 2003/0073331 A1 | 4/2003 | Peloza et al. | |
| 2003/0180006 A1* | 9/2003 | Loh | G02B 6/4214 |
| | | | 385/88 |
| 2003/0222282 A1 | 12/2003 | Fjelstad et al. | |
| 2004/0094328 A1 | 5/2004 | Fjelstad et al. | |
| 2004/0121633 A1 | 6/2004 | David et al. | |
| 2004/0155328 A1 | 8/2004 | Kline | |
| 2004/0155734 A1 | 8/2004 | Kosemura et al. | |
| 2004/0229510 A1 | 11/2004 | Lloyd | |
| 2004/0264894 A1 | 12/2004 | Cooke | |
| 2005/0006126 A1 | 1/2005 | Aisenbrey | |

(56) References Cited

U.S. PATENT DOCUMENTS

| | | |
|---|---|---|
| 2005/0051810 A1 | 3/2005 | Funakura |
| 2005/0093127 A1 | 5/2005 | Fjelstad et al. |
| 2005/0130490 A1 | 6/2005 | Rose |
| 2005/0142944 A1* | 6/2005 | Ling .................... H01R 13/658 439/607.05 |
| 2005/0239339 A1 | 10/2005 | Pepe |
| 2006/0001163 A1 | 1/2006 | Kolbehdari et al. |
| 2006/0035523 A1 | 2/2006 | Kuroda et al. |
| 2006/0038287 A1 | 2/2006 | Hamasaki |
| 2006/0079102 A1 | 4/2006 | DeLessert |
| 2006/0079119 A1 | 4/2006 | Wu |
| 2006/0091507 A1 | 5/2006 | Fjelstad et al. |
| 2006/0114016 A1 | 6/2006 | Suzuki |
| 2006/0160399 A1 | 7/2006 | Dawiedczyk |
| 2006/0189212 A1 | 8/2006 | Avery |
| 2006/0194475 A1 | 8/2006 | Miyazaki |
| 2006/0216969 A1* | 9/2006 | Bright .................. H01R 23/688 439/79 |
| 2006/0228922 A1 | 10/2006 | Morriss |
| 2006/0234556 A1 | 10/2006 | Wu |
| 2006/0238991 A1 | 10/2006 | Drako |
| 2006/0282724 A1 | 12/2006 | Roulo |
| 2006/0292898 A1 | 12/2006 | Meredith |
| 2007/0032104 A1 | 2/2007 | Yamada |
| 2007/0141871 A1 | 6/2007 | Scherer |
| 2007/0243741 A1 | 10/2007 | Yang |
| 2008/0024999 A1* | 1/2008 | Huang .................... G06F 1/181 361/724 |
| 2008/0131997 A1 | 6/2008 | Kim et al. |
| 2008/0171476 A1 | 7/2008 | Liu |
| 2008/0186666 A1* | 8/2008 | Wu ........................ G06F 1/189 361/679.33 |
| 2008/0297988 A1 | 12/2008 | Chau |
| 2008/0305689 A1 | 12/2008 | Zhang et al. |
| 2009/0023330 A1 | 1/2009 | Stoner et al. |
| 2009/0166082 A1* | 7/2009 | Liu ...................... H01B 7/0823 174/359 |
| 2009/0174991 A1* | 7/2009 | Mahdavi ................ G06F 1/189 361/679.02 |
| 2009/0215309 A1 | 8/2009 | Mongold ............. H01R 12/592 439/495 |
| 2010/0042770 A1* | 2/2010 | Chuang ................ G06F 13/409 710/304 |
| 2010/0068944 A1 | 3/2010 | Scherer |
| 2010/0112850 A1 | 5/2010 | Rao |
| 2010/0159829 A1 | 6/2010 | McCormack |
| 2010/0177489 A1 | 7/2010 | Yagisawa |
| 2010/0190373 A1* | 7/2010 | Yeh ...................... H01R 12/592 439/499 |
| 2010/0203768 A1* | 8/2010 | Kondo ............... H01R 13/6474 439/676 |
| 2011/0074213 A1 | 3/2011 | Schaffer |
| 2011/0080719 A1 | 4/2011 | Jia |
| 2011/0136387 A1 | 6/2011 | Matsuura |
| 2011/0177699 A1 | 7/2011 | Crofoot et al. |
| 2011/0212633 A1 | 9/2011 | Regnier |
| 2011/0230104 A1 | 9/2011 | Lang |
| 2011/0263156 A1 | 10/2011 | Ko |
| 2011/0300757 A1 | 12/2011 | Regnier |
| 2011/0304966 A1 | 12/2011 | Schrempp |
| 2012/0003848 A1* | 1/2012 | Casher ................. H05K 1/0222 439/65 |
| 2012/0033370 A1* | 2/2012 | Reinke .................. G06F 1/185 361/679.4 |
| 2012/0034820 A1 | 2/2012 | Lang |
| 2012/0225585 A1 | 9/2012 | Lee |
| 2012/0246373 A1* | 9/2012 | Chang ................. G06F 13/409 710/301 |
| 2013/0005178 A1 | 1/2013 | Straka et al. |
| 2013/0012038 A1 | 1/2013 | Kirk |
| 2013/0017715 A1 | 1/2013 | Van Laarhoven |
| 2013/0040482 A1 | 2/2013 | Ngo |
| 2013/0092429 A1 | 4/2013 | Ellison |
| 2013/0148321 A1 | 6/2013 | Liang |
| 2013/0340251 A1 | 12/2013 | Regnier |
| 2014/0041937 A1 | 2/2014 | Lloyd |
| 2014/0073173 A1 | 3/2014 | Yang |
| 2014/0073174 A1 | 3/2014 | Yang |
| 2014/0073181 A1 | 3/2014 | Yang |
| 2014/0111293 A1 | 4/2014 | Madeberg et al. |
| 2014/0217571 A1 | 8/2014 | Ganesan et al. |
| 2014/0242844 A1 | 8/2014 | Wanha |
| 2014/0273551 A1* | 9/2014 | Resendez ............. H01R 12/737 439/65 |
| 2014/0273594 A1 | 9/2014 | Jones et al. |
| 2014/0335736 A1 | 11/2014 | Regnier |
| 2015/0013936 A1 | 1/2015 | Mack |
| 2015/0079845 A1 | 3/2015 | Wanha |
| 2015/0090491 A1 | 4/2015 | Dunwoody |
| 2015/0180578 A1* | 6/2015 | Leigh .................... G02B 6/4284 398/135 |
| 2015/0207247 A1* | 7/2015 | Regnier ............... H01R 9/2408 439/78 |
| 2015/0212961 A1* | 7/2015 | Wu ..................... G06F 13/4022 710/313 |
| 2016/0013596 A1 | 1/2016 | Regnier |
| 2016/0064119 A1 | 3/2016 | Grant |
| 2016/0104956 A1* | 4/2016 | Santos ................. H01R 9/0518 324/754.03 |
| 2016/0181713 A1 | 6/2016 | Peloza |
| 2016/0190720 A1 | 6/2016 | Lindkamp |
| 2016/0190747 A1 | 6/2016 | Regnier |
| 2016/0197423 A1 | 7/2016 | Regnier |
| 2016/0218455 A1 | 7/2016 | Sayre |
| 2016/0233598 A1* | 8/2016 | Wittig .................. H01R 12/515 |
| 2016/0233615 A1 | 8/2016 | Scholeno |
| 2016/0336692 A1 | 11/2016 | Champion |
| 2016/0380383 A1 | 12/2016 | Lord |
| 2017/0033482 A1 | 2/2017 | Liao |
| 2017/0033509 A1 | 2/2017 | Liao |
| 2017/0077621 A1 | 3/2017 | Liao |
| 2017/0098901 A1 | 4/2017 | Regnier |
| 2017/0110222 A1 | 4/2017 | Liptak et al. |
| 2017/0162960 A1 | 6/2017 | Wanha |
| 2017/0302036 A1 | 10/2017 | Regnier |
| 2017/0365942 A1 | 12/2017 | Regnier |
| 2018/0034175 A1 | 2/2018 | Lloyd |

FOREIGN PATENT DOCUMENTS

| | | |
|---|---|---|
| CN | 1647323 A | 7/2005 |
| CN | 1266813 C | 7/2006 |
| CN | 101656384 A | 2/2010 |
| CN | 102074825 A | 5/2011 |
| CN | 102365907 A | 2/2012 |
| DE | 3447556 A1 | 7/1986 |
| JP | 02-079571 U | 6/1990 |
| JP | 04-14372 U1 | 2/1992 |
| JP | 05-059761 U | 8/1993 |
| JP | H10-145767 A | 5/1998 |
| JP | 2008-041285 A | 2/2008 |
| JP | 2008-059857 A | 3/2008 |
| JP | 2009-043590 A | 2/2009 |
| JP | 2010-017388 A | 1/2010 |
| JP | 2010-123274 A | 6/2010 |
| JP | 2011-103442 A | 5/2011 |
| JP | 2013-016394 A | 1/2013 |
| JP | 2014-045080 A | 3/2014 |
| TW | M359141 U | 6/2009 |
| TW | M408835 U | 8/2011 |
| TW | 201225455 A | 6/2012 |
| WO | WO 2008-072322 A1 | 6/2008 |
| WO | WO 2012-078434 A2 | 6/2012 |
| WO | WO 2013-006592 A2 | 1/2013 |
| WO | 2016/112379 A1 | 7/2016 |

OTHER PUBLICATIONS

Amphenol Aerospace, "Size 8 High Speed Quadrax and Differential Twinax Contacts for Use in MIL-DTL-38999 Special Subminiature Cylindrical and ARINC 600 Rectangular Connectors", published

(56) References Cited

OTHER PUBLICATIONS

May 2008. Retrieved from www.peigenesis.com/images/content/news/amphenol_quadrax.pdf.
Hitachi Cable America Inc., "Direct Attach Cables: OMNIBIT supports 25 Gbit/s interconnections". Retrieved Aug. 10, 2017 from www.hca.hitachi-cable.com/products/hca/catalog/pdfs/direct-attach-cable-assemblies.pdf.
"Wrt54gl-layout.jpg-Embedded Xinu", Internet Citation, Sep. 8, 2006. Retrieved from the Internet: URL:http.//xinu.mscs.edu/File:Wrt54gl-layout.jpg [retrieved on Sep. 23, 2014].
U.S. Appl. No. 61/714,871, filed Oct. 17, 2012, Wig et al.
Agilent, "Designing Scalable 10G Backplane Interconnect Systems Utilizing Advanced Verification Methodologies," White Paper, Published May 5, 2012, USA.
International Search Report and Written Opinion received for PCT application No. PCT/US2016/012848, dated Apr. 25, 2016, 11 pages.
International Preliminary Report on Patentability received for PCT Application No. PCT/US2016/012848, dated Jul. 20, 2017, 10 pages.
Office Action received for Japanese Patent Application No. 2017-557303, dated Nov. 6, 2018, 10 pages. (5 pages of English Translation and 5 pages of Official).
Decision to Grant received for Japanese Patent Application No. 2017-557303, dated Jul. 16, 2019, 5 pages. (2 Pages of English Translation and 3 pages of Official).

\* cited by examiner

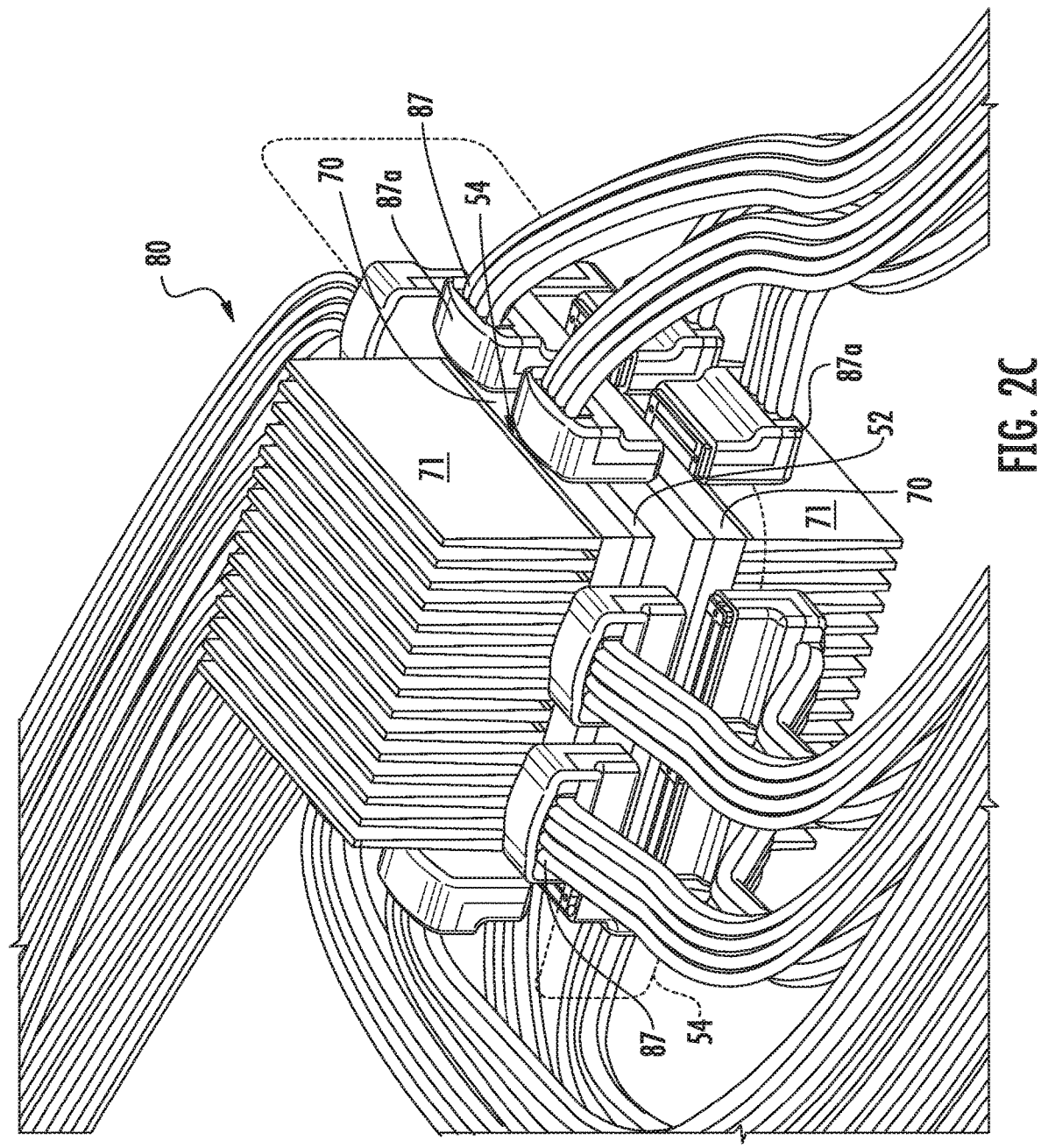

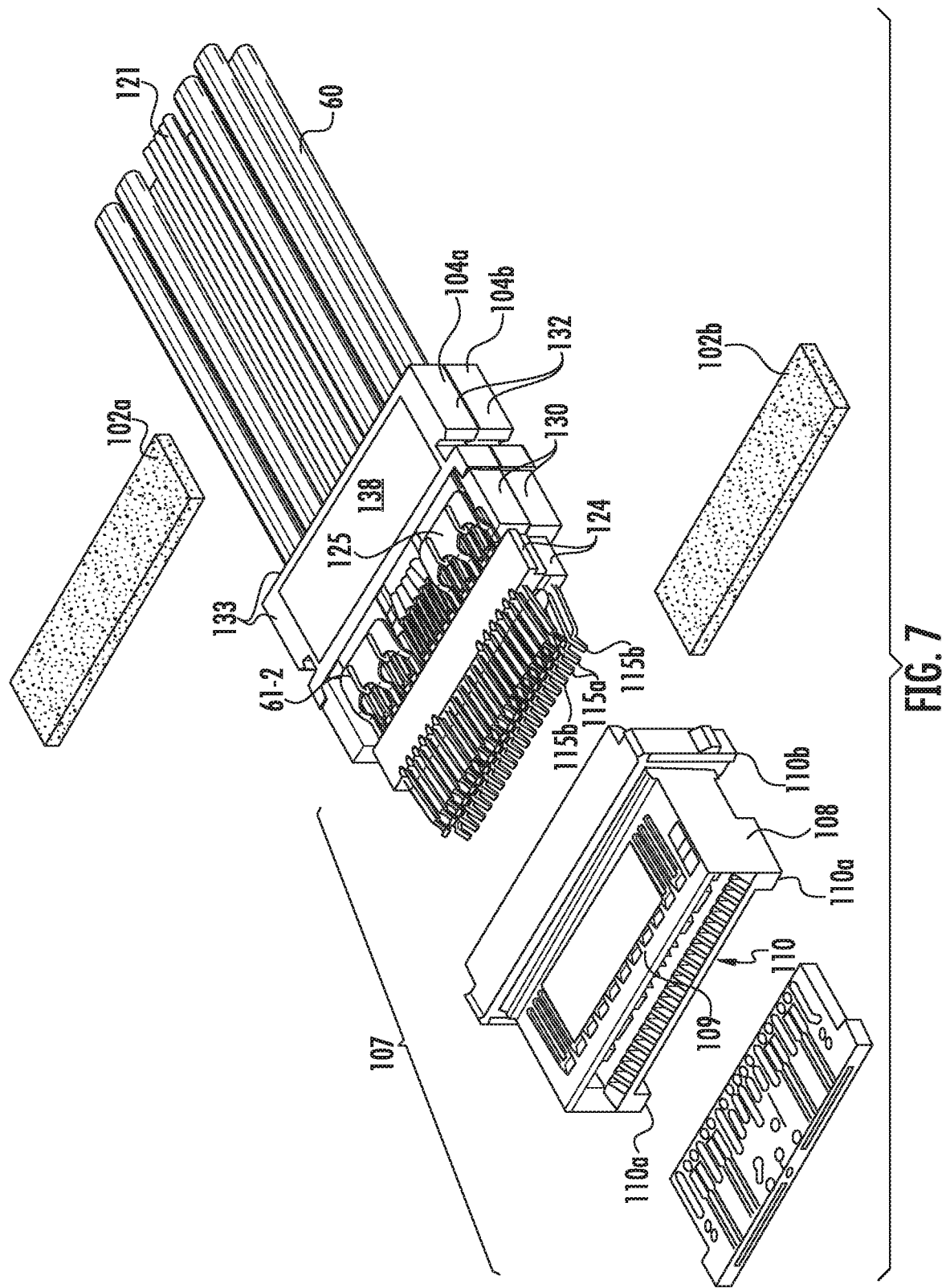

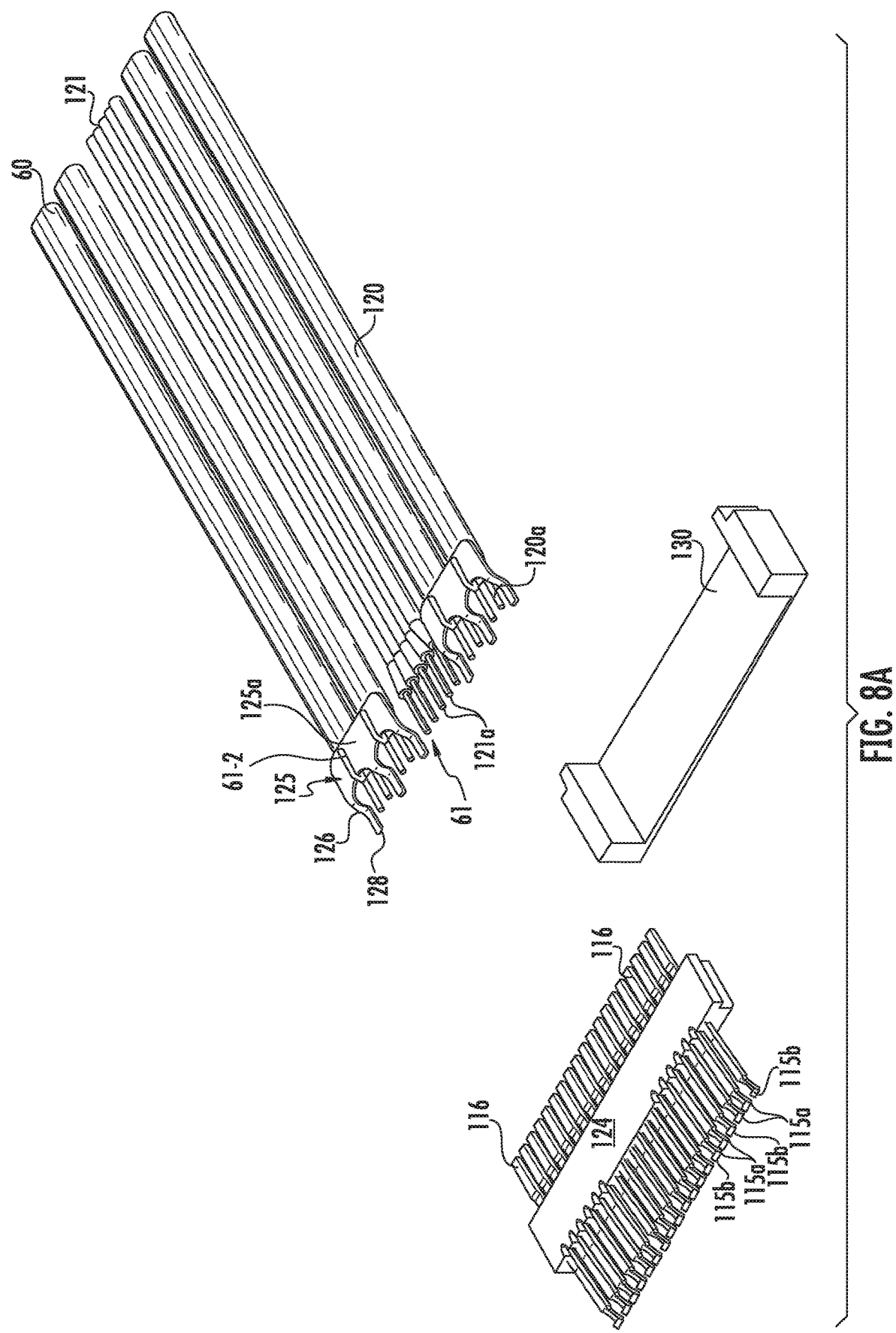

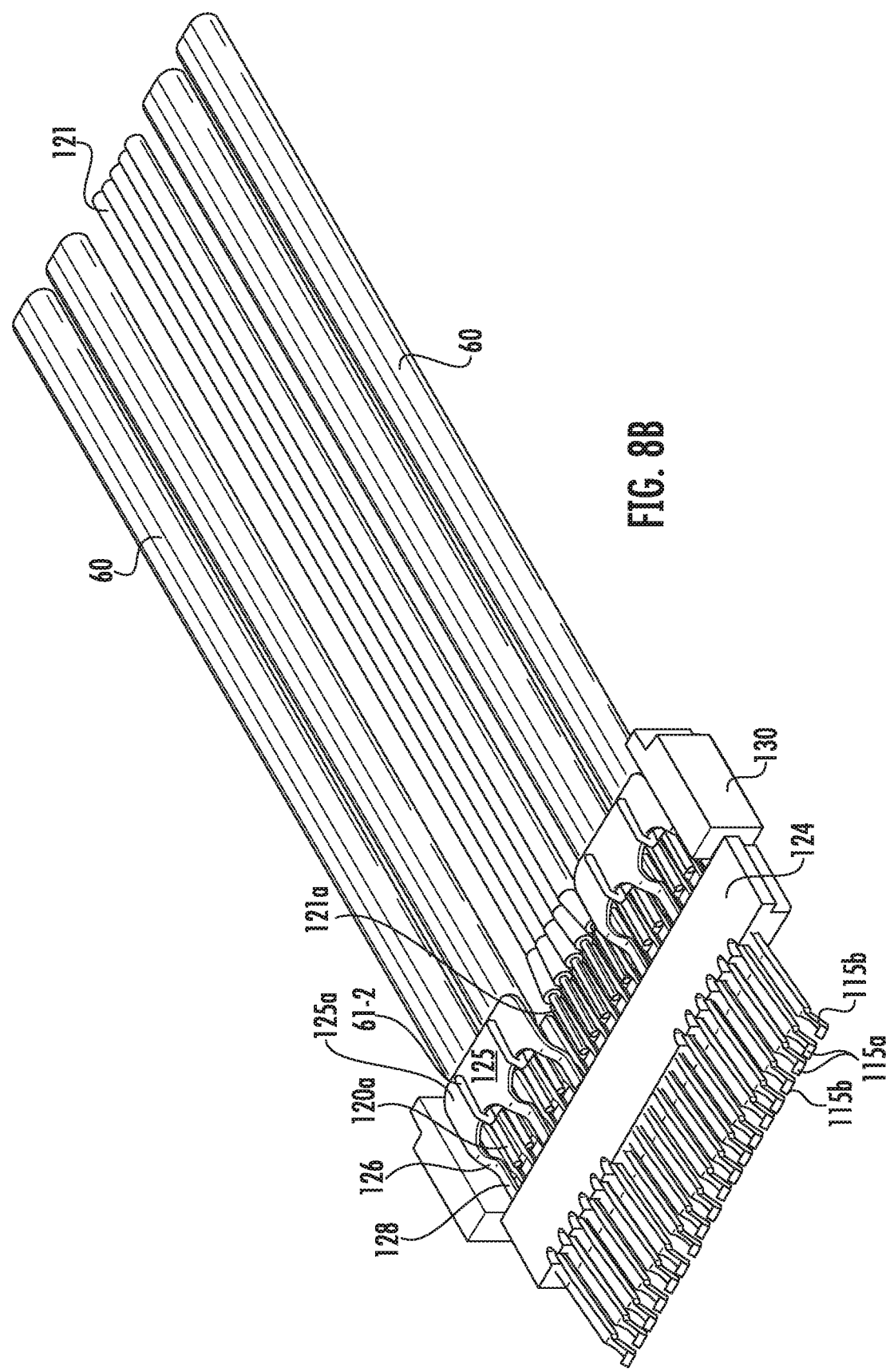

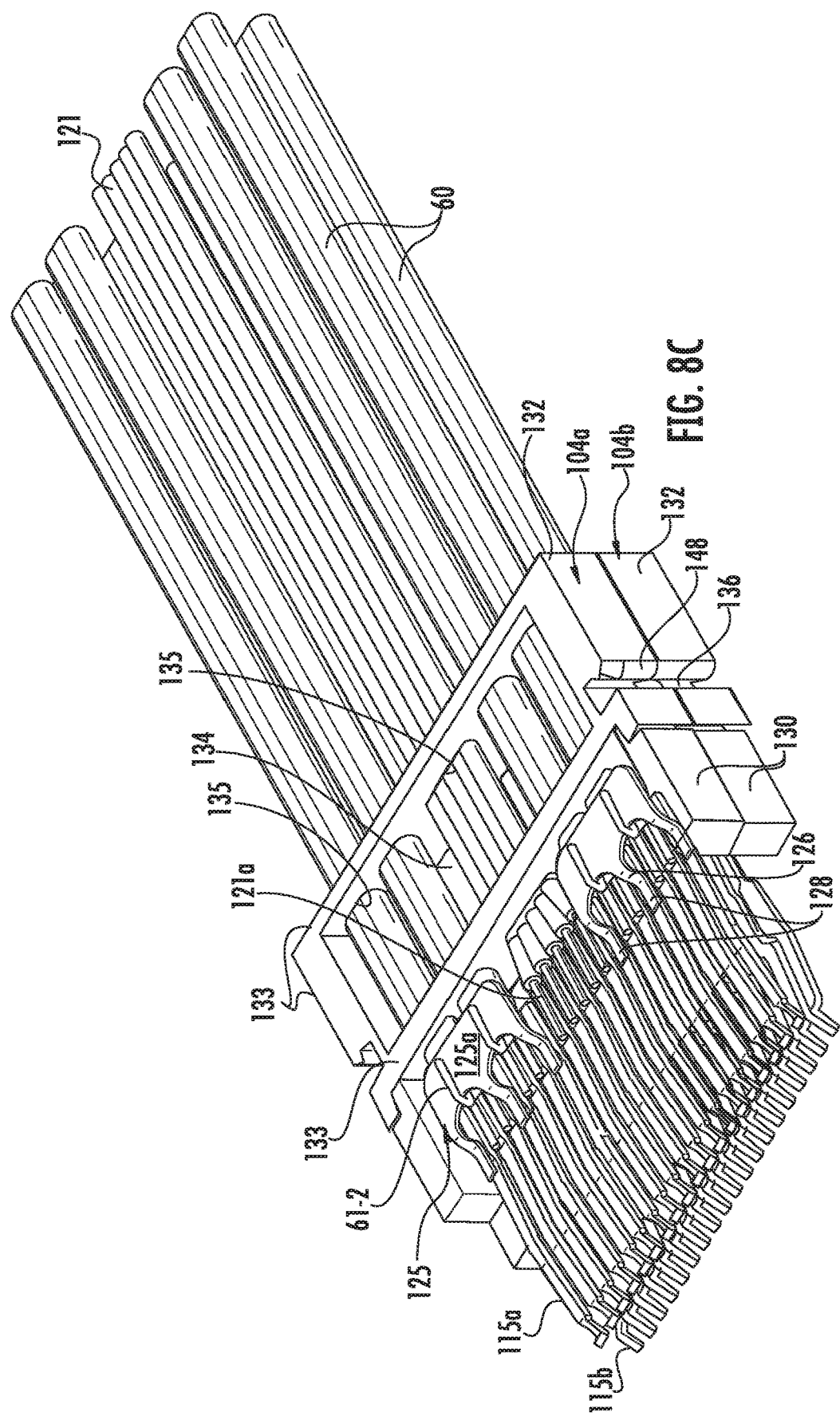

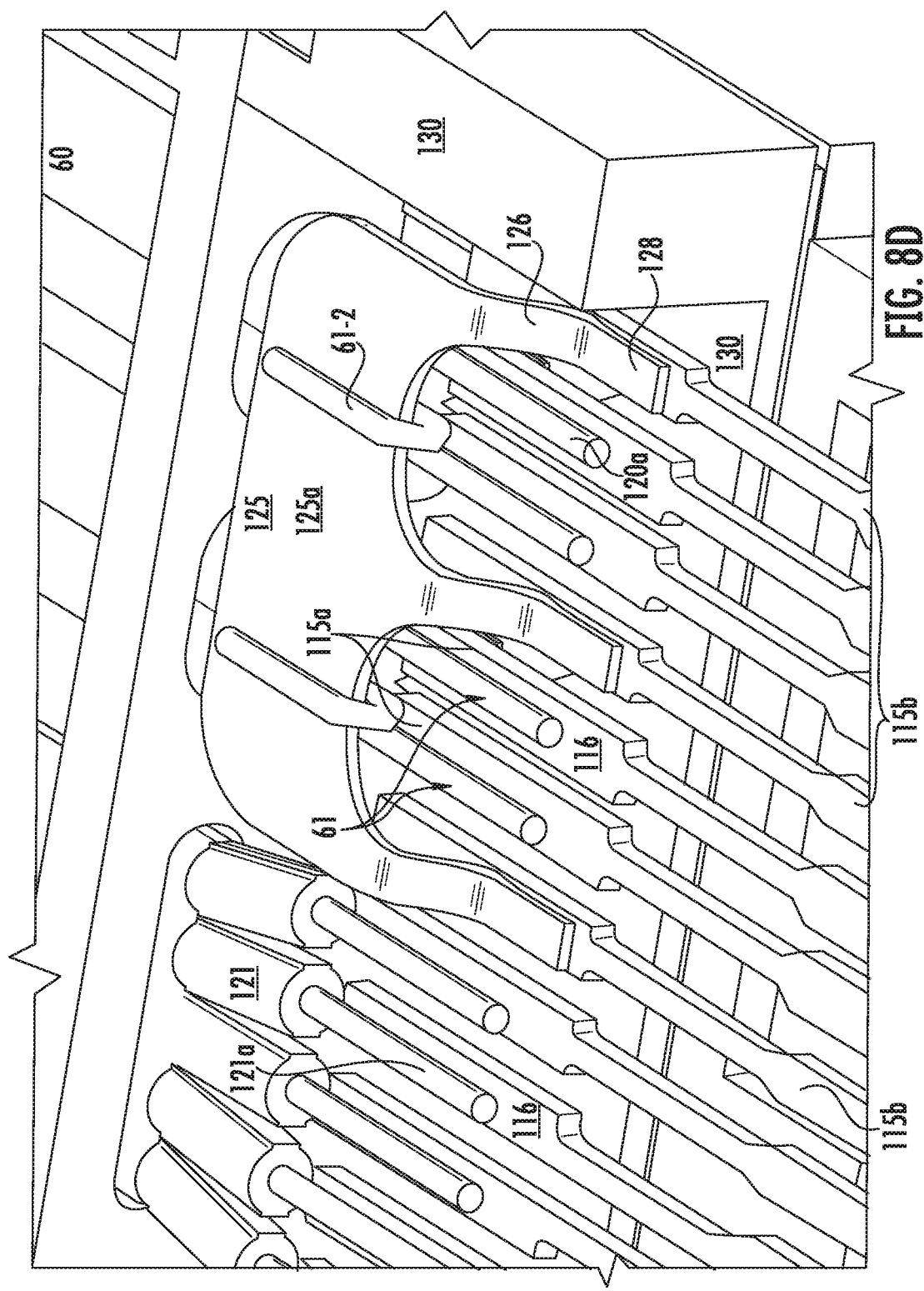

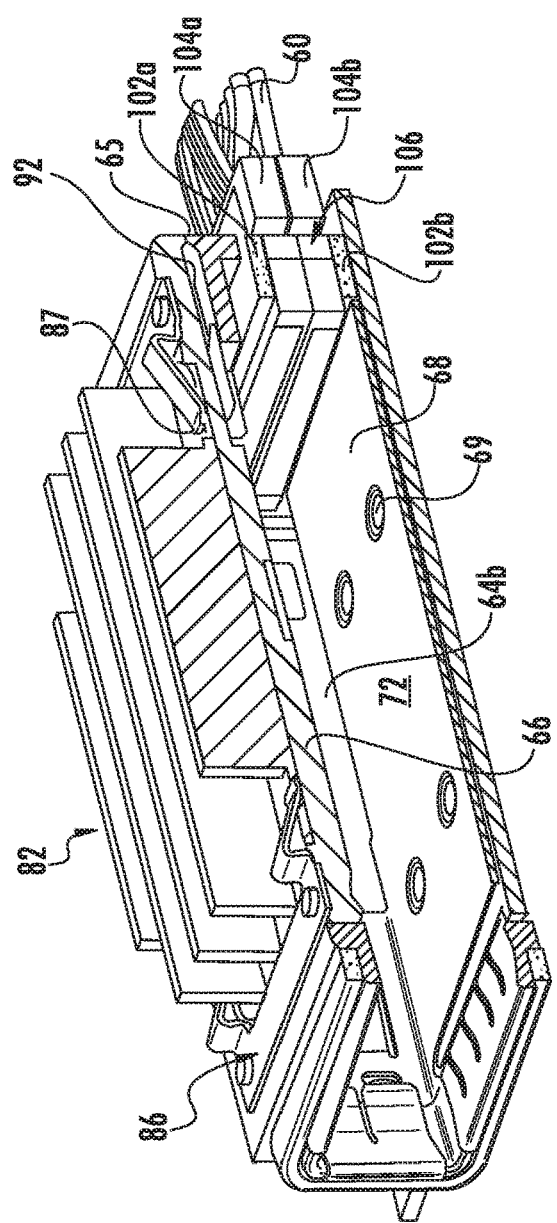
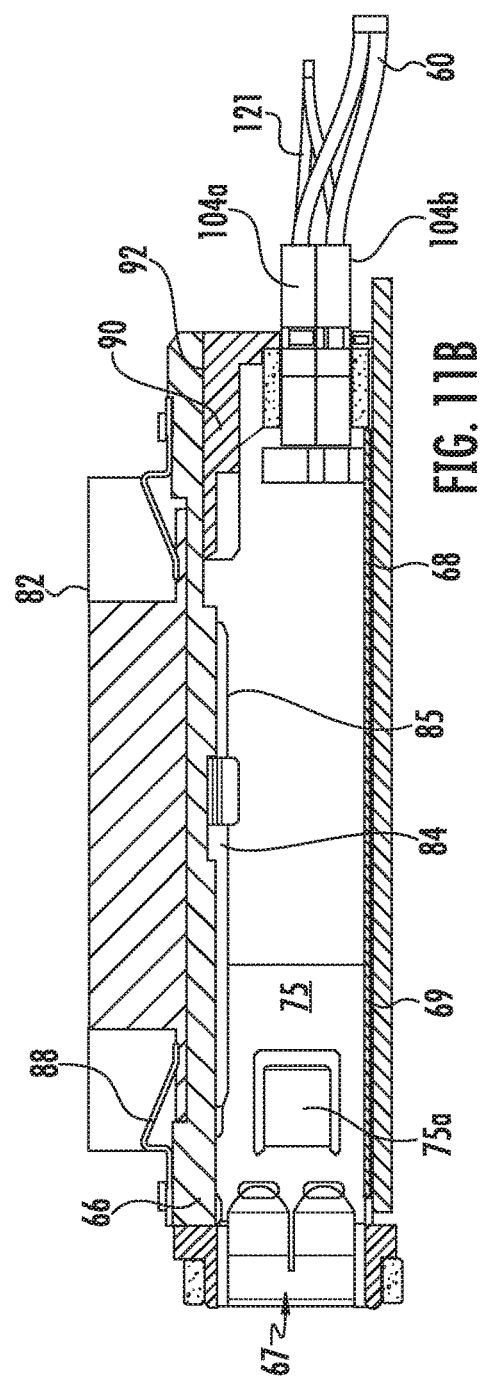
FIG. 11A
FIG. 11B

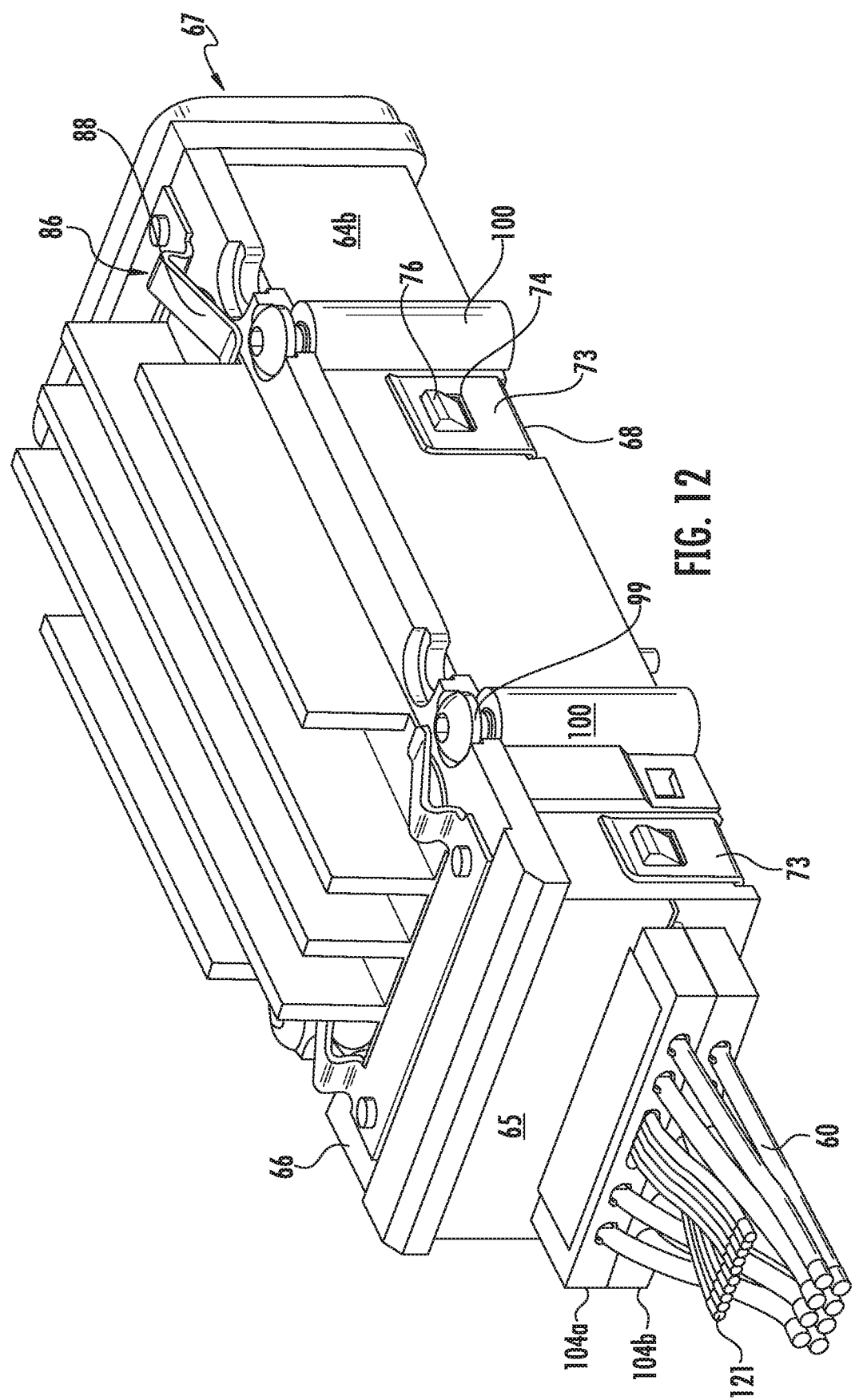

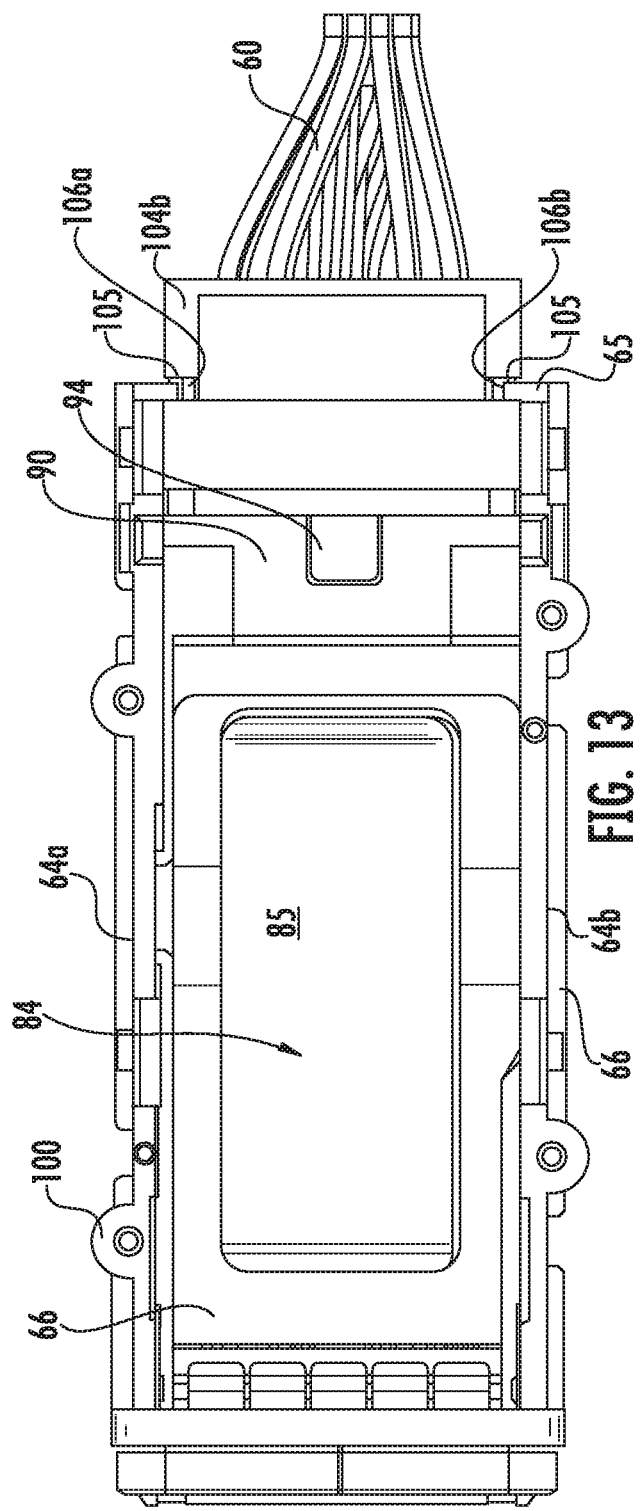

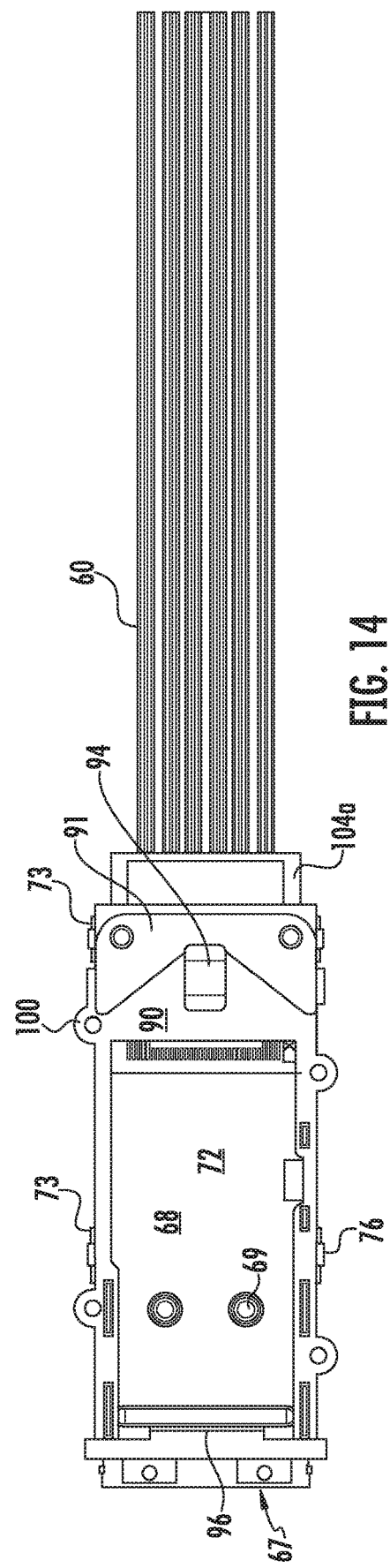

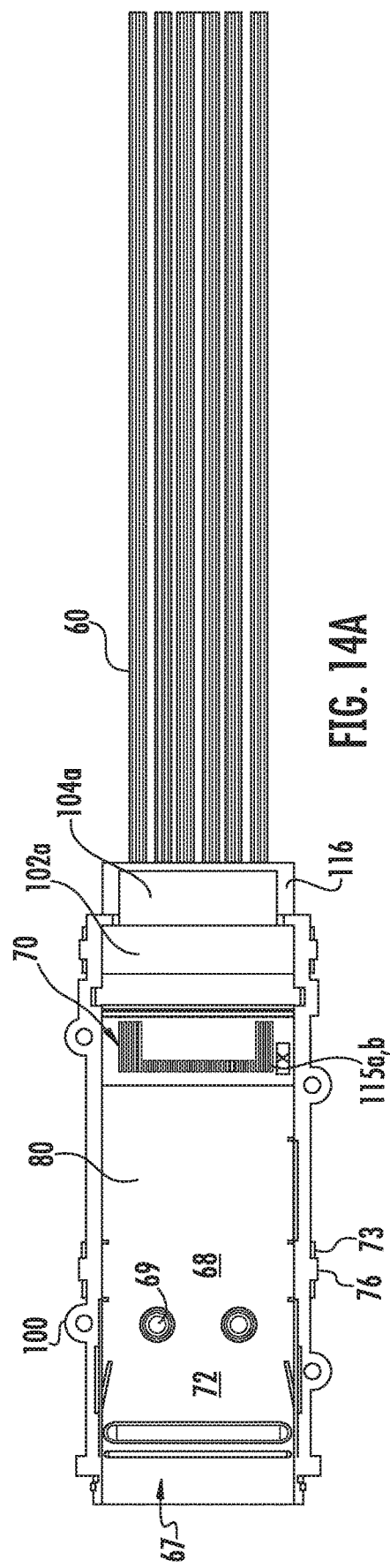

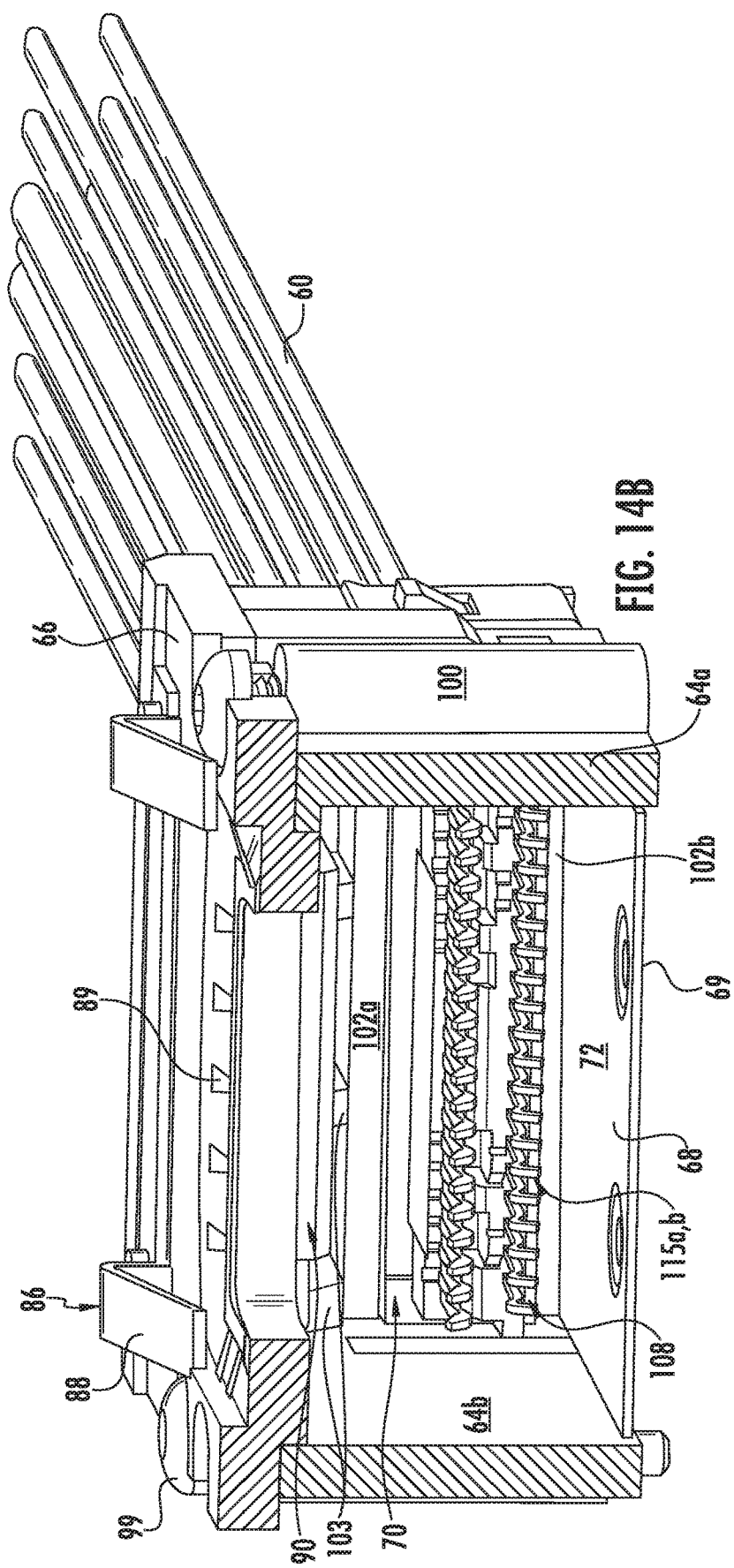

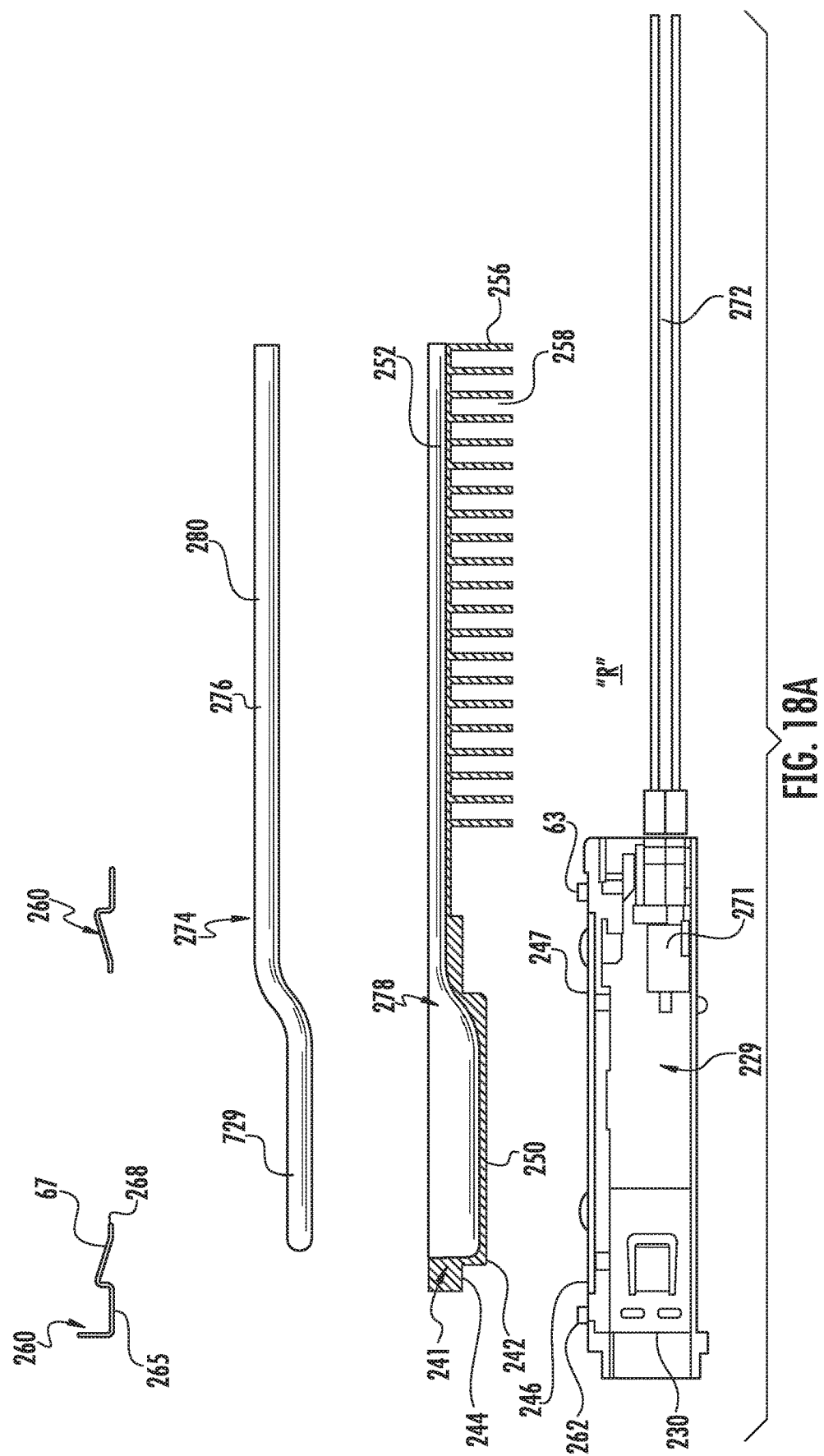

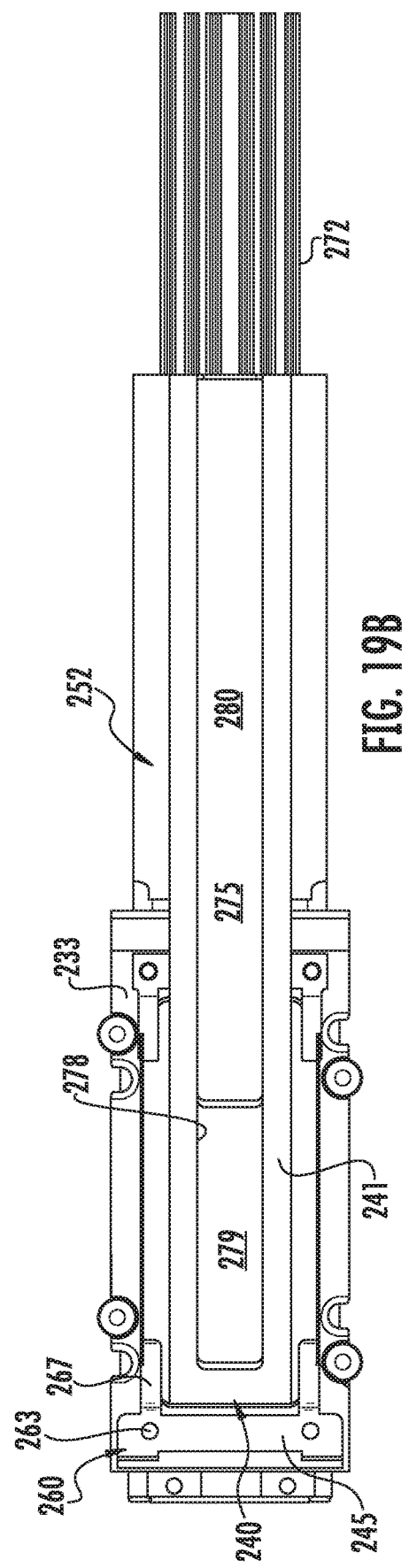

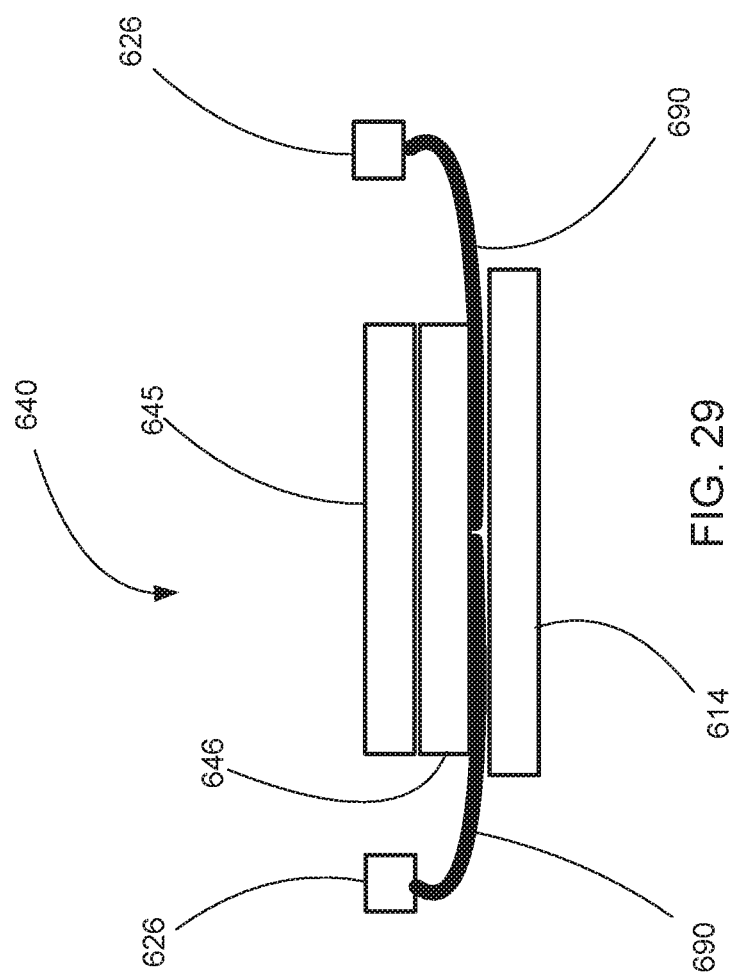

COMPUTING DEVICE USING BYPASS ASSEMBLY

RELATED APPLICATIONS

This application is a national phase of PCT Application No. PCT/US2016/030757, filed May 4, 2016, which is incorporated herein by reference in its entirety and which claims priority to the following U.S. provisional patent application No. 62/156,602, filed May 4, 2015; U.S. provisional patent application No. 62/156,708, filed May 4, 2015; U.S. provisional patent application No. 62/167,036, filed May 27, 2015; and U.S. provisional patent application No. 62/182,161, filed Jun. 19, 2015, all of which are incorporated herein by reference in their entirety.

TECHNICAL FIELD

This disclosure relates to field of high frequency signaling, more particular to computing systems positioned in a chassis.

DESCRIPTION OF RELATED ART

Computing devices such as routers, servers, switches and the like need to operate at high data transmission speeds in order to serve the rising need for bandwidth and delivery of streaming audio and video in many end user devices. These devices include a chassis that supports a circuit board that in turn supports various circuits and use signal transmission lines that extend between a primary chip member, such as an application specific integrated circuit (ASIC), field programmable gate array (FPGA), digital signal processor (DSP), etc., mounted on the circuit board and connectors mounted to the circuit board. These transmission lines are formed as conductive traces on or in the circuit board and extend between the chip member(s) to external connectors or circuitry of the device.

As can be appreciated, the integrated circuits (often referred to as chips) are the heart of these electronic devices. These chips typically include a processor and this processor has a die that can be connected to a substrate (its package) by way of conductive solder bumps. The package may include micro-vias or plated through holes which extend through the substrate to solder balls. These solder balls can comprise a ball grid array by which the package is attached to the circuit board. The circuit board includes numerous traces which designated define transmission lines that include differential signal pairs, ground paths associated with the differential signal pairs, and a variety of low speed transmission lines for power, clock signals and other functions. These traces are routed from the ASIC to the I/O connectors of the device into which external connectors are connected, as well as others that are routed from the ASIC to backplane connectors that permit the device to be connected to an overall system such as a network server or the like, or still others that are routed from the ASIC to components and circuitry on the motherboard or another circuit board of the device.

Typical circuit boards are usually formed from an inexpensive material known as FR4, which is inexpensive. Although inexpensive, FR4 is known to be lossy in high speed signal transmission lines which transfer data at rates of about 6 Gbps and greater (e.g., above 3 GHz signaling frequencies). These losses increase as the frequency increases and therefore make FR4 material undesirable for the high speed data transfer applications at signaling frequencies of about 10 GHz and greater. In order to use FR4 as a circuit board material for high frequency signal transmission lines a designer may have to utilize amplifiers and equalizers, which increase the final cost of the device.

The overall length of the signal transmission lines in FR4 circuit boards can exceed threshold lengths, about 10 inches, and may include bends and turns that can create signal reflection and noise problems as well as additional losses. As noted above, losses can sometimes be corrected by the use of amplifiers, repeaters and equalizers but these elements also increase the cost of manufacturing the final circuit board and further complicate the layout of the circuit board. In addition, the routing of signal transmission lines in the circuit board may require multiple turns and/or transitions. These turns and the transitions, which occur at termination points along the signal transmission lines, tend to reduce the signal to noise ratio. In addition, transitions and terminations tend to create impedance discontinuities that cause reflections in the signals, making it difficult to overcome the signal to noise issue by simply increase the power of the transmission. As a result, the use of a circuit board, especially with the use of FR4 but even with the use of more costly materials, to route signals over distance becomes increasingly difficult as data rates increase. Consequentially, certain individuals would appreciate further improvements.

SUMMARY

A bypass assembly is used to provide a high speed data transmission line extending between a device chip or chip set and backplanes or circuit boards. The bypass cable assemblies include cables which contain signal transmission lines that can avoid, or bypass, a supporting circuit board, no matter the material of construction.

In such applications, an integrated circuit having the form of a chip, such as an application specific integrated circuit (ASIC) or field programmable gate array (FPGA), is provided as part of an overall chip package. The chip can be mounted on a package substrate by way of conventional solder bumps or the like and may be enclosed within and integrated to the substrate by way of an encapsulating material that overlies the chip and a portion of the substrate. The package substrate can include traces or leads that extend from the solder bumps on the chip bottom to a termination area on the substrate. The substrate can further support a connector or contact pads or can alternatively be mounted on a circuit board that includes traces that couple communication points on the substrate to contact pads on the circuit board. A first connector can then be mounted on the circuit board for interfacing with a cable assembly. If desired, the first connector can be mateable with a second connector. Cables, which are terminated to either the first connector or the second connector, extend to external interfaces, such as I/O connectors and backplane connectors.

The chip package may include a plurality of contacts in the form of solder balls disposed on the underside of a chip package for providing connections to and from logic, clock, power and low-speed and high speed signal circuits to traces on the motherboard of a device in which the chip package is used. If the substrate directly supports a connecting interface then the contacts associated with the high speed signal circuits of the chip are removed from the bottom of the chip package inasmuch as the high speed traces are no longer routed to the bottom of the chip package. However, if the substrate is mounted on a circuit board then high speed traces may be routed to the circuit board and extend some short distance to an appropriate connector.

Cables utilized for such assemblies can be designed for differential signal transmission and preferably are twin-ax style cables that utilize pairs of signal conductors encased within dielectric coverings to form two wires, or a signal wire pair. First ends of the wire pairs are typically terminated to corresponding chip packages and second ends these wire pairs are terminated directly to terminals of entry or exit connectors, such as I/O and backplane connectors.

BRIEF DESCRIPTION OF THE DRAWINGS

The present invention is illustrated by way of example and not limited in the accompanying figures in which like reference numerals indicate similar elements and in which:

FIG. 2C is an enlarged detail view of the termination area surrounding one chip used in the bypass assembly of FIG. 1;

FIG. 7 is a partially exploded view of the connector assembly of FIG. 4;

FIG. 8A is an exploded view of one terminal array of the connector assembly, its associated ground plates and a set of corresponding cables and wires used in the connector assembly of FIG. 4;

FIG. 8B is the same view as FIG. 8A, but illustrating the components thereof in an assembled state to form a basic connector element;

FIG. 8C is a perspective view of two basic connector elements assembled together to form a receptacle connector terminal array;

FIG. 8D is an enlarged detail view of two of the cables in a connector element, illustrating the elevated ground plate structure utilized therewith;

FIG. 11A is a sectional view of the connector of FIG. 11, taken along lines A-A thereof;

FIG. 11B is a side elevational view of FIG. 11A;

FIG. 12 is a perspective view of the connector of FIG. 11; but taken from the rear of the opposite side;

FIG. 13 is a bottom plan view of the connector of FIG. 6A, with the bottom removed for clarity;

FIG. 14 is a top plan view of the cage with the top wall removed from the cage and a portion of an edge card engaged with the internal connector;

FIG. 14A is the same view as FIG. 14, but sectioned at a level beneath the rear cover plate to illustrate the internal connector and the manner in which it engages the body of the cage;

FIG. 14B is a vertical sectional view taken through the cage proximate to the front of the internal connector, with a portion of the internal cage removed for clarity to illustrate the hollow interior space of the cage and the internal ribs thereof which contact the connector elements and hold an EMI absorbing pad in place thereof;

FIG. 18A is a side view of the exploded view of FIG. 18, with the components depicted therein sectioned along lines C-C thereof;

FIG. 19B is a top plan view of the cage-heat sink assembly of FIG. 17;

FIG. 29 is a schematic representation of an alternative embodiment of a chip package.

DETAILED DESCRIPTION

Figure 1:
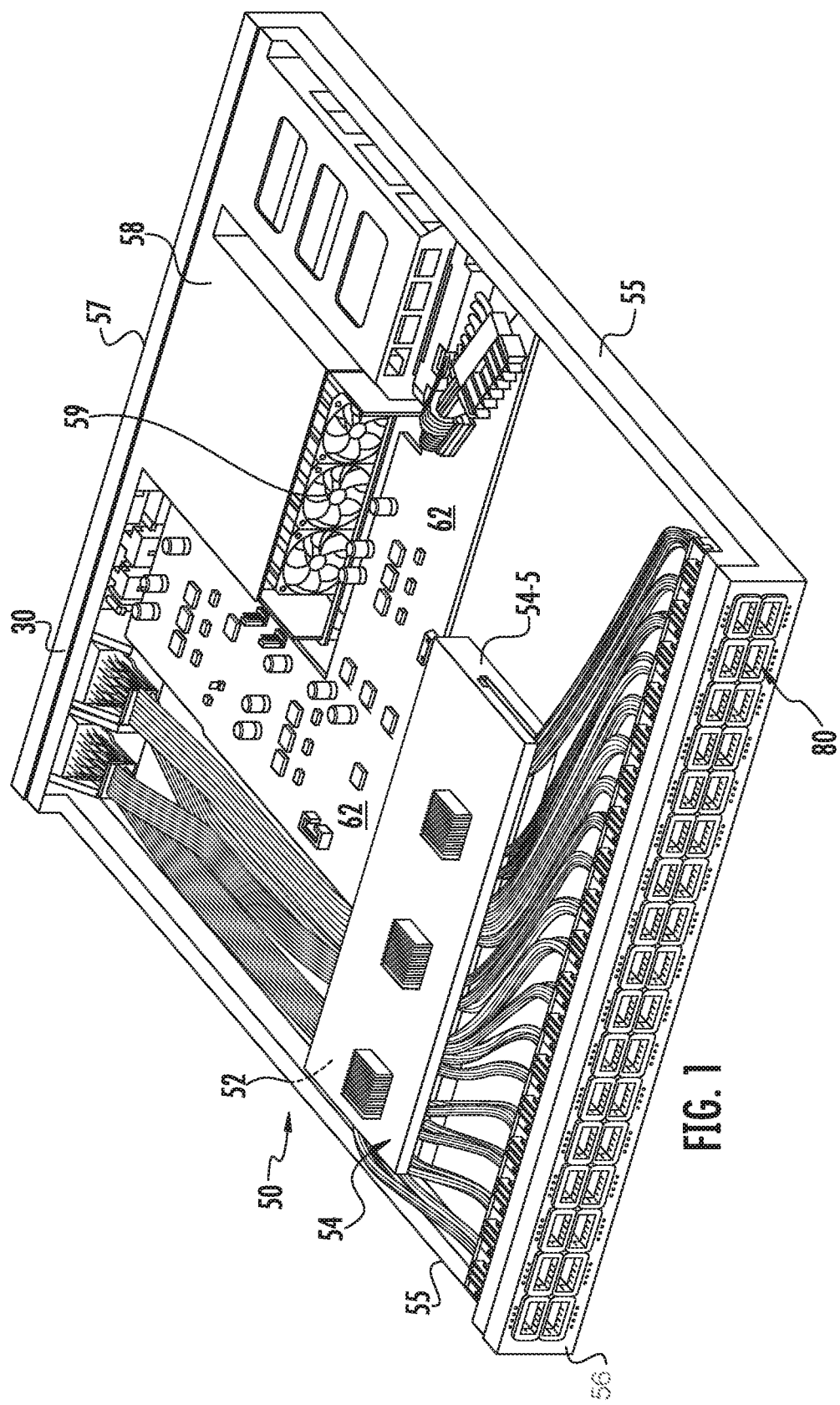
FIG. 1 is a perspective view of an electronic device, such as a switch, router or the like with its top cover removed, and illustrating the general layout of the device components and a bypass cable assembly in place therein.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity. As such, references to a feature or aspect are intended to describe a feature or aspect of an example, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements, are not absolute, but relative. These representations are appropriate when the elements are in the position shown in the Figures. If the description of the position of the elements changes, however, these representations are to be changed accordingly.

As can be appreciated, the discussion that follows relates to signal transmission. Signals are often referred to as low speed or high speed by persons of skill in the art, depending on the data rate (low data rates being referred as low speed signals and high data rates being referred to as high speed signals). While such nomenclature is technically not the most precise way to refer to such matters, to be consistent with typical usage the low speed/high speed convention will also be used herein.

Embodiments depicted herein are suitable for use with high speed data signal transmission line systems that support high data rates at low losses from chips or processors and the like to backplanes, mother boards and other circuit boards. An assembly is disclosed that connects the chip package of a device to entry connectors (which can be used to provide signals into or out of the device) without significant use of traces on a circuit board so that reduced losses are possible. If desired, an improved connector for use as an entry connector can be connected directly to cables or wires, rather than traces on circuit boards, to define signal transmission lines from the connector directly to chips and processors of the host device. Such a configuration is helpful for what is considered high speed data applications (above 10 Gbps) and above typically will be beneficially utilized in systems operating above 15 Gbps if NRZ encoding is being used. Because the receptacle connectors can be contained entirely within the connector structure and do not need to be directly connected to a circuit board, the bottom wall of the cage can be continuous in its extent to completely seal off the bottom of the cage and thus can improve EMI performance of the connector. The use of press-fit pins to mount the connectors can also be eliminated. Pairs of connector elements in the form of wafers are provided which fit into an opening in the rear of the receptacle connector. A primary ground plane is provided between the connector elements to block signal interference, such as crosstalk, between the signal terminals of the two connector elements. Accordingly, the connectors may be mounted individually to a face panel or a wall of the host device, or even interconnected with other connectors to form an integrated assembly of connectors that are suitable for vertical or horizontal stacking. Furthermore, if desired, the connector can be positioned within the host device as an internal transition connector that can be supported on a circuit board, on standoffs or other supports or stand alone. This structure defines connectors with high speed connectors that form signal transmission lines useful for high speed data applications at 10 Gbps or above that can bypass circuit traces on the host device circuit board.

The data rates of the devices for which the above-described connectors is used are quite high (10 Gbps and often 20 Gbps+) and often the connectors are used with active cable assemblies that tend to generate substantial heat during data transmission. The connector may further include a heat sink assembly that extends into an interior portion of the cage and which is configured to make contact with the mating module inserted into the cage. The cage includes walls that cooperatively define the interior which houses a receptacle connector. Inasmuch as these cages may often be mounted along a face panel of the host device, a heat sink assembly is provided that includes a transfer portion which makes contact with the mating module inserted into the cage, and a dissipating portion connected thereto, which is depicted spaced apart from the transfer portion in a horizontal direction. In this manner, the heat-dissipating portion beneficially extends rearwardly of the shielded cage and will include downward facing fins. This structure takes advantage of the open space behind the cage and may provide a reduction in overall height of the host device, assuming the airflow configuration can be set up accordingly.

In an embodiment, the terminations to at least one set of the connectors are configured so that the second ends of the wire pairs are terminated in a manner and spacing that emulates the ordered geometry of the cable so that crosstalk and other deleterious factors are kept to a minimum at the connector location. In such a configuration all of the connector terminals have the same length. The free ends of the signal terminal pairs are arranged in desired spacings and include associated grounds so that the ground associated with each wire pair may be terminated to a corresponding ground of the connector to define an associated ground that extends the entire length of the cable and its connector. This arrangement will provide shielding, and reduction of cross talk, by defining a ground plane to which the signal terminals can couple to in common mode, while pairs of signal terminals can couple together in differential mode. The termination of the cable wires to the connectors can be done in a manner such that to the extent possible, a specific desired geometry of the signal and ground conductors in the cable is maintained through the termination of the cable to the connector.

A single chip package may be provided that includes an integrated circuit mounted to a substrate. The substrate has termination areas to which first ends of a plurality of twin-ax cables are terminated. The lengths of the cables may vary and will be long enough for some of the cables to be easily and reliably terminated to first external interfaces in the form of a single or multiple I/O style connectors which are part of an external connector of either, or both of the entry and exit connectors. These connectors may be preferably mounted to a panel of the host device in a fashion that permits external connectors, such as plug connectors or pluggable modules to be mated therewith. The assemblies may have their cables extend between entry connectors of the device and the chip package formed as an integrated assembly, or they may further include additional cables that extend between the chip package and exit connectors of the device. The first ends of the bypass cables may be configured so that they may be inserted into connectors on the chip packages so as to have "plug and play" capability. In this manner, the external connectors can be inserted into the host device as single or ganged elements, each containing one or more signal transmission channels. The chip package may be supported within the cage of the device either solely or by way of standoffs or other similar attachments to a low cost, low speed motherboard.

Removing the signal transmission lines from the chip to the external connectors off of the motherboard in this manner frees up space on the motherboard which can accommodate additional functional components to provide added value and function to the device, while maintaining a cost that is lower than a comparable device that utilizes the motherboard for signal transmission lines. Furthermore, incorporating the signal transmission lines in the cables of the bypass assembly reduces the amount of power needed to transmit high speed signals from the chip packages to the external connectors, thereby increasing the "green" value of the bypass assembly and reducing the operating cost of devices that use such bypass assemblies.

The cables extending between connectors and the chip packages are preferably of the "twin-ax" style, with two wires in each cable so that a pair of signal conductor are running lengthwise of the wire, enclosed in a dielectric covering. The pairs of wires are preferably terminated to receptacle connectors at the proximal ends of the cables and at their distal ends directly to the chip packages. The receptacle connectors are preferably contained within a connector structure, such as a cage, adapter frame or the like and cooperate with the connector structure to define a shielded cage configured to receive an external connector, such as a pluggable module. The second ends of the cable wires are terminated directly to the terminals and grounds of the receptacle connectors, and the cables are preferable held in wafer-like supports to define terminal rows on opposing sides of card slots of the receptacle connectors. The cables exit the connector structure through the rear wall thereof.

Turning to the figures, FIG. 1 is a perspective view of a computing device 50 such as a switch, router, server or the like, and with the cover of the host device removed. The computing device 50 is governed by one or more processors, or integrated circuits, in the form of a chip 52 (which can be one or more discrete chips packaged together) that may be part of an overall chip package 54. The device 50 has a pair of side walls 55 and first and second walls, 56, 57. Connectors 80 (which can be in the form of an input/output or IO connector) are provided in the first wall 56 (which can be a front wall) of the host device so that opposing mating connectors in the form of pluggable modules and the like may be inserted in order to connect to circuits of the device 50. Backplane connectors 30 may be provided in a second wall 57 (which can be a back wall) for connecting the device 50 to a larger device, such as a server or the like, including backplanes utilized in such devices. The device 50 includes a power supply 58 and cooling assembly 59 as well as a motherboard 62 with various electronic components thereupon such as capacitors, switches, smaller chips, etc.

Figure 3A:
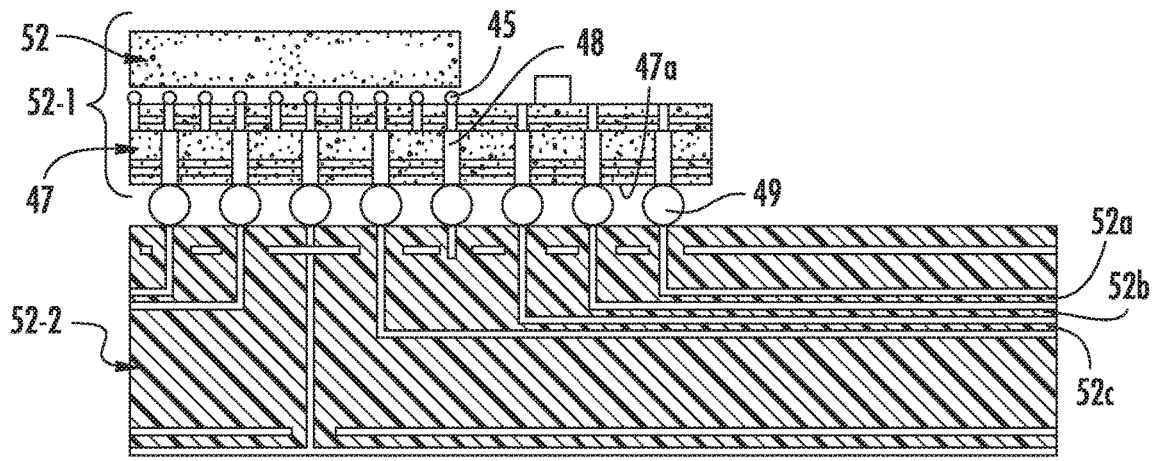
FIG. 3A is a schematic cross-sectional view of a known structure traditionally used to connect a chip package to a motherboard in an electronic device such as a router, switch or the like, by way of traces routed through or on the motherboard.

FIG. 3A is a cross-sectional view of a prior art conventional chip package and motherboard assembly that is used in conventional devices. The chip 52 may be an ASIC or any another type of processor or integrated circuit, such as a FPGA and may be one or more separate integrated circuits positioned together. Accordingly, the term chip will be used herein as a generic term for any suitable integrated circuit. As shown in FIG. 3A, the chip 52 has contacts on its underside in the form of solder bumps 45 that connect it to associated contact pads of a supporting substrate 47. The substrate 47 typically includes plated through-holes, microvias or traces 48 that extend through the body of the substrate 47 to its underside. These elements 48 connect with contacts 49 disposed on the underside 47a of the substrate 47 and these contacts 49 typically may take the form of a BGA, PGA or LGA and the like. The chip 52, solder bumps 45, substrate 47 and contacts 49 all cooperatively define a chip package 52-1. The chip package 52-1 is mated, by way of a socket (not shown) to a motherboard 52-2 made of FR4 material and used in a device. The motherboard 62 has a plurality of lengthy conductive traces 52a-c that extend from the chip package contacts 49 through the motherboard to other connectors, components or the like of the device. For example, a pair of conductive traces 52a, 52b are required to define differential signal transmission line and a third conductive trace 52c provides an associated ground that follows the path of the signal transmission line. Each such signal transmission line is routed through or on the motherboard and such routing has certain disadvantages.

FR4 circuit board material becomes increasing lossy and at frequencies above 10 Ghz this starts to become problematic. Additionally, turns, bends and crossovers of these signal transmission line traces 52a-c are usually required to route the transmission line from the chip package contacts 49 to connectors or other components mounted on the motherboard 52-2. These directional changes in the traces 52a-c can create signal reflection and noise problems as well as additional losses. Losses can sometimes be corrected by the use of amplifiers, repeaters and equalizers but these elements also increase the cost of manufacturing the final circuit board 52-2. This complicates the layout of the circuit board 52-2 because additional board space will be needed to accommodate such amplifiers and repeaters and this additional board space may not be available in the intended size of the device. Custom materials for circuit boards are available that reduce such losses, but the prices of these materials severely increase the cost of the circuit board and, consequently, the electronic devices in which they are used. Still further, lengthy circuit traces require increased power to drive high speed signals through them and, as such, they hamper efforts by designers to develop "green" (energy-saving) devices.

Figure 3B:
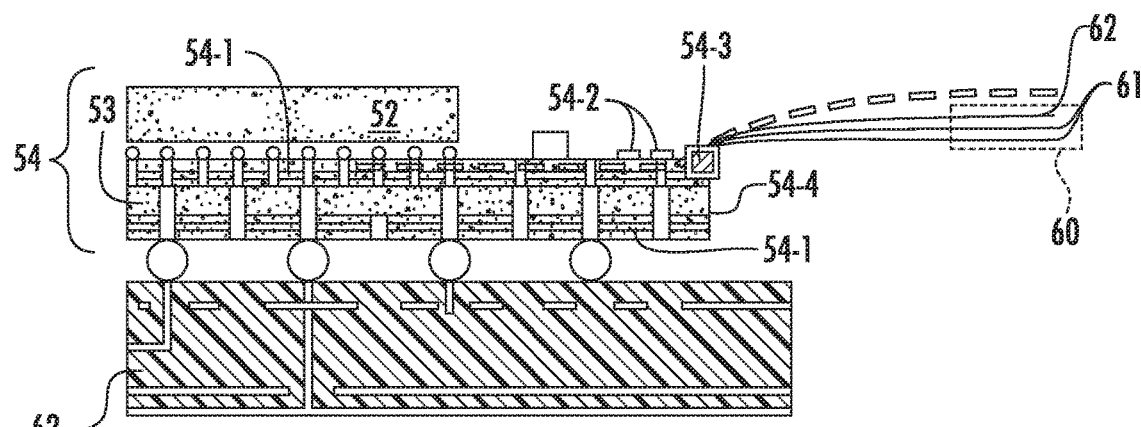
FIG. 3B is a schematic cross-sectional view, similar to FIG. 1A, but illustrating the structure of bypass assemblies such as that illustrated in FIG. 1, which are used to connect a chip package to connectors or other connectors of the device of FIG. 1, utilizing cables and consequently eliminating the use of conductive traces as signal transmission lines on the motherboard as illustrated in the device of FIG. 1.

FIG. 3B is a cross sectional view of the chip package 54 that can be used in the device 50 of FIG. 1. The chip 52 contains high speed, low speed, clock, logic, power and other circuits which are connected to the chip package substrate 53. Traces 54-1 of the package 54 lead to associated contact pads 54-2 arranged in termination areas 54-3, that are preferably disposed at or proximate to edges 54-4 of the substrate 53. The chip package 54 may further include an encapsulant 54-5, such as an epoxy, that fixes the chip 52 in place within the package 54 as an integrated assembly along with associated cable connectors and other components. The chip package 54, as illustrated, be connected in part, to the motherboard by way of solder bumps 49, but such connections do not need to include high speed signal transmission lines in place on the circuit board 62. However, as discussed below with respect to FIGS. 22-29A, the supporting circuit board can include high speed transmission lines if they travel a short distance. For example, the traces 52a-c could quickly terminate to a connector provided on the circuit board 62 just outside an outer edge of the substrate 47.

If cables are to terminate directly to the substrate then the cables 60 can be terminated to the package contact pads 54-2 by suitable wire-to-board connectors and the like, and these cables 60 are preferably of the twin-ax construction with two signal conductors 61 surrounded by a dielectric covering 61-1. The cables 60 can also include an associated drain wire 61-2 and an outer shield 61-3 and a finished insulative outer jacket 61-4. (FIG. 2D.) The use of one or more drain wires is optional, as is the outer shield (which can be in the form of a conductive wrap, braided shield or the like). In some instances, the two conductors may be encased in a single dielectric covering. The spacing and orientation of the wires that make up each such wire pair can be easily controlled in a manner such that the cable provides a transmission line separate and apart from the circuit board, and which may extend between a chip, chip set, component and a connector location on the circuit board or between two locations on the circuit board. In certain embodiments the ordered geometry of the cables as transmission components makes it easier to maintain a transmission line with acceptable losses and noise as compared to the difficulties encountered with circuit board signal transmission lines.

As noted above, the cables 60 and their signal conductor pairs define high speed signal transmission lines that lead from the chip package 54 to the first (entry) or second (exit) connectors 80, 30. The ordered geometry of the cables maintains the signal conductors as pairs in a preselected spacing to control the impedance therethrough. Utilizing the cables as signal transmission lines can eliminate the need to lay down high speed signal transmission lines in the form of traces on the motherboard, thereby avoiding high costs of exotic board materials and the losses associated with cheaper board materials such as FR4.

Figure 2:
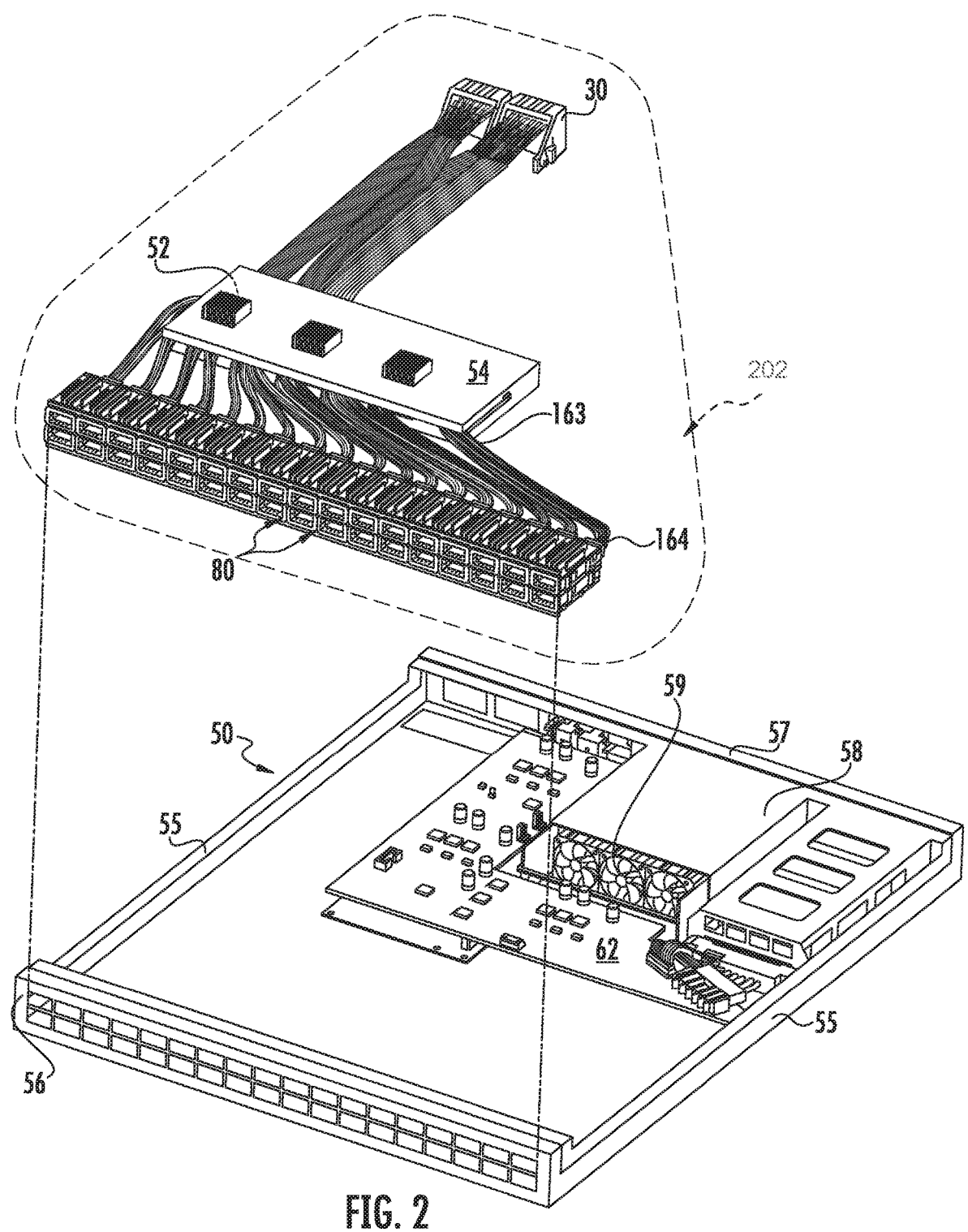
FIG. 2 is the same view as FIG. 1, with the bypass assembly removed from within the device for clarity.

As illustrated in FIGS. 2-2C, the cables 60 have opposing first and second ends 163, 164 that are respectively connected to the chip package 54 and the connectors 80 (which could be a first connector) or backplane connectors 30 (which could be a second connector) to define high speed signal transmission lines that bypass the motherboard. The cables 60 maintain the ordered geometry of the signal conductors throughout the lengths they traverse to and from the chip via the external interfaces. The ordered geometry of the cables permits the cables to be turned, bent or crossed in their paths without introducing problematic signal reflection or impedance discontinuities into the transmission lines which can occur in circuit board signal transmission lines. The cables 60 are arranged in first and second sets of cables, with the first cable set extending between the connectors 80 and the chip package 54, and the second set of cables extending between the chip package 54 and the connectors 30 in the second wall 57 of the device. The manner in which the signal conductors of the cables 60 may be terminated to the chip substrate can vary. As illustrated in FIG. 2C, the cables 60 may be terminated by way of wire-to-board connectors 66, which can mate with contacts on the chip package substrate 54 (which is cut away for purposes of illustration). The connectors 66 can also mate to connectors mounted on a surface of circuit board (such as is depicted in FIGS. 22-28). Heat sinks 71 may be attached to surfaces of the chips 52 as shown to dissipate heat, or integrated into the assembly by way of the encapsulant. It should be noted that further details of potential construction configurations are disclosed below with respect to the embodiment depicted in FIGS. 22-28.

Figure 2A:
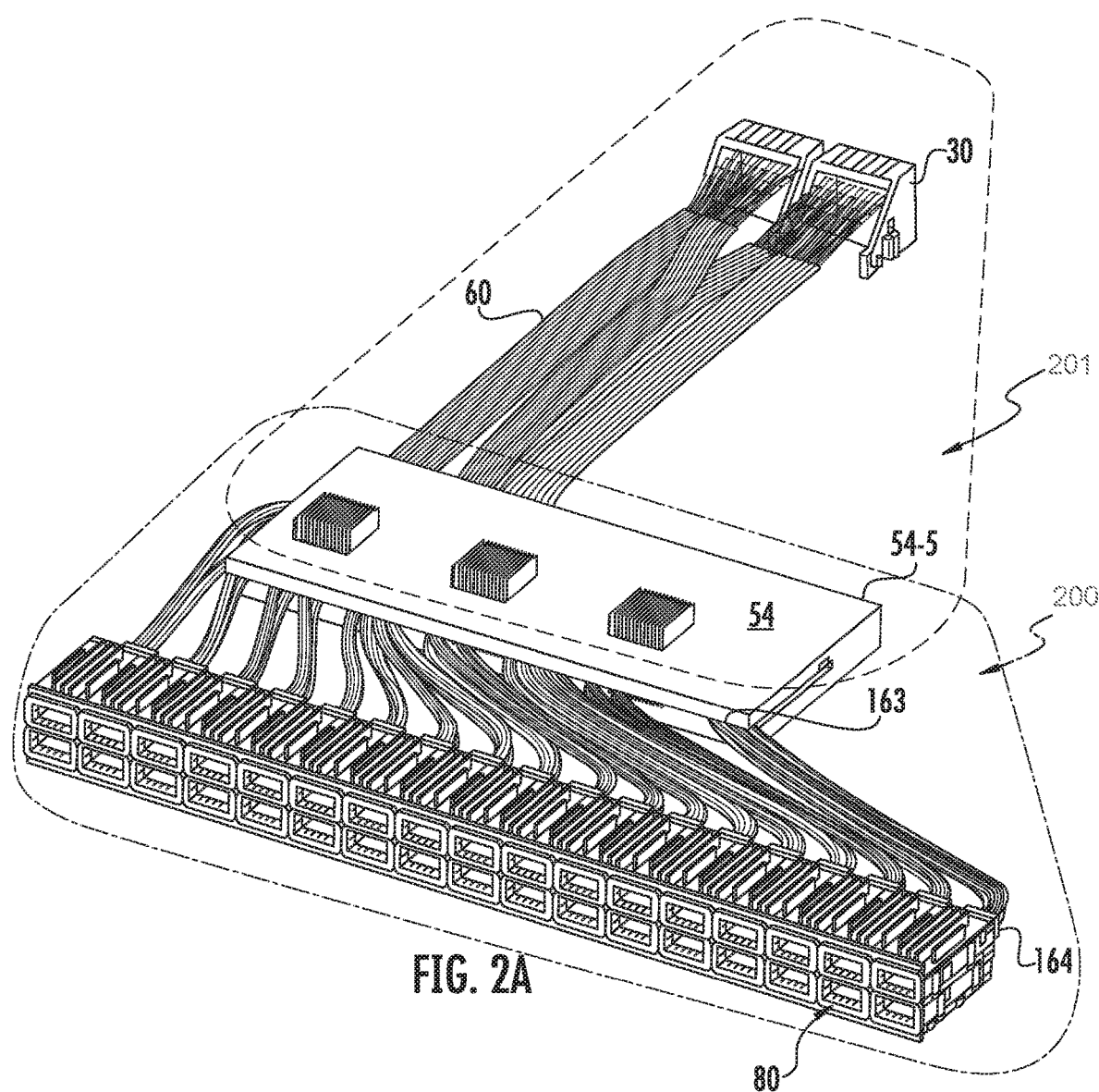
FIG. 2A is a perspective view of only the bypass assembly of FIG. 2.
Figure 2B:
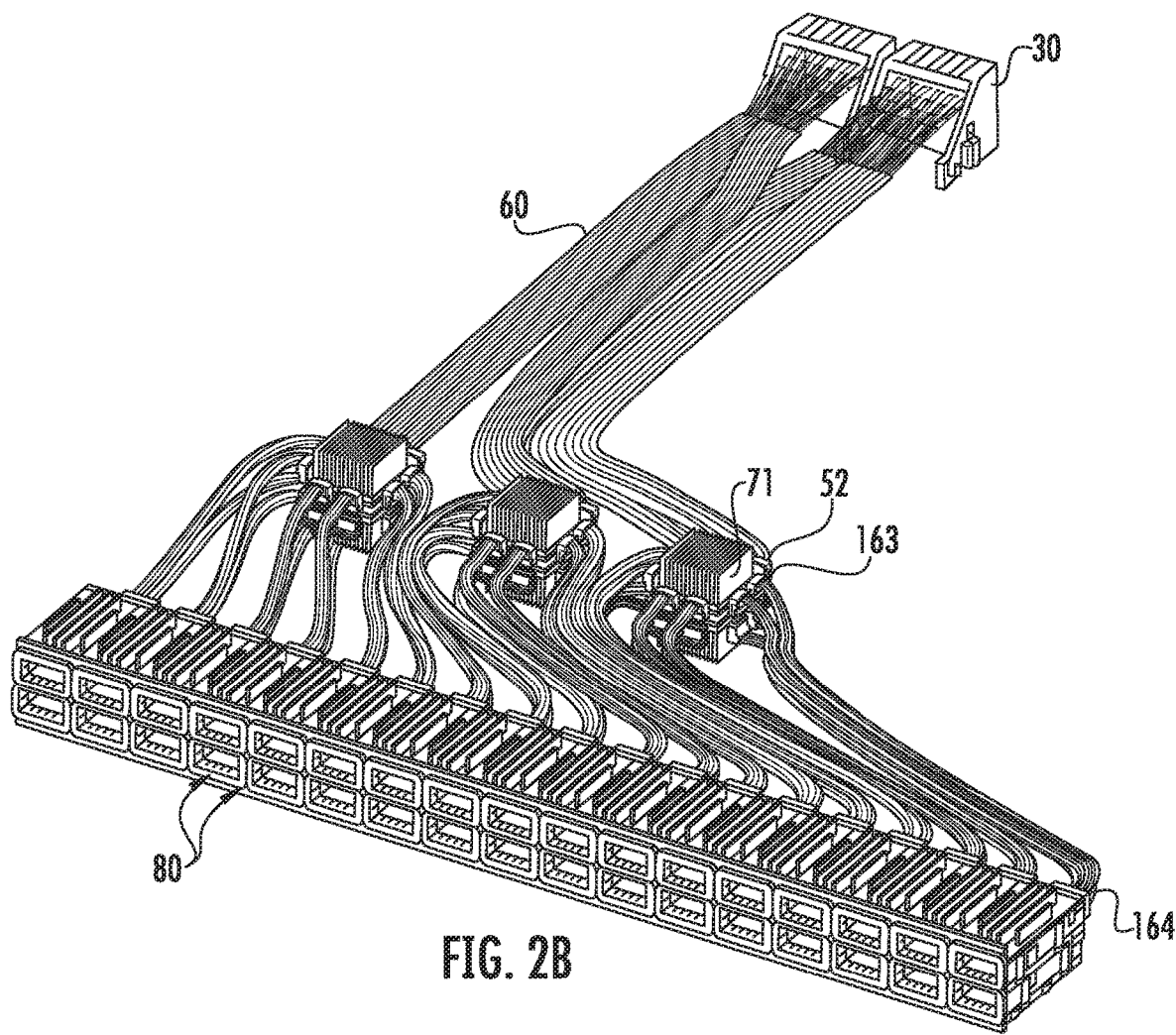
FIG. 2B is the same as FIG. 2A, but with the chip package substrate and/or encapsulant removed for clarity.
Figure 2D:
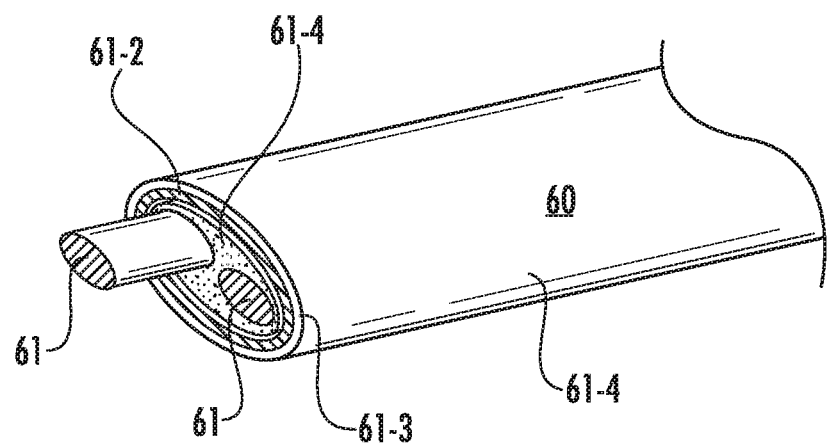
FIG. 2D is a perspective view of the end of a twin-ax cable used in the bypass assemblies.

The chips, substrate, heat sink and cable connectors 66 may integrated together by way of an encapsulant or other support structures that holds them together as a single assembly as shown in FIGS. 2-2C. This structure permits a device designer to fully utilize the space available on the motherboard 62 for additional components and circuit which add value to the host device without the need for complex circuit board designs. These integrated assemblies can be inserted into devices by merely inserting the first and second connectors into respective openings in the front and back walls 374, 57 of the host device 50. Ancillary connectors may be provided for connecting the chip package to other circuits of the device as shown in FIG. 3B. The assemblies may also be provided in other forms, such as, for example: 1) without the chip package, but with the chip package substrate; 2) with the chip package and either the first or second connectors, shown respectively at 200 and 201 in FIG. 2A; and, 3) with both the entry and exit connectors arranged to extend to openings in the front wall of the device, as shown at 202 in FIG. 2. In this manner the assemblies 200, 201 and 202 may be inserted into a basic device to provide the device with its functionality without the need to design such functionality into the motherboard 62 of the hose device 50. Additional details for possible construction will be discussed below.

Figure 4:
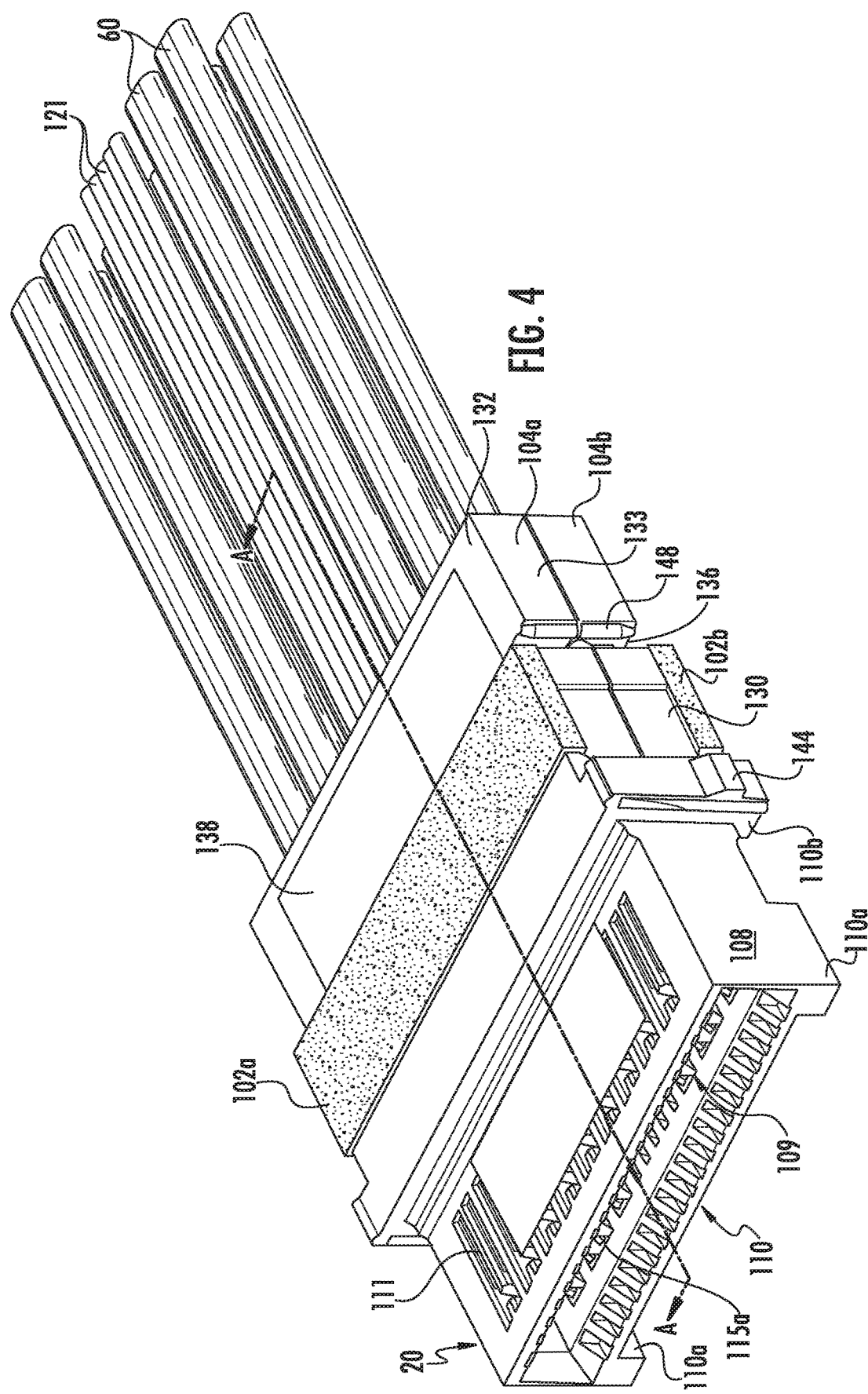
FIG. 4 is a perspective view of a cable-direct connector assembly constructed in accordance with the principles.
Figure 4A:
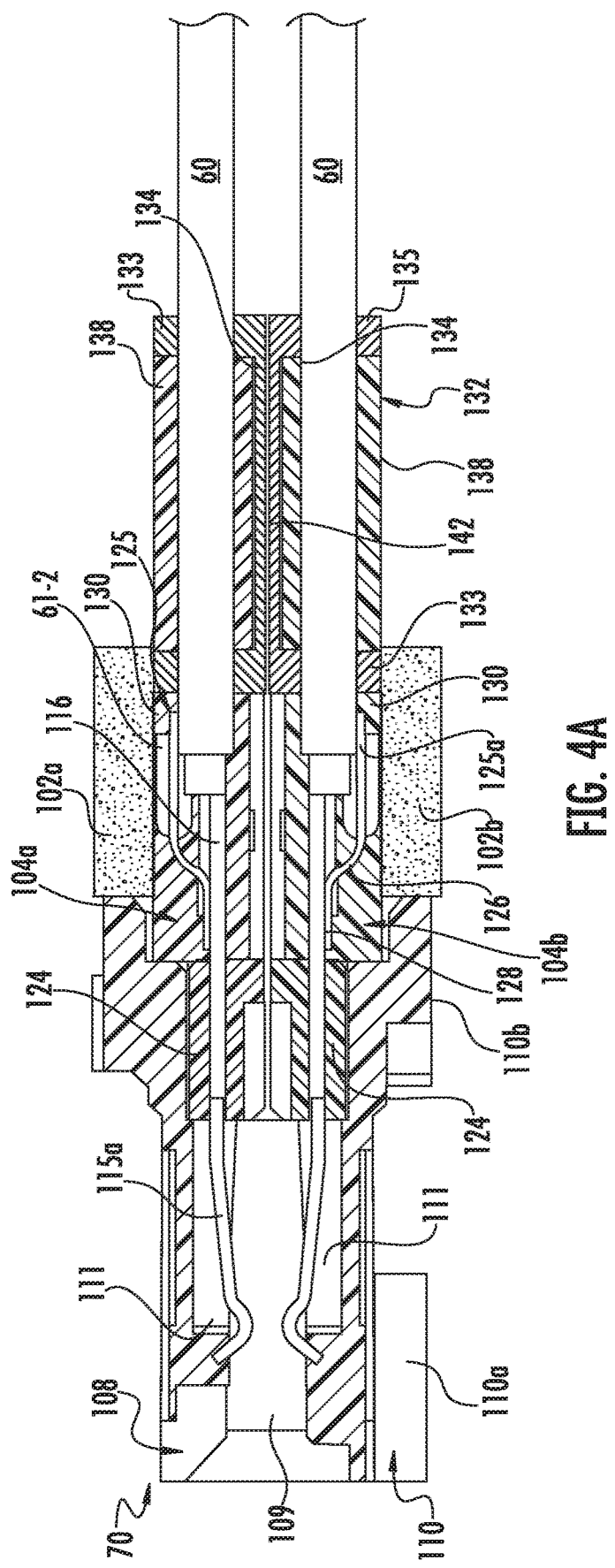
FIG. 4A is a sectional view of the connector assembly of FIG. 4, taken along lines A-A thereof.
Figure 8:
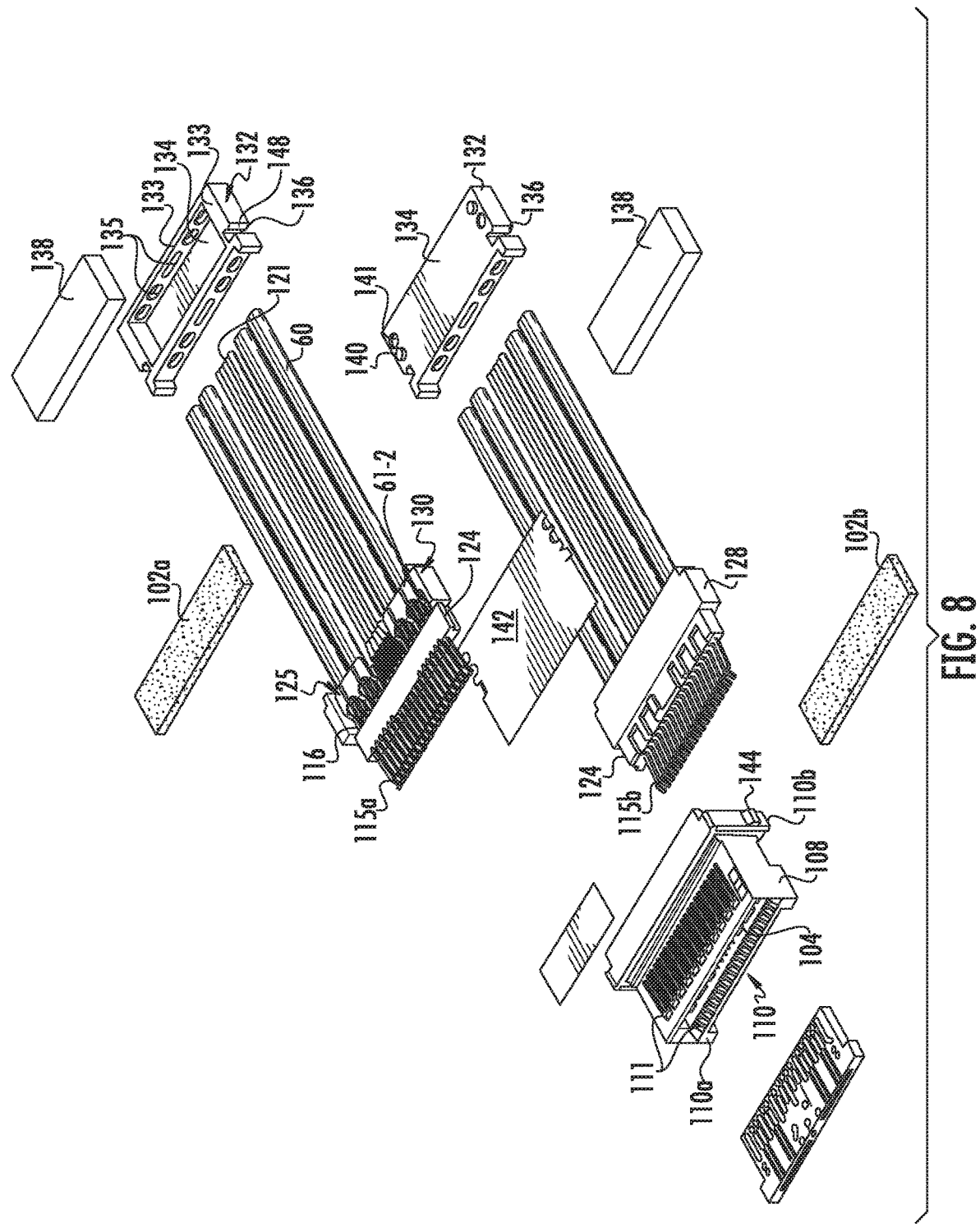
FIG. 8 is a more fully exploded view of the connector assembly of FIG. 7.
Figure 9:
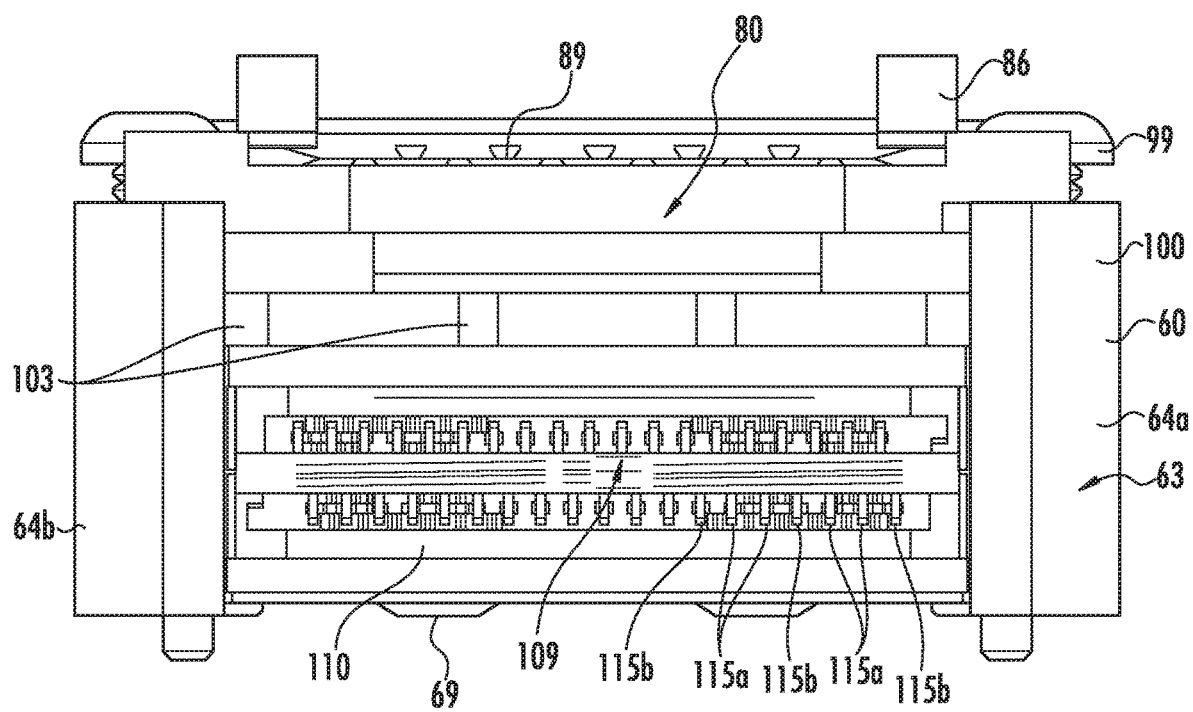
FIG. 9 is a front elevational view of the cage illustrating a portion of an edge card contacting the terminal contact portions of the connector assembly.

Turning to FIGS. 4, 7 &. 8, an internal connector 70 is received within each of the connectors 80 and the internal connector 70 includes a body 108 formed of an insulative material that includes a card slot 109 that opens to the front of the connector 70 and to the entrance 67 of the connector 80. The card slot 109 is an example of a mating interface and while the card slot configuration is preferable, other mating interface configurations are also suitable. The card slot 109 is positioned above a polarizing channel 110 formed by legs 110a, 110b that support the card slot 109 off of the bottom wall 68 of the connector 80 and prevent incorrectly positioned opposing mating connectors from being inserted into the card slot 109. The body 108 has a plurality of terminal-receiving cavities 111 aligned on opposite sides of the card slot 109 which receive contact portions of cantilevered terminals 115a, 115b of two connector elements 104a, 104b. The connector elements 104a, 104b support the terminals 115a, 115b in respective single rows of terminals as illustrated in FIGS. 4A and 8C. The two connector elements 104a, 104b each have wafer-like configurations and can be inserted into the body 108 from the rear to complete the internal connector assembly. As depicted, the terminal arrays of each connector element 104a, 104b are thereby positioned on opposite sides of the card slot 109.

FIG. 8A illustrates the basic construction of a connector element 104 that is used in the connectors 70. A plurality of twin-ax cables 60 and regular wires 121 are arranged in an array extending widthwise of the connector 70. The ends of the wires 121 and cables 60 are stripped to expose the signal conductors 61 of the cables 60 as well as define free ends 121a, 120a of the wires and cables, respectively, for terminating to corresponding tail portions 116 of the connector terminals 115a, 115b. (FIG. 4A.) In the embodiment illustrated, pairs of the twin-ax cables 60 are located at the outer ends of the array, and the drain wires 61-2 of the twin-ax cables 120 are bent simply upwardly and then bent again to lie flat on their associated ground plates 125. The terminals 115a, 115b are held together in their own spaced apart widthwise array by a support bar 124. This largely maintains the geometry of the cable in the connector termination.

The depicted receptacle connector 70 has a structure that promotes the signal integrity of data signals passing therethrough and which provides an impedance transition from the bypass cable wire pairs and the circuits of a circuit card of an opposing mating connector. This transition is from 85 to 100 ohms within a preselected tolerance level and is done in stages, or three zones so that the transition occurs in a gradual manner from an entry level impedance to a first transition impedance and then a second transition impedance and then finally to the final or third transition impedance. In this manner, the impedance transition occurs in a somewhat gradual manner over the entire length of the receptacle connector rather than occurring in the tail or the contact portions of that connector. In embodiments where no impedance transition is needed the transition can be omitted.

If a transition is provided it can provided by presenting three different dielectric mediums through which the receptacle connector terminals extend. The first zone medium is preferably a hot melt adhesive in which the impedance rises by about 6 ohms from the incoming impedance of about 85 ohms, and the second zone medium preferably includes LCP (liquid crystal polymer) where the impedance rises by about another 6 ohms, and finally the third zone medium includes air in which the impedance rises to about 105 ohms, thereby transition the impedance with a tolerance level of about 5%. The changes in surrounding medium are also accompanied by changes in the width of the terminals becoming wider or narrower in different zones. The distances between the terminals and associated ground planes can also contribute to this selected tuning of the impedance. The transition occurs over the length of the connector from the tails to the contact ends to present a gradual increase over a unit length rather than sole in either the tail or the contact portions of the terminals.

As depicted, the termination areas of the cables/wires 120, 121 to the terminals 115a, 115b are disposed in a nest 130, that extends widthwise and which is formed from an insulative material having a desired dielectric constant. (FIGS. 8A-8D.) The depicted nest 130 has a U-shaped configuration and it is located adjacent the terminal support bar 124. In this area, the drain wires 61-2 of the cables 60 can be joined to ground plates 125 that are positioned above the cables 60 and are spaced vertically apart from and above the terminal tail portions 116. The ground plates 125 have a plate body 125a with at least a partially planar surface which the drain wires 61-2 contact and to which the drain wires may be soldered, or otherwise connected.

Contact legs 126 are provided as part of the ground plates 125 in order to form contact portions 128 of the ground plates 125 that are preferably attached to the tail portions 116 of ground terminals of the connector 70. The contact legs 126 are vertically offset so that the ground plates 125 are spaced apart from and extend over at least a portion of the termination of the signal conductors to the signal terminal tail portions in the row of terminals associated with a corresponding connector element. As shown in FIGS. 8B-8D, each of the ground plates 125 preferably include three legs 126 which contact the ground terminals of the connector 70 in a manner such that any two signal terminal tail portions are flanked by two of the contact legs 126. This arrangement permits the spacing of the signal terminals to approximately match that of the signal conductors of the twin-ax cables 60 from an impedance perspective. In this manner, a G-S-S-G pattern of the terminals 115a, 115b is maintained for the internal connector 70 within the two rows of terminals on opposite sides of the card slot 109.

A rectangular frame 132 is provided along the rear of each connector element 104a, 104b and includes four walls 133 (FIG. 8) joined together around a bottom wall 134 to at least partially define a hollow interior recess 138. The front and rear walls 133 of the frame 132 are perforated as shown with openings 135 that are configured to accommodate the twin-ax cables 120 and the low power and logic control wires 121 in their longitudinal extent through the frame 132. The frame 132 is joined to the nest 130, along its rear face, by an overmolded portion that fills the termination area. The frame 132 can be formed of a conductive material, such as metal, or may have an outer conductive coating, so that when in place within the connector 80, the connector elements 104a, 104b make electrical grounding contact therewith. Thus, the frame can provide a path to ground or other reference plane. The connector element frames 132 are positioned adjacent to and rearward of the nest (FIG. 8C) and may be fixed to it as noted below.

The sidewalls 133 of the frame 132 may be slotted as shown with vertical slots 136. These slots 136 will engage the sidewalk 106a, 106h of the rear opening 106 of the connector 80 and because the frames are conductive, they can also alleviate EMI leakage out of the rear opening 106 of the connector 80. The open recess 138 of the connector element frame 132 through which the cables and wires extend is filled with a dielectric material, such as a liquid crystal polymer ("LCP") that fixes the cables/wires in place in the recess 138 with respect to the connector element frames 132 and to the nest, which also receives some of the LCP. In this manner, the wafer-like configuration of the connector elements 104a, 104b is defined and this overall structure provides a measure of strain relief to the twin-ax cables 60.

Figure 6:
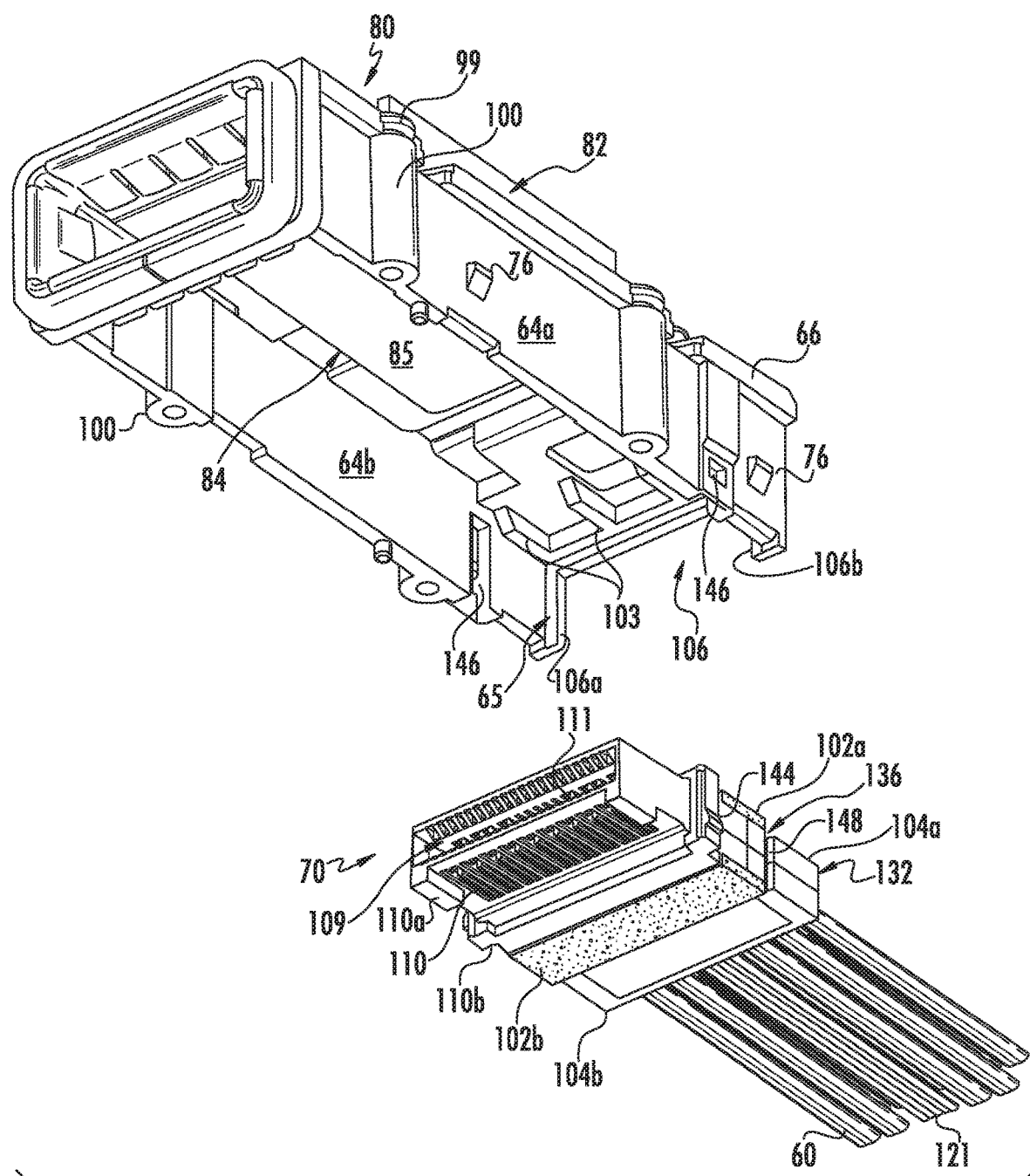
FIG. 6 is a perspective view taken from the bottom, of the cage of FIG. 5, with the bottom wall removed and the connector assembly removed out from inside of the cage.
Figure 6A:
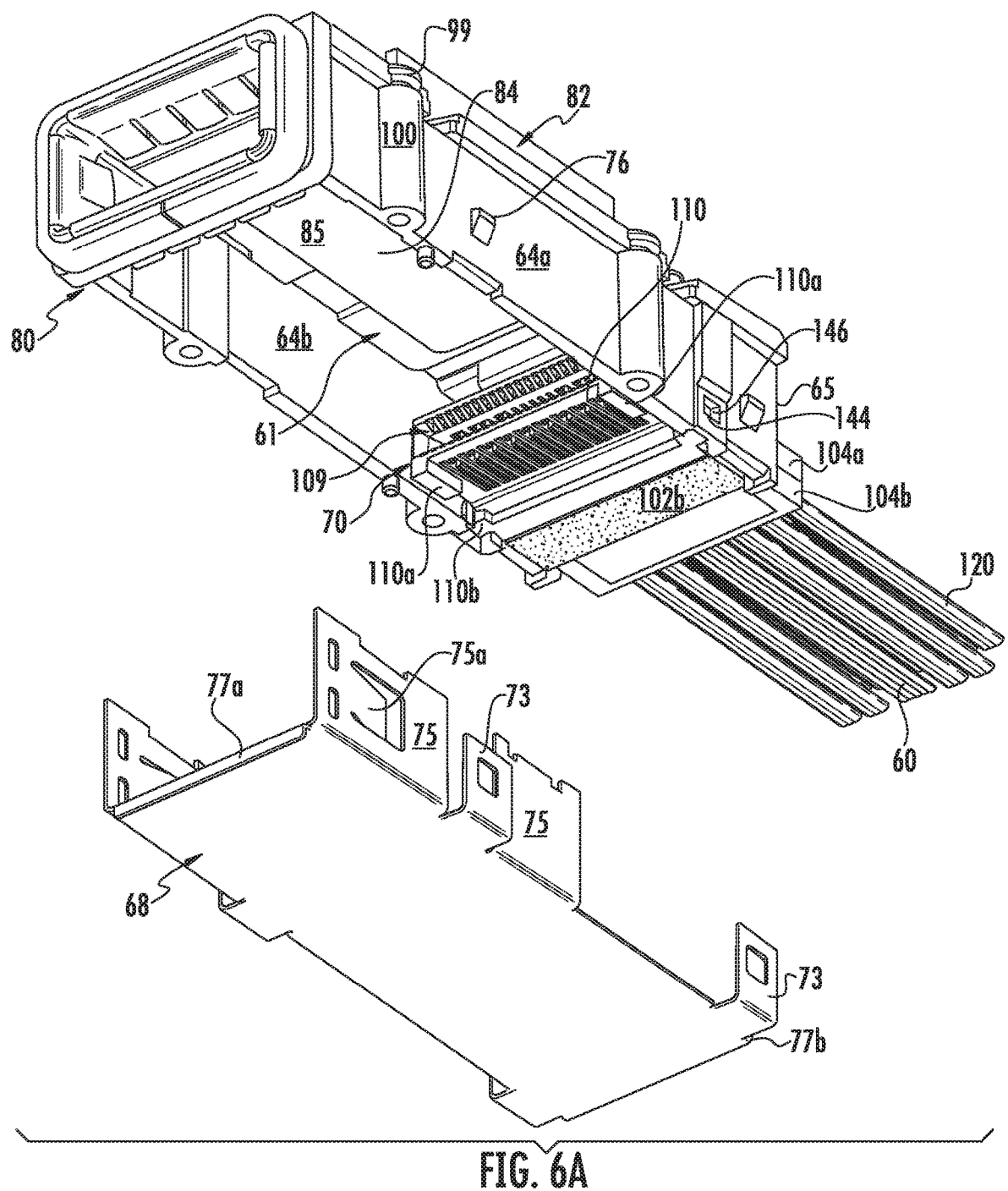
FIG. 6A is the same view as FIG. 6, but with the connector assembly in place within the cage.

The bottoms 134 of the two connector elements 104a, 104b abut each other and may engage each other through a post 140 and hole 141 manner of engagement as shown in FIG. 6. In this manner, the two connector elements 104a, 104h may be inserted into a rear opening of the connector body 108 so that the terminal contact portions are aligned with each other and are received in the terminal-receiving cavities 111 of the connector body 108 to form an integrated connector assembly. As illustrated in FIG. 6, the connector assembly is pressed into the hollow interior space of the connector 60 from below. An internal ground plane 142 is provided in the form of a flat, conductive plate that is located between the two connecting elements 104a, 104b. It extends from the rear end of the connector element frame 132 to the forward edge of the nest 130. This ground plane 142 acts as a primary ground plane that serves to block crosstalk between the signal conductor pairs in one connector element and the signal conductor pairs in another connector element. The ground plates 125, act as secondary ground plates, or busses to the signal conductors of the cables 120 and their termination to the signal terminals 115a.

Figure 10:
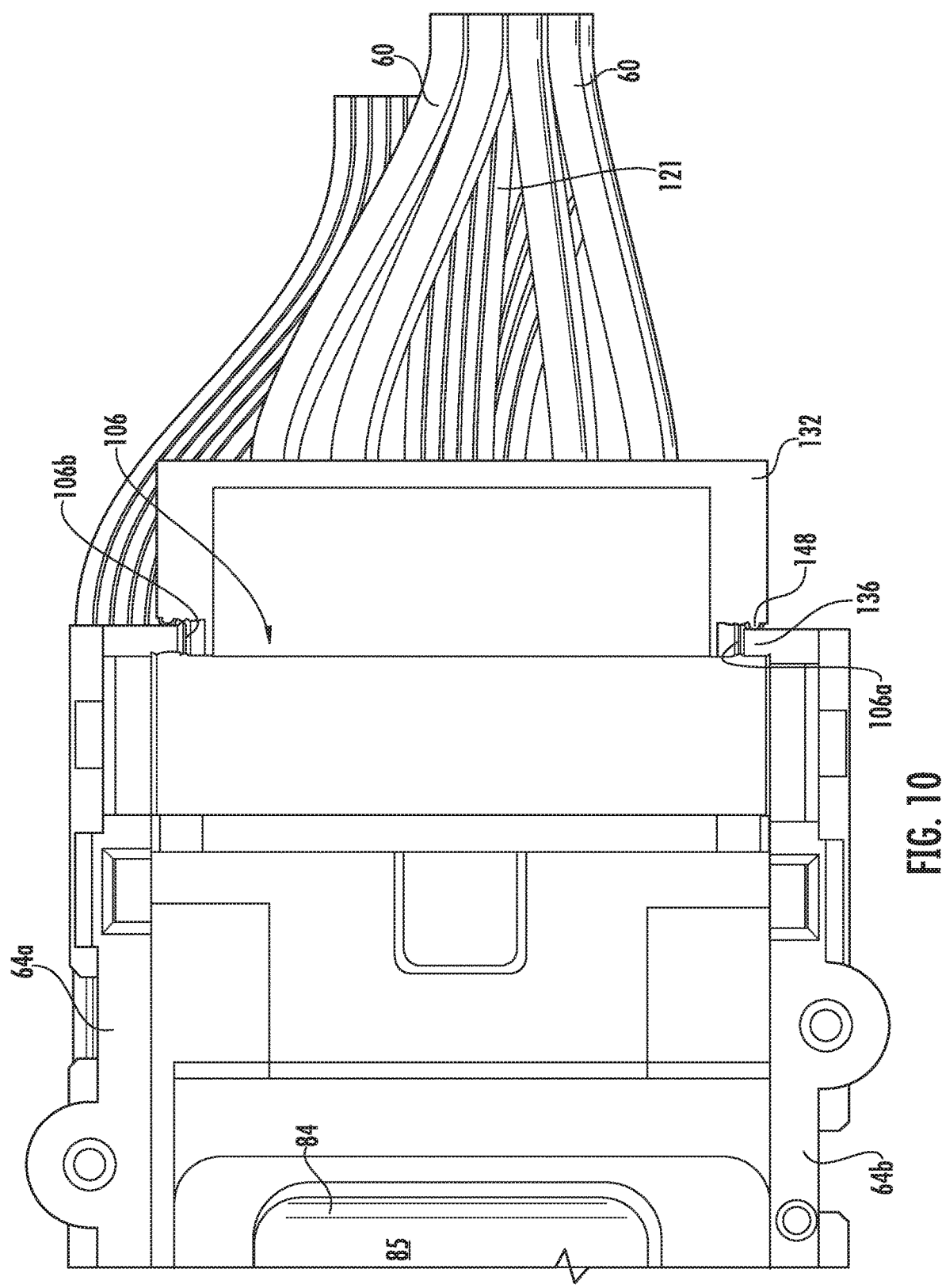
FIG. 10 is an enlarged detail view, of the bottom of the rear end of a cage with the connector assembly in place.
Figure 11:
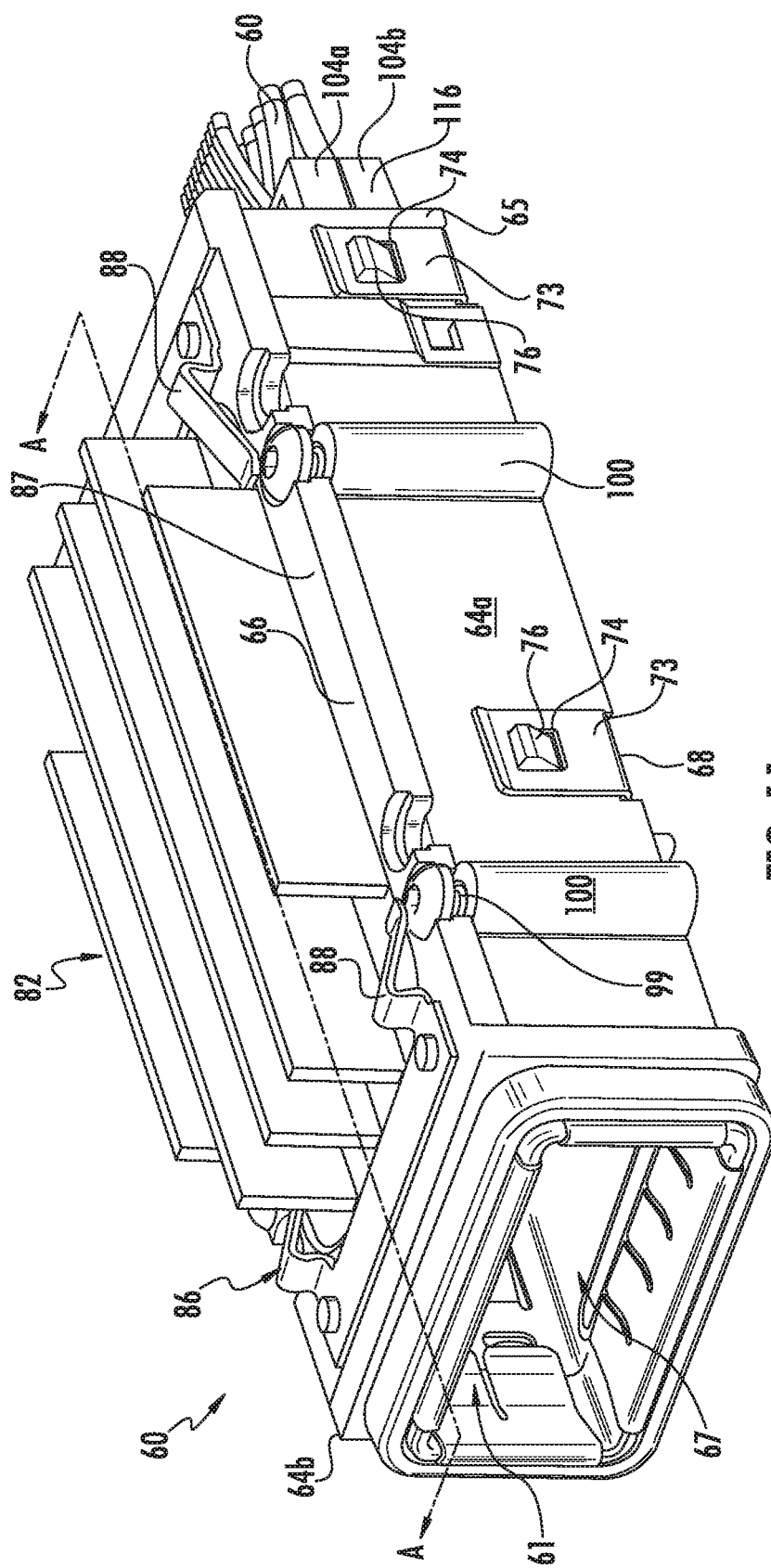
FIG. 11 is a perspective view of a cage which is utilized in the bypass assemblies thereof.

The slots 136 on the sides of the connector elements 104a, 104b engage the sides 106a, 106b of the connector rear opening 106, while two catches 144 disposed on opposite exterior sides of the connector body 108 are received in corresponding openings 146 in the sidewalls 64a, 64b of the connector 80. The catches 144 may be oversized so as to deform when the connector assembly is inserted into place in the cage 63. The slots 136 may be rounded in configuration with tips 148 pointing inwardly or at each other, in order to ensure reliable contact with the connector 80. (FIG. 10.)

The two EMI absorbing pads 102a, 102b may be applied to opposing surfaces of the connector elements 104a, 104b of the connector assembly prior to the connector assembly being pressed into the interior 61 of the connector 80 from the bottom. The connector elements are vertically slotted, as previously noted, so they can engage the sides 106a, 106b of the rear wall opening 106 of the connector and this contact provides in cooperation with the EMI-absorbing pads, four-sided EMI leakage protection around the connector elements. The rear wall of the connector 80 and the conductive connector elements 104a, 104b combine to form, in effect, a fifth wall that prevents EMI leakage. The pads 102a, 102b seal off the spaces between the connector elements 104a, 104b and opposing surfaces of the cage 63. These pads 102a, 102b occupy the open spaces above and below the connector elements 104a, 104, which are normally empty in conventional connectors.

The EMI pads 102a, 102b are preferably aligned with and positioned above the areas of the connector elements where the cable wires are terminated to the terminal tails of the internal connector 70. The bottom pad 102b is held between the bottom wall 68 and the bottom connector element 104b, while the top pad 102a is held in place between the top connector element 104a and the cage rear cover 90. This is accomplished by ribs 103 that are formed on the bottom of the rear cover 90 which extend down into contact with the pad 102a, as illustrated in FIG. 13B. The connector elements, EMI-absorbing pads are thereby sandwiched between the cage top and bottom walls 66, 68 and the pads 102a, 102b help ensure that EMI leakage is reduced along the cage rear wall opening 106.

With the twin-ax cables 60 directly terminated to the terminals of the connector 70, the connectors 80 are configured for mounting off of a circuit board and onto a panel or in a manner so as to be a free-standing connector within a host device. The connectors 80 need not be mounted to a circuit board 62 in a termination manner, but can be by way of fasteners extending through openings in the circuit board and into the screw bosses. Thus, the beneficial sealing off of the bottom of the connector and elimination of the need for a right-angle connector not only eliminates the need to mount the connector on the motherboard 62, but also facilitates stacking of the connectors in both vertical and horizontal arrangements.

Accordingly, the wires of the connector may be directly connected to components of the host device, such as a processor or a chip package and the like bypassing the traces on the circuit board. As the connection now may be direct, the connector does not have to be mounted on a circuit board but may be enclosed within a structure such as the connectors 80 disclosed and be panel mounted. The connectors 80 may be arranged on an adapter frame, which can be configured similar to a cage if desired. Still further, the connector may be used an as internal connecting sleeve to provide an internal connector that is positioned within the host device and which receives a plug-style connector. The connector cables are terminated to the connector element terminal tails at one ends of the cables so the cables can be terminated at their second ends to the chip packages or processors of the host device. An integrated bypass assembly such as this can be installed and removed or replaced as a unit, which bypasses the circuit board and the associated loss problems which occur in FR4 materials, thereby simplifying the design and reducing the cost of the circuit board.

Figure 5:
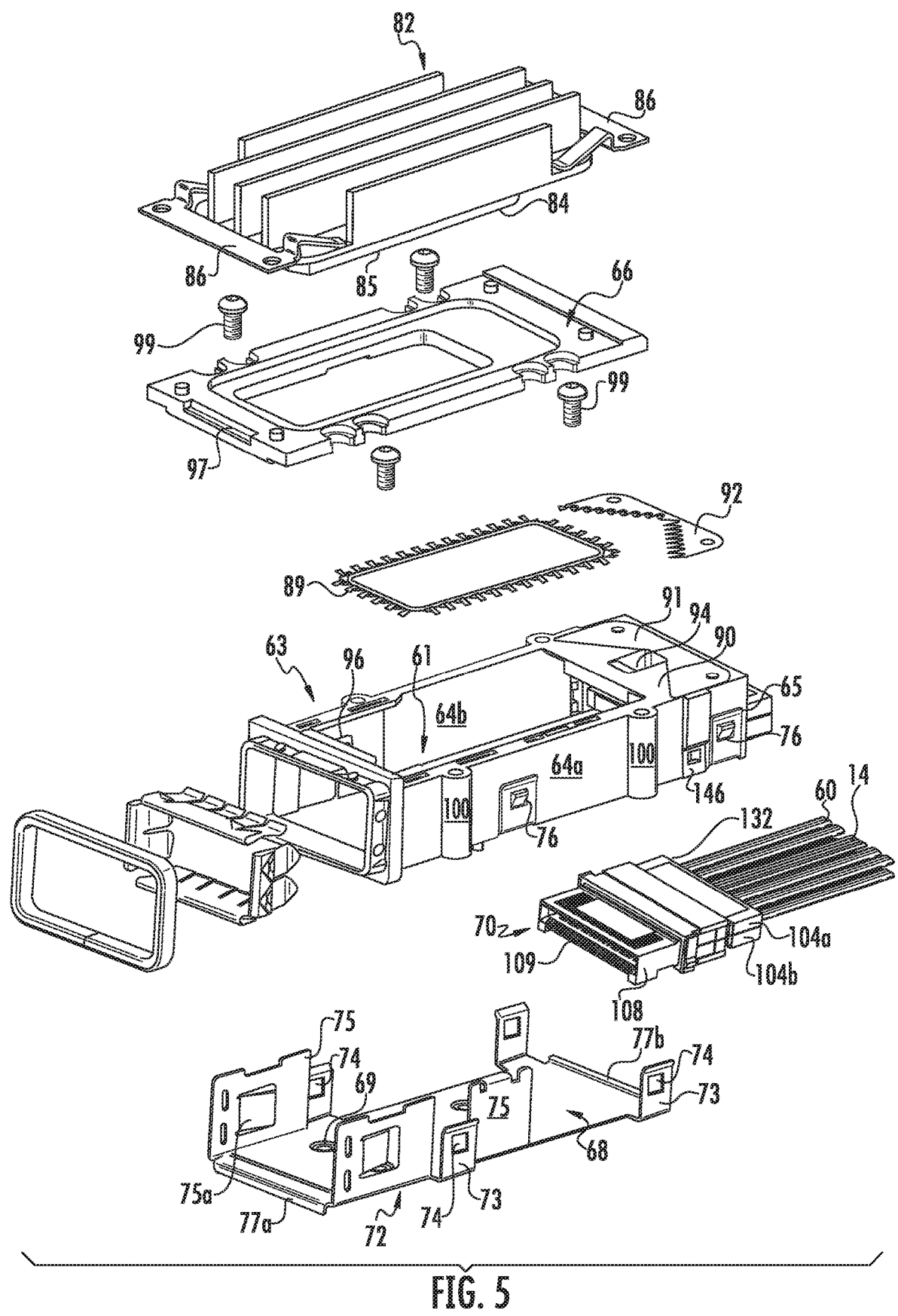
FIG. 5 is an exploded view of a cage and the cable-direct connector assembly of FIG. 4.
Figure 5A:
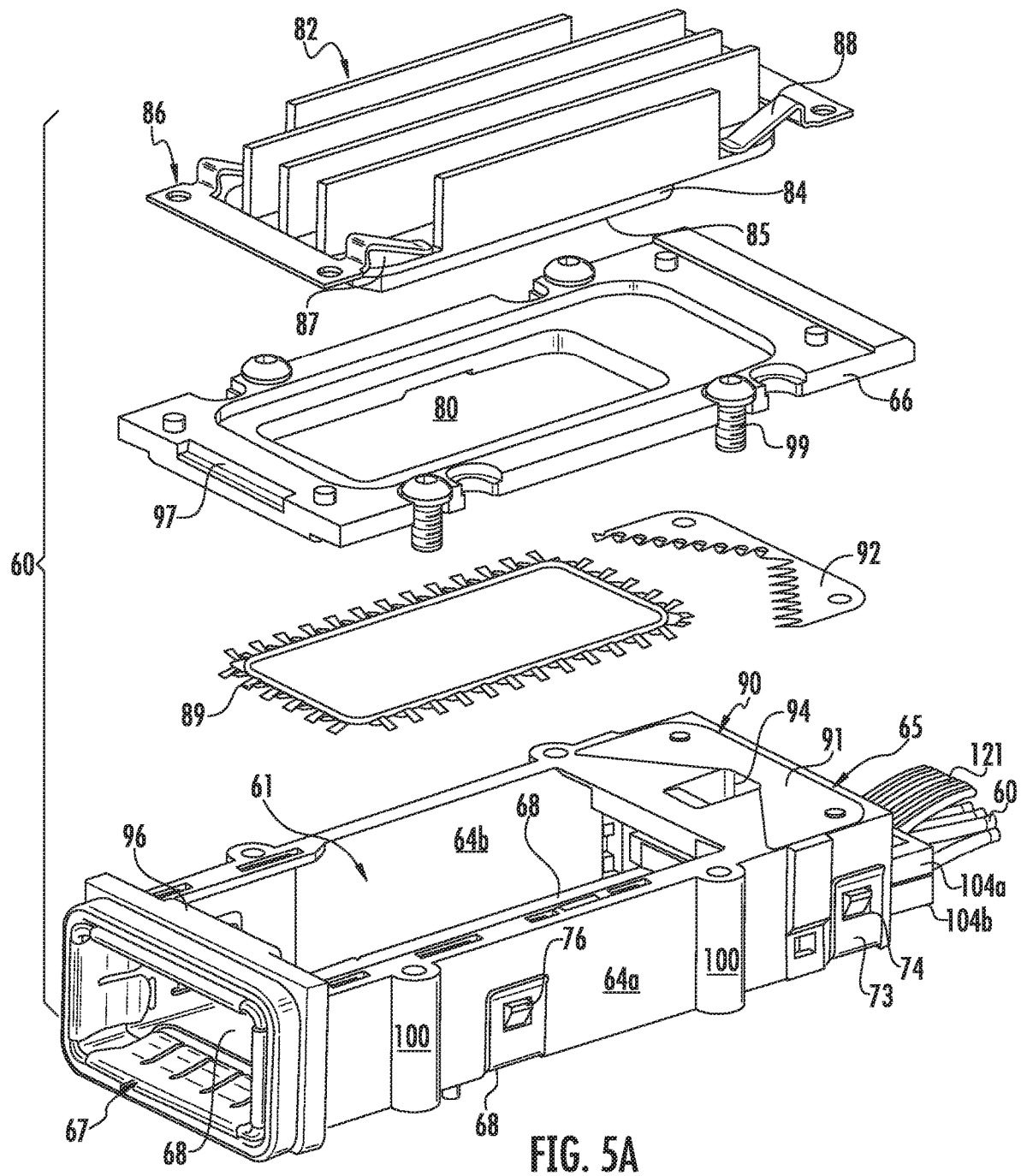
FIG. 5A is the same as FIG. 5, but with the receptacle connector in place within the cage and the bottom fixed to the sidewalls of the cage.

Turning now to FIGS. 4-9, a connector 80 is illustrated in FIGS. 5 and 5A that can be used as an external interface that accommodates entry connectors of the host device. The connector 80 is disposed in the first wall 374 of the device 50 and receives opposing mating connectors in the form of plug connectors, such as pluggable electronic modules and the like. The connector 80 includes a cage 63 that is conductive and includes two sidewalls 64a, 64b, a rear wall 65 and top and bottom walls 66 and 68. All of the walls cooperatively define a hollow interior 61 that receives a corresponding opposing external mating connector that mates with an internal connector 70 so as to define a port. The walls of the connector 80 may be formed together as one piece as in an adapter frame, or they may be utilize separate elements that are joined together to form an integrated assembly. It should be noted that the connector 80 is not limited in its operation to accommodating only pluggable modules but can, with the appropriate configuration, accommodate any suitable connector.

The cage walls 64-66 & 68 are all conductive and provide shielding for connections made within the connector 80. In this regard, the connector 80 is provided with a conductive bottom wall 68 that completely seals off the bottom of the cage 63 in contrast to known cages and frames that are open at their bottoms to the circuit board upon which they are mounted. The depicted connector 80 contains an internal, cable-direct connector 70 (FIG. 4) that has direct wire connections made to its terminals 115a, 115b and therefore does not require termination to traces on the motherboard 62 of the host device 50. Prior art connectors enclosed by cages or frames are of the right angle type, meaning the connector extends at a right angle from its mating face to the circuit board and the traces to which the connector is terminated. Right angle connector terminations to circuit boards can create signal integrity problems in high speed operation, due to the varying lengths of the terminals and the bending thereof, such as increased capacitance in the corners of the bends and jumps or dips in the characteristic impedance of the system at the connector and its interface with the circuit board. In addition, the exiting of the cables out of the rear of the cage can potentially eliminate the need to use press-fit pins as a means to mount the connector to the circuit board, as ordinary mounting holes can be used for threaded fasteners, thereby simplifying the overall design of a host device motherboard. As depicted, the internal connectors 70 are terminated to wires of cables 60 and exit out of the rear wall 65 of the connector 80, thereby avoiding the aforementioned problems.

Figure 6B:
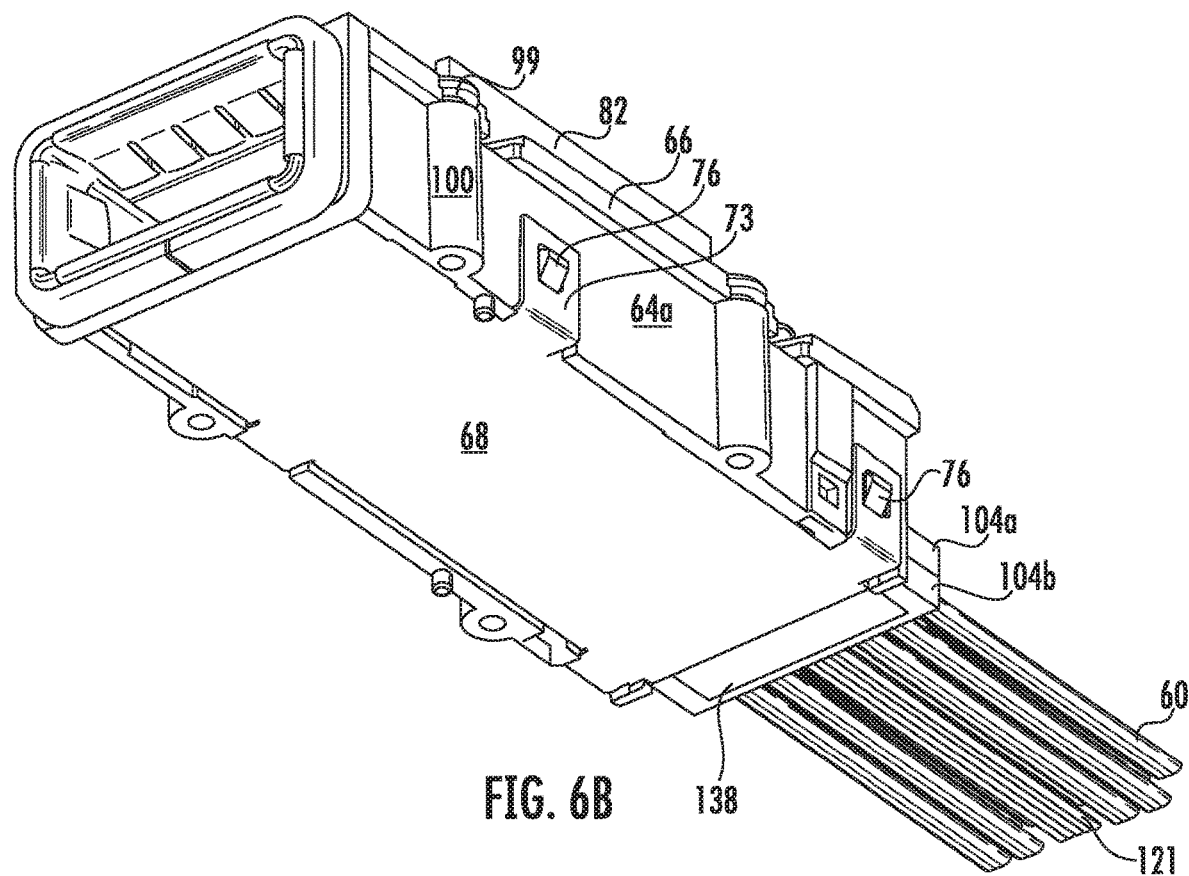
FIG. 6B is the same view as FIG. 6A, but with the bottom wall in place to seal the cable direct connector assembly in the cage.
Figure 13A:
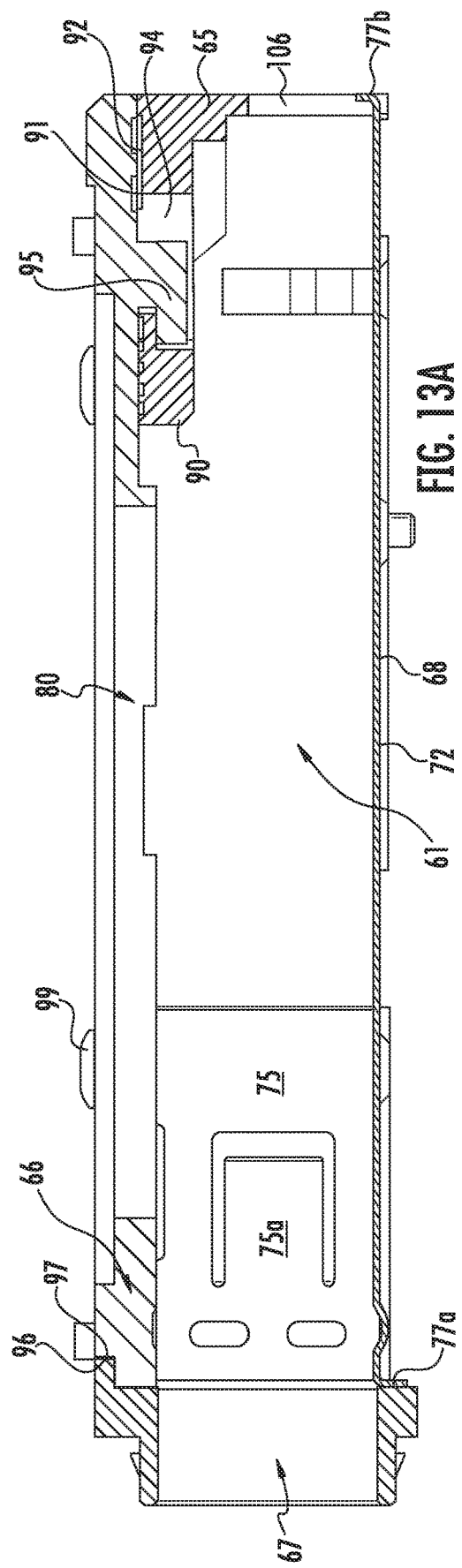
FIG. 13A is a sectional view of an empty cage without the internal connector and heat transfer member in place.

The bottom wall 68 of the cage, as shown in FIGS. 5-6B, seals off the bottom of the connector 80. The bottom wall 68 is shown as formed from a piece of sheet metal with a bottom plate 72, and side attachment flaps 73 that extend along the outer surfaces of the cage sidewalls 64a, 64b. Openings 74 in the attachment flaps 73 engage catches, or tabs 76 which are located on the sidewalls 64a, 64b and retain the bottom plate 72 in place. Additional means of attachment may include inner flaps 75 that are also bent up from the bottom plate 68 but are positioned along the edges of the bottom plate 68 to extend into the interior hollow space 61 along the inner surfaces of the sidewalls 64a, 64b. Two such inner flaps 75 are illustrated in FIGS. 1I & 13A and include contact tabs 75a that extend inwardly for contacting opposite sides of an opposing connector inserted into the interior channel 61. Two rims, or flanges 77a, 77b, may also be provided at opposite ends of the bottom plate 68 which extend at an angle thereto in order to engage the front and back wall 65 of the cage 63 to make conductive contact and provide EMI shielding at those locations. The use of a bottom wall 68 that covers the entire bottom significantly reduces EMI in this area. Standoffs 69 may be formed in the bottom wall 68 if desired. The many points of contact between the bottom wall 68 and the cage 63 provide a reliable EMI shielding gasket along the entire bottom of the connector 80 for the internal connector 70.

Turning now to FIG. 5, the top wall 66 preferably includes an access opening 81 which communicates with the hollow interior 61 and which is aligned with the internal connector 70 and primarily the area in front of the internal connector 70. A heat transfer member 82 shown as a finned heat sink may be provided which has a base 84 that extends at least partially into the access opening 81. The base 84 has a flat bottom contact surface 85 that contacts an opposing surface of a module inserted into the cage interior 61. Two retainers 86 are shown as joined to the top wall 66 and each retainer 86 has a pair of preloaded contact arms 88 that exert a downward retention force on a top plate 87 of the heat sink. An EMI gasket 89 is provided that extends around the periphery of the opening 81 and is interposed between the top wall 66 and the heat transfer member 82.

The connector 80 further includes a rear cover portion 90 that extends over a rear portion of the interior 61 to cover part of the internal connector 70. A recess 91 may be formed in the rear cover 90 to accommodate a chevron-shaped EMI gasket 92 interposed between opposing surfaces of the rear cover 90 and the top wall 66. The rear cover 90 can be seen to include an opening in the form of a slot 94. The top wall 66 (FIG. 13A) may include an engagement hook 95 as shown that is received within the slot 94 to engage the top wall 66 to the cage 63 in a manner such that the top wall 66 can be slid forward so that its leading edge abuts the front flange of the connector 80, which may include a projecting tab 96 formed therewith which engages a corresponding slot 97 of the top wall 66. (FIGS. 5A & 13A.) Fastener 99, which may be a screw or other fasteners, may be used to secure the top wall 66 onto the cage 63 by engaging threaded holes formed in screw bosses 100 supported by the cage 63. In this manner, the cage 63 is sealed in a manner to significant reduce EMI leakage.

Figure 15:
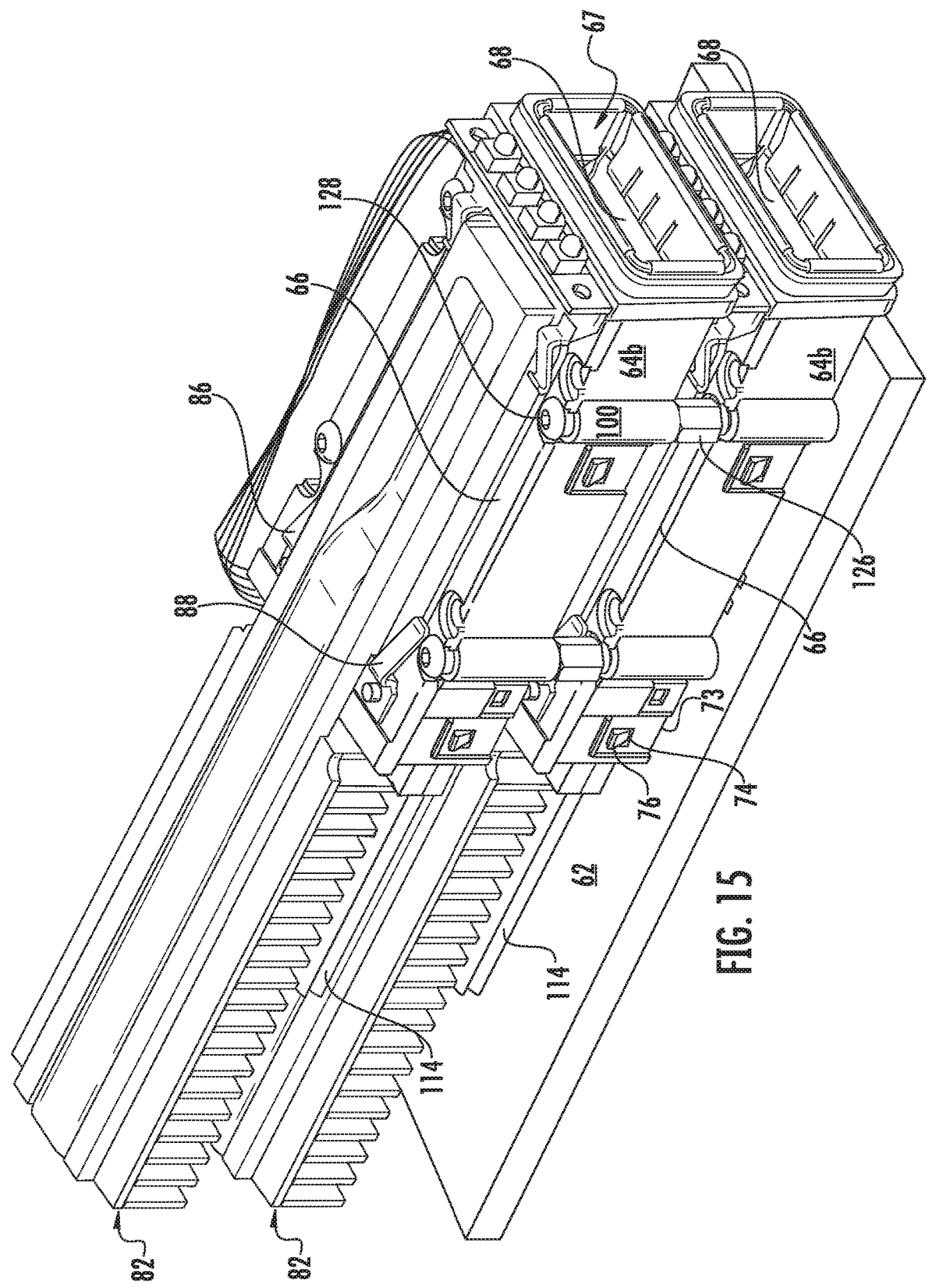
FIG. 15 is a perspective view of a pair of cages with heat transfer members and indicator lights arranged in a vertical stack on a circuit board.
Figure 15A:
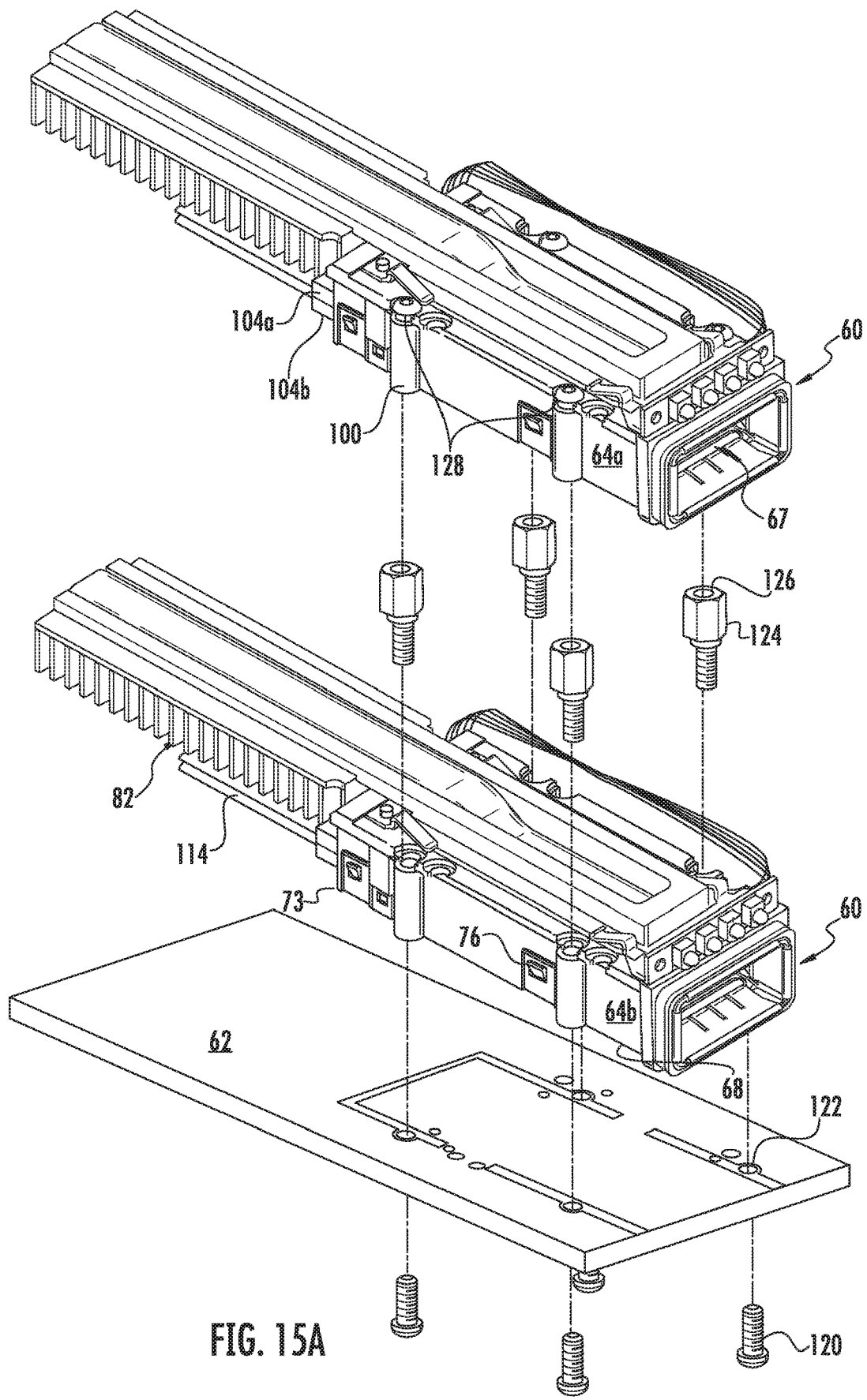
FIG. 15A is an exploded view of FIG. 15.
Figure 16:
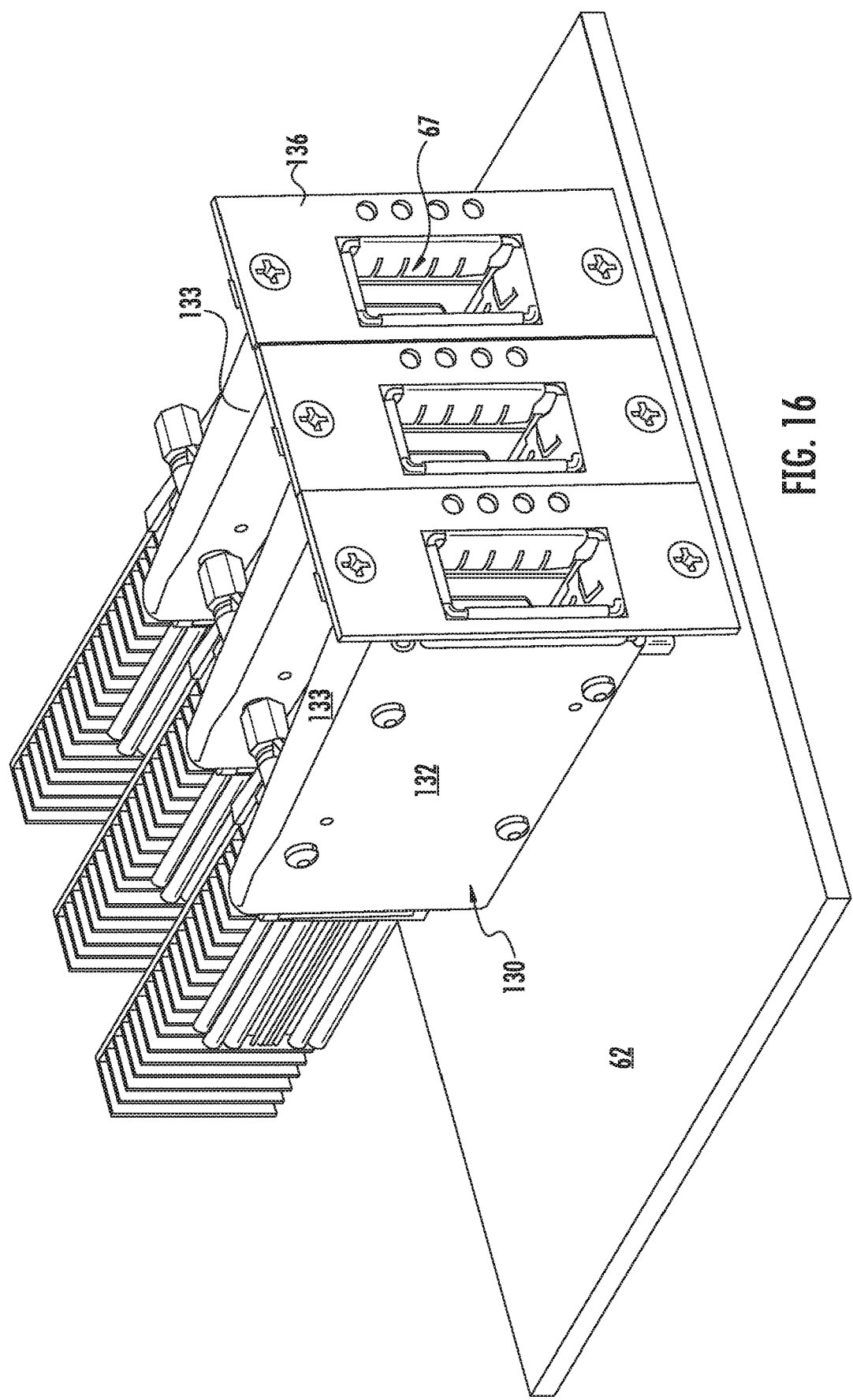
FIG. 16 is a perspective view of three cages arranged vertically in a horizontal row on face plates of a device.

Because the internal connectors 70 are connected directly to the cables 60, the connectors 80 need not be mounted to the motherboard 62 by direct termination, but can be supported by other structures or can be attached by way of fasteners 120 that extend through openings 122 in the circuit board and into the screw bosses 100. Sealing off of the bottom of the connector 80 and elimination of a right-angle connector not only eliminates the need to mount the connector 80 on the motherboard 62 but also facilitates stacking of the cages/connectors 80 in vertical and horizontal arrangements. FIGS. 15 & 16 illustrate just two different styles of stacking. FIGS. 15 & 15A illustrate a pair of connectors 80 with their entrances 67 oriented horizontally in a vertical stack. The two connectors 80 are shown supported on a circuit board 62 by way of bottom screws 120 that engage the screw bosses 100 in an upward manner through openings in the circuit board. A set of middle screws 124 are provided to engage the screw bosses 100 of the lower cage and these screws 124 have threaded male ends and threaded female ends 126. The female ends 126 engage top screws 99, 128 extending into the screw bosses 100 of the top cage. Thus, multiple connectors 80 may be stacked in such a fashion without requiring complex high speed connecting traces formed in the circuit board 62 and terminated to the internal connectors 70.

Figure 16A:
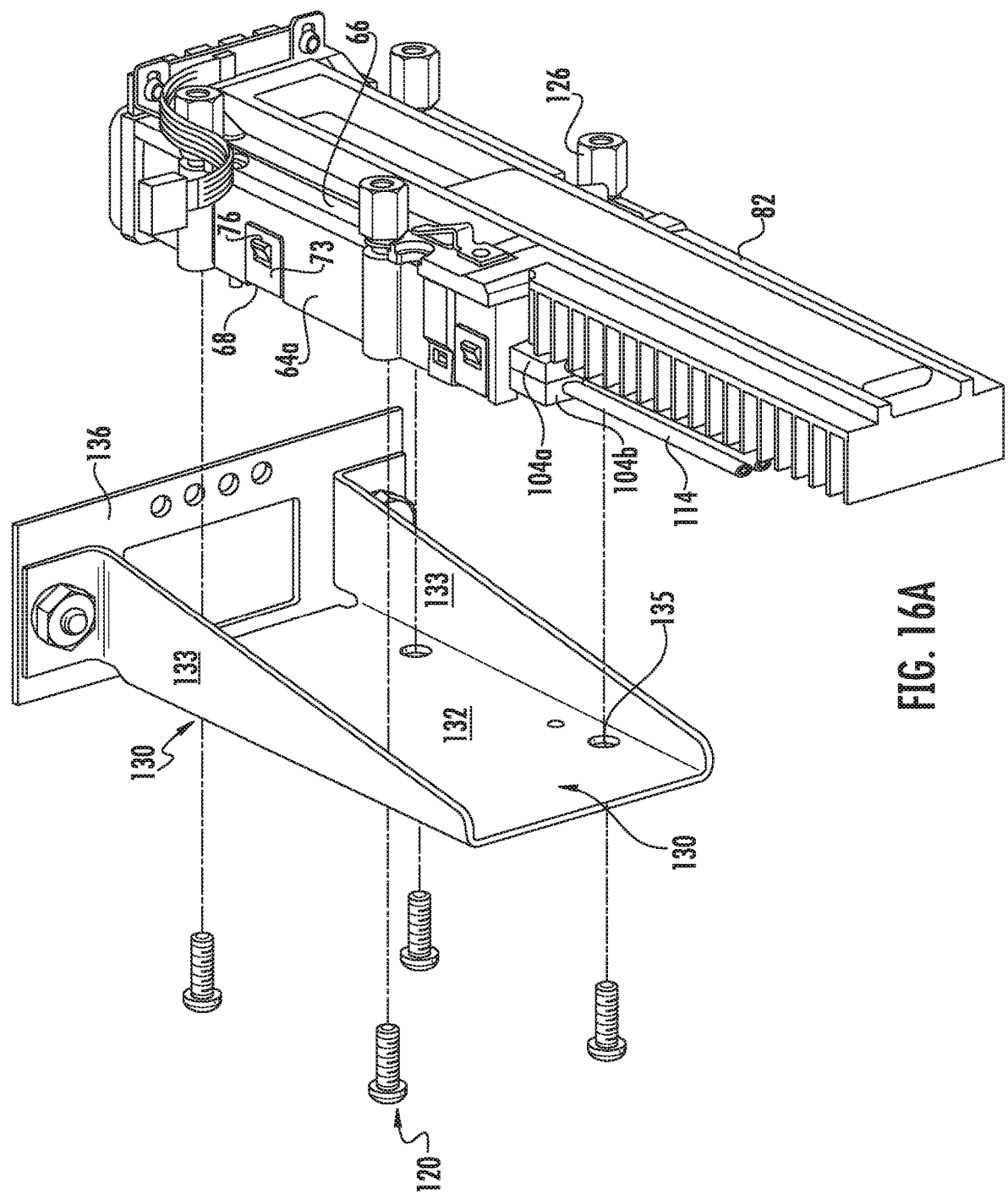
FIG. 16A is an exploded view of a vertical cage and face plate mounting assembly.
Figure 17:
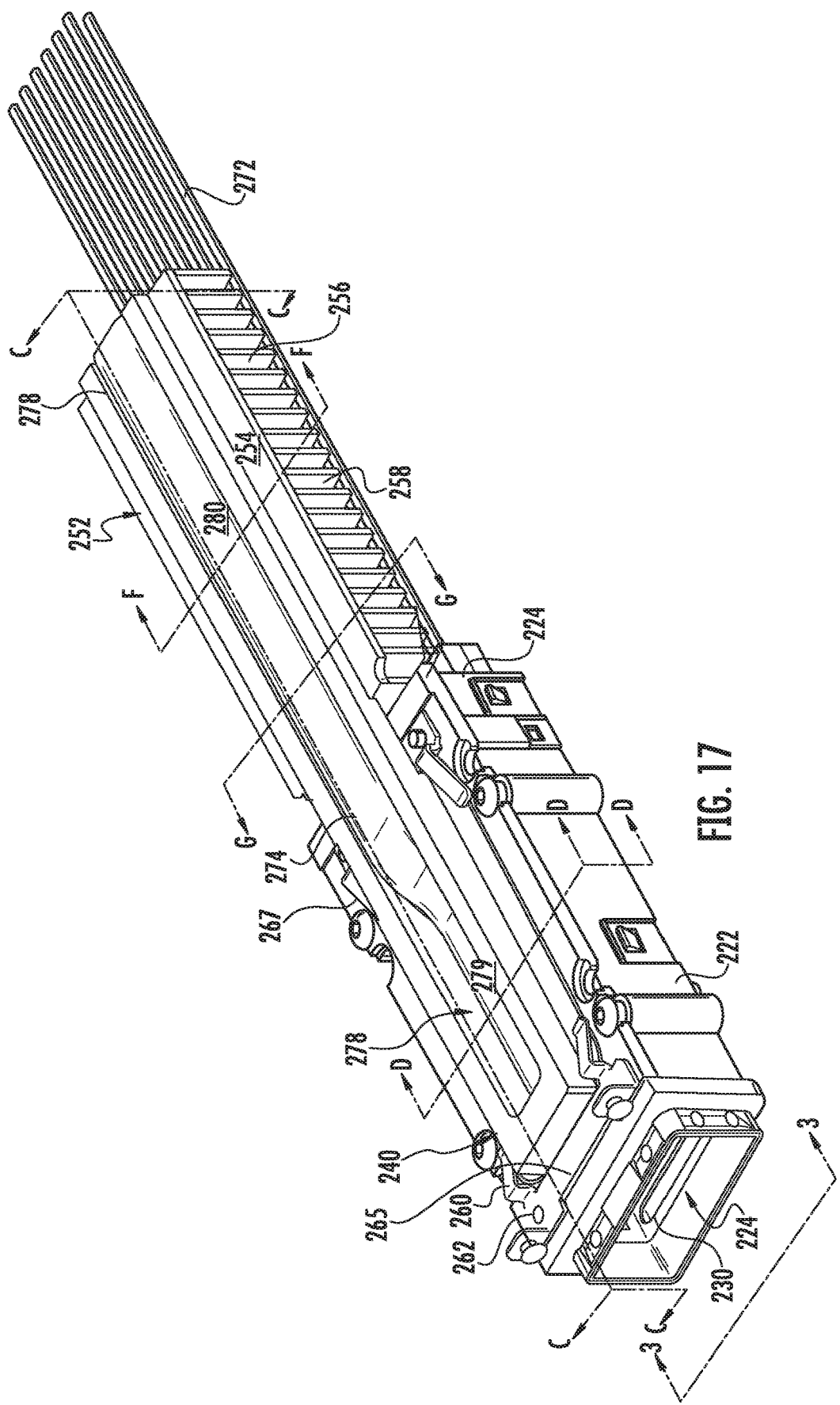
FIG. 17 is a perspective view of a cage with an improved heat sink assembly constructed in accordance with the principles attached thereto.

FIGS. 16-16A illustrate another manner in which the connectors 80 may be arranged. This arrangement includes a horizontal row of three cages that are aligned vertically along a front of the host device, but raised off of the circuit board 62. FIG. 15B illustrates a mounting nest 130 that has a base 132 and two extending sidewalls 133 that form a recess which accommodates a connector 80. The mounting nest 130 has two attachment flanges 134 that can be attached to a faceplate 136 with fasteners as shown extending through openings 135 in the base 132. Fasteners may be used to attach the cages to the nest, and they extend through the base openings 135 into the screw bosses 100. The top wall 66 of the connector 80 may be attached to the cage 63 with male-female ended fasteners 126 as noted above so that adjacent connectors 80 may be assembled into an integrated arrangement with male fasteners extending through the bases 132 of the nests 130 into the female ends 126 of opposing fasteners or into the screw bosses 100 of the cage. The connectors 80 may also be spaced closely together in instances as shown in FIGS. 14-15B as the heat transfer member 82 has its heat dissipating fins extending rearwardly of the cage as set forth to follow.

Accordingly, a free-standing connector/cage is provided that can be attached to an external wall of a host device, such as a faceplate or bezel or to a circuit board without requiting any termination traces positioned underneath the cage. Such a free-standing connector does not have to be mounted on a circuit board, but may be panel mounted. The connector may take the form of an adapter frame, a shielding cage or similar type of cage. Still further, the connector may be used an as internal connecting sleeve to provide an internal connector that is positioned within the host device and which receives a plug-style connector. The connector cables are terminated to the connector element terminal tails at the proximal ends of the cables, and the cables can be terminated at their distal ends to the chip packages or processors of the host device. An integrated bypass assembly such as this can be installed and removed or replaced as a unit, which bypasses the circuit board and the associated loss problems which occur in FR4 materials, thereby simplifying the design and reducing the cost of the circuit board.

The mating connectors used to connect to the I/O connectors generate heat during operation, and this heat must be removed in order to maintain efficient transmitting and reception of signals during operation. High temperatures can negatively affect the performance of not only the modules, but also the devices in which they are used, so it is important to remove this operational heat. Such removal is typically accomplished by the use of heat sinks which include solid bases that make contact with selected surfaces of the modules, typically the top surfaces. These heat sinks further have plurality of heat-dissipating fins that project upwardly from the bases into the interior space of the device. The fins are spaced apart from each other so that air can flow over and around the fins in a manner that heat is dissipated from the fins into the surrounding interior atmosphere. The fins are mounted above the heat sinks and modules and extend upwardly for a specific height in order to achieve a desired degree of thermal exchange. However, the use of such heat sinks does not permit a designer to reduce the height of the devices in which modules are used, eliminating the possibility of reducing the overall heights of such devices.

Figure 18:
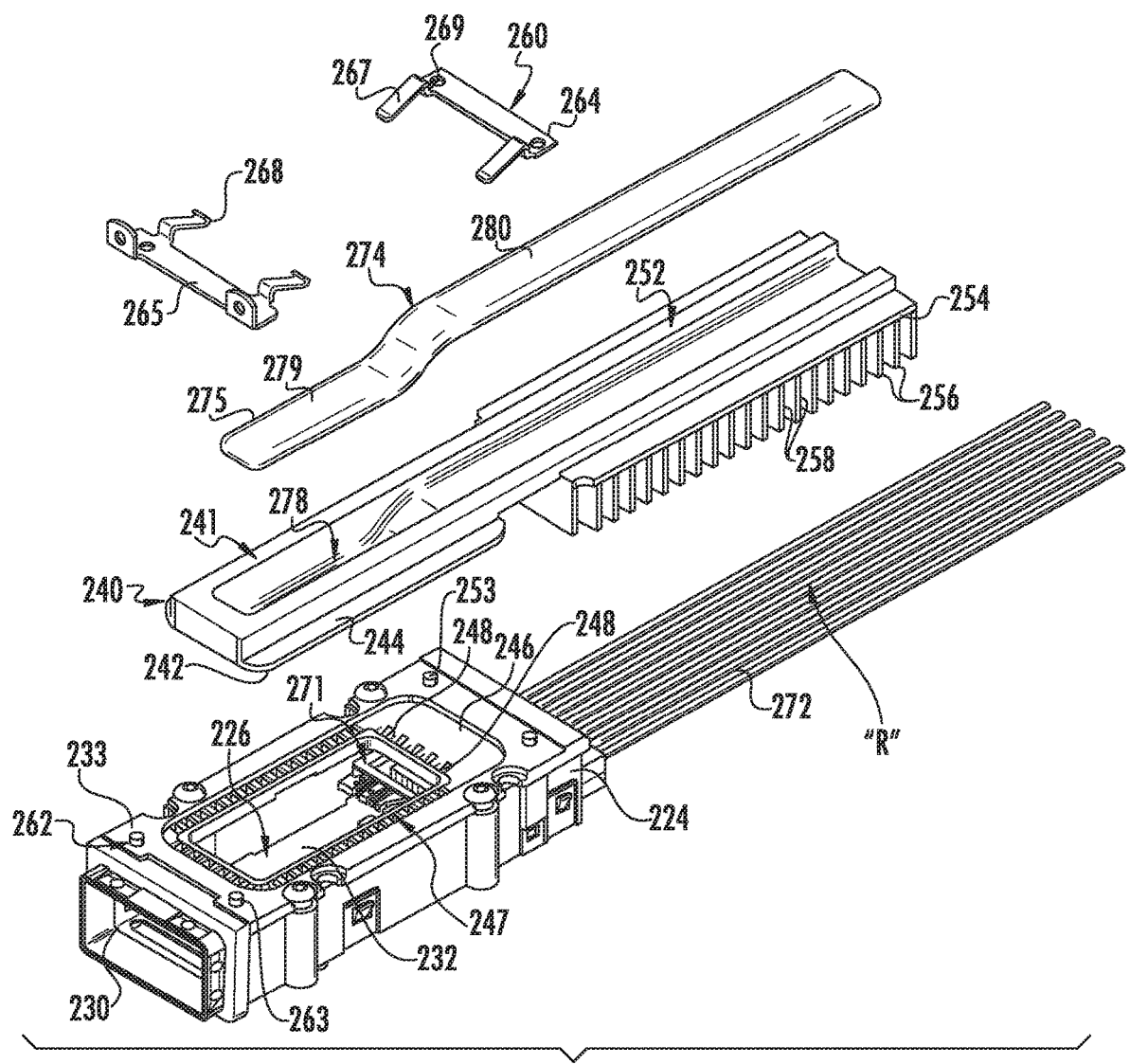
FIG. 18 is a partially exploded view of the cage-heat sink assembly of FIG. 17, with the heat sink assembly components removed from their engagement with the top of the cage for clarity.
Figure 19:
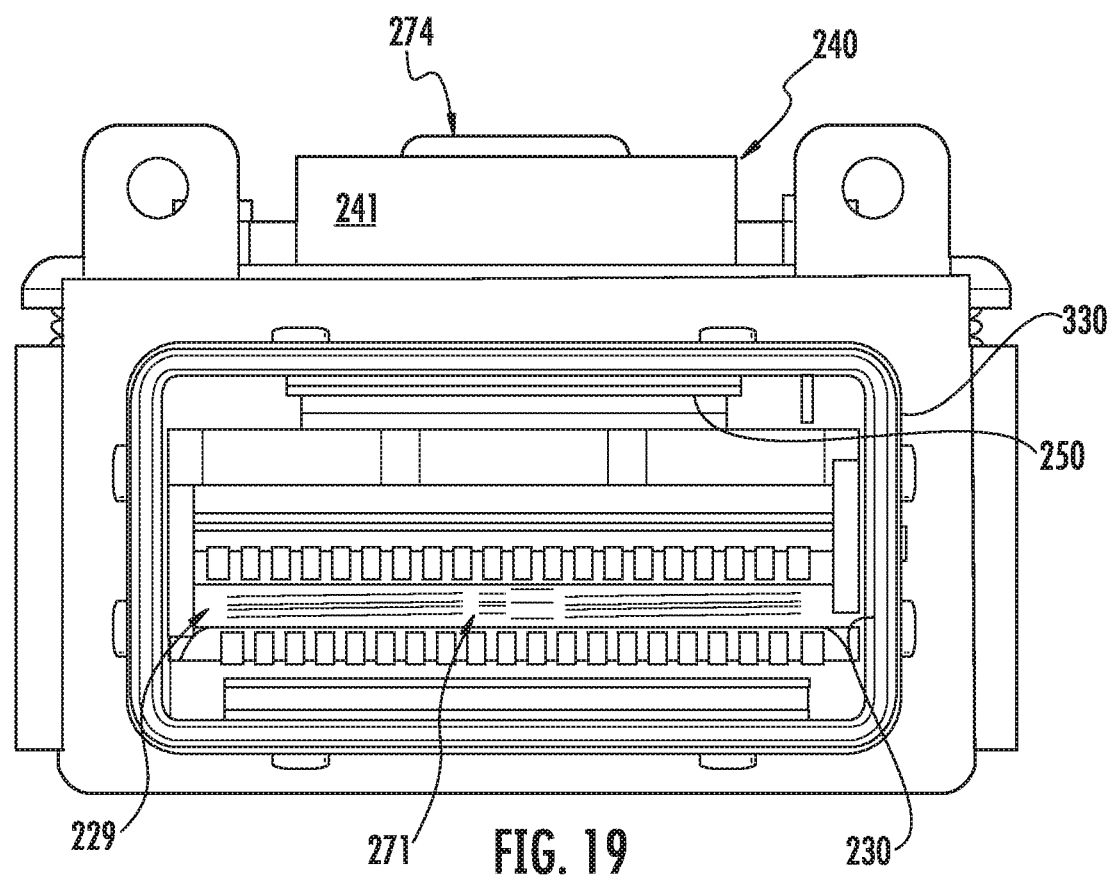
FIG. 19 is a front elevational view of the cage-heat sink assembly of FIG. 17, taken along lines 3-3 thereof.
Figure 19A:
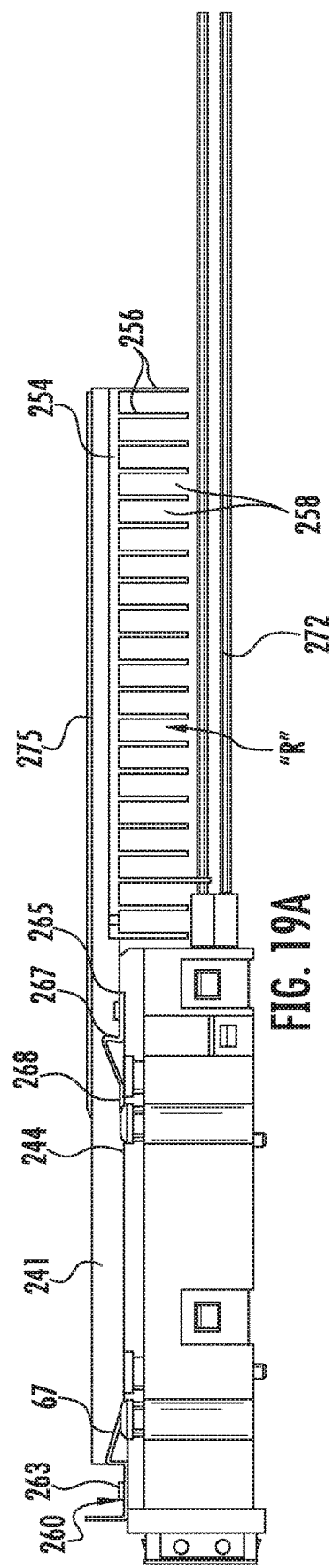
FIG. 19A is a side elevational of the cage-heat sink assembly of FIG. 17, taken along the right side thereof.
Figure 19C:
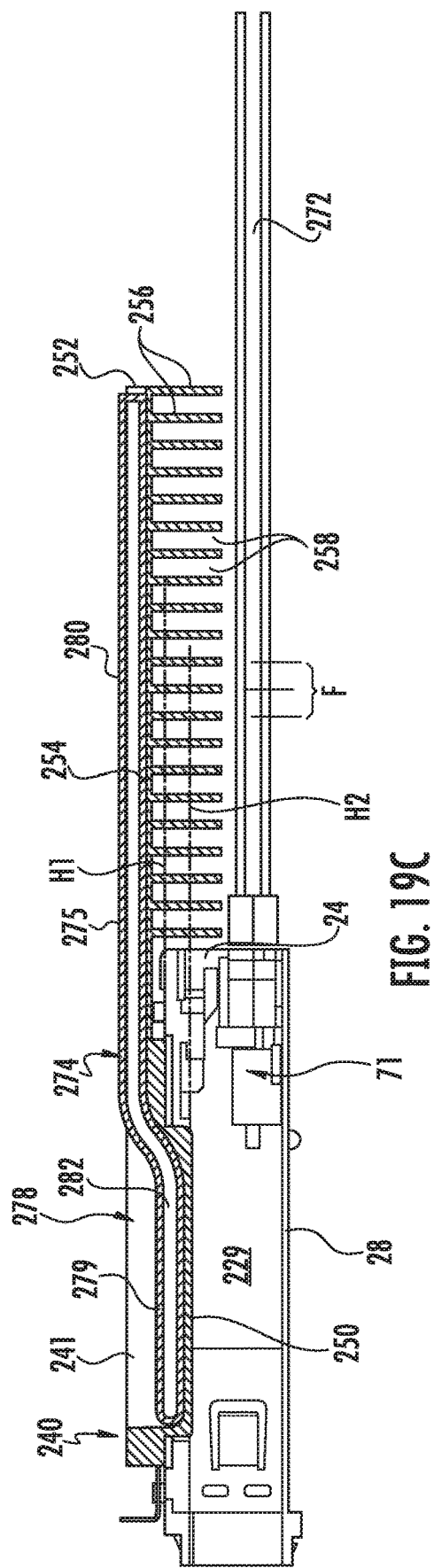
FIG. 19C is a longitudinal sectional view of the cage-heat sink assembly of FIG. 17, taken along lines C-C thereof.

In this regard, as shown in FIGS. 17-19G, a heat sink assembly 240 is provided that includes a heat transfer portion 241 which has a solid base 242 that depends downwardly into the interior space 226 of the cage/connector 222. The heat transfer portion base 242 is complimentary in shape to the opening 232 in the cage 222 so that the base portion 242 may extend through the opening 232 and into the interior space 226 so as to make thermal contact with the top or upper surface of a module inserted into the front opening 230 of the interior bay 229 of the cage 222. The base 242 may further include a skirt or lip portion 244 that extends around at least a substantial portion of the periphery of the base 242, and preferably around the entire periphery of the base 242. This skirt 244 is received in a corresponding recess 246 formed in the top surface 233 of the cage 222 and which preferably surrounds the opening 232. A conductive EMI ring gasket 247 is provided that fits in the recess 246 and which encircles the opening 232. The gasket 247 has a plurality of spring fingers 248 that provides a conductive seal between the heat transfer portion skirt 244 and the cage top recess 246 so as to prevent EMI leakage through the opening 232. The EMI gasket 247 sits within the recess 246 and surrounds the opening 232 with the spring fingers 248 extending radially outwardly, as shown and into contact with the bottom surface of the skirt 244. The opening 232 in the top of the cage 222 is considered as a contact opening as it permits the heat transfer portion 241 to extend into the interior space 226 of the cage 222 and into thermal transfer contact with any module inserted therein by way of a thermal contact surface 250. (FIG. 19C.)

The heat transfer portion 241 has a solid base portion 242 that preferably includes a planar thermal contact surface 250 (on its bottom) that is configured to enter the frame contact opening and contact the top surface of a module inserted into the bay 229 in effective and reliable thermal contact. The base 242 may include an angled lead-in portion on its contact surface 250 to facilitate the insertion of a module. The heat sink assembly 240 further includes a distinct heat dissipating portion 252 that dissipates heat generated by the module and transferred to the heat transfer portion 241 by way of contact between the thermal contact surface 250 and an opposing top surface(s) of the module. As shown in FIG. 18, this heat dissipating portion 252 is distinct from the heat transfer portion 241 and is spaced apart therefrom in a longitudinal or horizontal direction.

The heat dissipating portion 252 includes a base 254 that extends out in a cantilevered fashion from the heat transfer portion 241 along a similar longitudinal axis. A plurality of vertical heat-dissipating fins 256 are disposed on the base 254 and extend vertically downwardly from the heat dissipating portion base 254. As illustrated, the fins 256 are spaced apart from each other in the longitudinal (horizontal) direction to define a plurality of cooling passages 258 therebetween that are spaced away lengthwise from the heat transfer portion 241 and which further extend lengthwise with respect to the modules. In order to retain the heat transfer portion 241 in contact with a corresponding module, and also resist any moment that may occur due to the weight and/or length of the heat dissipating portion 252, retainers 260 are illustrated. These retainers 260 are attached to the frame top surface 233 by means of fasteners, such as rivets 262, which may be formed as part of the cage 222 in the nature of vertical posts 263 that are received within corresponding openings 264 disposed in the retainer base portion 265. The free ends of these posts 263 may be "dead-headed" or "mushroomed" to form the connection between the retainers 260 and the skirt 244. The retainers 260 are seen to have pairs of cantilevered spring arms 267 associated with them and which extend longitudinally from the base portions 265 as illustrated. The spring arms 267 are flexible and are formed as elastic spring arms 267 with a preformed downward bias. The spring arms 267 terminate in free ends 268 and they extend at a downward angle into contact with the heat transfer member skirt 244. Four such contact points are provided for the heat sink 240 assembly illustrated in the Figures, and the contact points will define a four-sided figure when connected by imaginary lines. However, the contact points of the spring arms 267 may vary from the locations shown according to the extent to which space is available on the skirt portion 244 of the heat sink member 240.

The elasticity of the spring arms 267 permits a designer to obtain a desired contact pressure by configuring the length of the spring arm 267, the depth to which the spring arm 267 depends down into the recess 246 and the height of the stub 269 that joins the spring arm 267 to the retainer 260. The fastener connection of the retainer 260 to the skirt plate 244 eliminates forming and utilizing attachments on the sides of the cage 222 which would take up space and affect spacing between cage 222. The rivets 262 also have a low profile so that the frame 226 is not unduly enlarged in any direction, including the vertical direction. The spring arms 267 are relatively short in length and therefore contact the heat transfer portion 241 at approximately four corners thereof to exert a reliable contact pressure on it in order to maintain it in good thermal transfer contact with any modules.

Uniquely, the heat-dissipating fins 256 are removed from immediate contact with the heat transfer portion 241 of the heat sink assembly 240. Rather, they are positioned on the heat dissipating portion 252 and they extend downwardly therefrom. The fins 256 are longitudinally spaced away from the heat transfer portion 41 and its base 242. The fins 256 are further arranged in a series of planes, shown as vertical planes F, that intersect both the horizontal plane, H1, in which the heat transfer portion skirt extends and the horizontal plane H2 in which the thermal contact surface(s) 250 extend. As shown in FIG. 19C, not only do the vertical planes F intersect the two planes H1 and H2, but the fins themselves extend for heights that intersect those two planes. Furthermore, adjacent fins 256 are separated by intervening cooling passages or air channels through which air may circulate. The fins 256 and cooling passages 258 extend transversely to a longitudinal axis of the heat sink assembly 240. In this manner, the fins 256 may occupy the space R rearwardly of the cage 222 and above the wires 272 which are terminated to the receptacle connector 271 supported in the cage 222. Locating the fins 256 in this manner permits the overall height of the device in which the cage strictures are used to be reduced by approximately the height of the fins that ordinarily would project upwardly from the cage. It is desired to have the fins 256 not touch the wires 272 in this orientation. In this regard, the height of the fins 256 is preferably less that the height of the cage 222 as illustrated in the Figures.

Figure 19D:
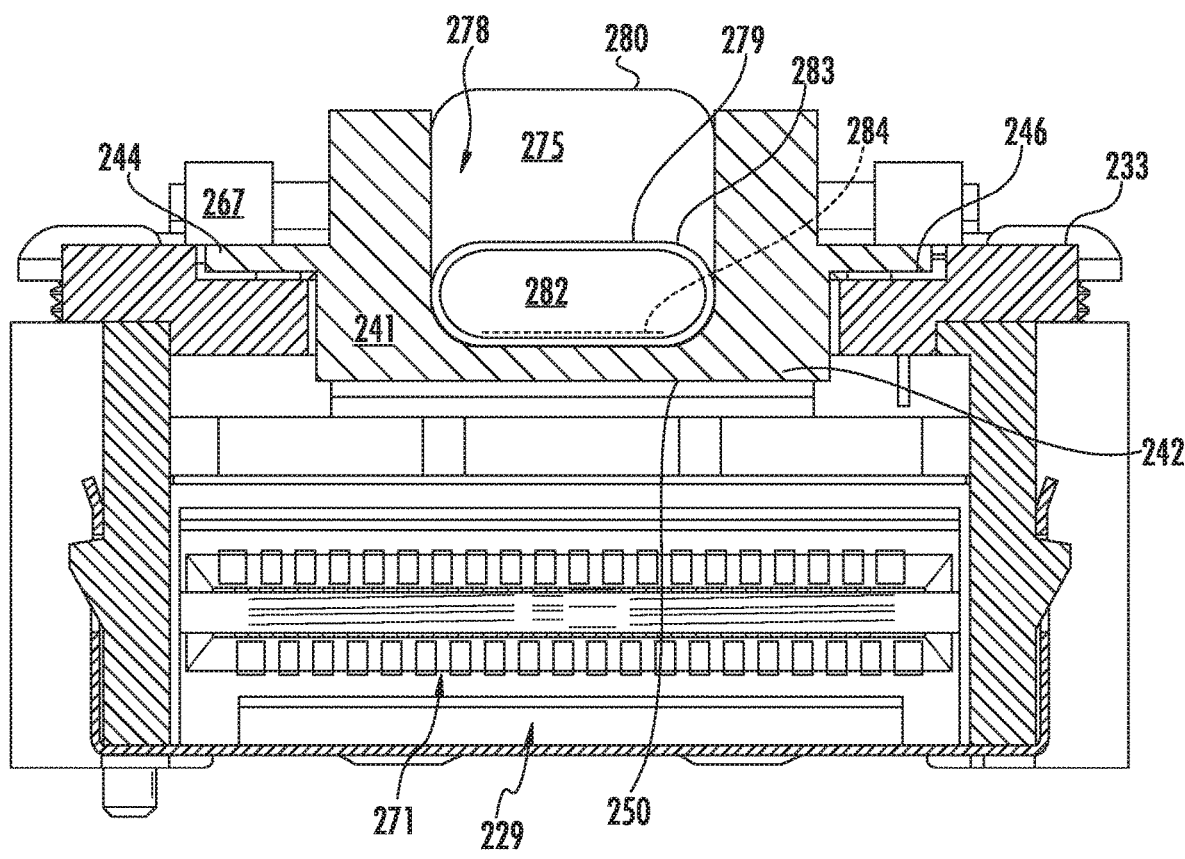
FIG. 19D is a transverse sectional view taken through the cage-heat sink assembly in the transfer portion of the heat sink assembly of FIG. 17, taken along lines D-D thereof.

The heat transfer and heat dissipating portions 241, 252 are shown as being integrally formed as one piece to promote heat transfer from the transfer portion 241 to the dissipating portion 252. However, it is contemplated that the two portions 241, 252 could be formed separately and subsequently joined together where desirable. In order to further enhance the transfer of heat from the heat transfer portion 241, a thermal transfer member 274 is provided that extends lengthwise along and in contact with the heat transfer and heat dissipating portions 241, 252. Such a transfer member 274 is shown in the Figures as a heat pipe 275, having an oblong, or elliptical, cross-sectional configuration which include major and minor axes that define such a shape. (FIG. 19D.) The oblong configuration of the heat pipe 275 increases the amount of contact area between the heat pipe 275 and the two portions 241, 252 of the heat sink assembly 240. Other non-circular configurations such as a rectangular inner cavity may be utilized or even cylindrical ones. The heat pipe 275 is received within a common channel 278 that also extends longitudinally along the heat sink assembly 240 and it follows the contour of the two portion 241, 252. Accordingly, the heat pipe 275 has an offset configuration with two distinct portions 279, 280 that extend at the different heights, or elevations, of the heat sink assembly 240.

The heat pipe 275 is a hollow member with an inner cavity 282 defined by sidewalls 283 that is sealed at its ends and which contains a two-phase (e.g., vaporizable) fluid within its inner cavity 282. Examples of a two-phase fluid that can reside within embodiments of inner cavity 282 include purified water, freon, etc. The heat pipe 275 and its walls 283 can be composed of aluminum, copper or other thermally conductive materials. The inner cavity 282 preferably includes an evaporator region 279 located adjacent the heat transfer portion 241 and a condenser region 280 located adjacent the heat-dissipating portion 252. Heat is transmitted from the heat transfer portion 241 through bottom and side walls 283 of the heat pipe 275 into the inner cavity 282 where is can cause the two-phase fluid present in the evaporator region 279 to evaporate. This vapor can then be condensed to liquid in the condenser region 280. In the illustrated embodiment, the vapor gives up heat as it condenses, and that heat is transmitted out of the inner cavity 282 through the walls 283 of the heat pipe 275 into the base of the heat dissipating portion 252 and its associated fins 256. The inner cavity 282 may include a wick 284 to facilitate travel of the condensed liquid along the wick back to the evaporator region 280. (FIG. 19D.) The wick 284 may take the form of grooved channels on the interior surface of the inner cavity 282, or an extent of wire mesh or the like.

Figure 19E:
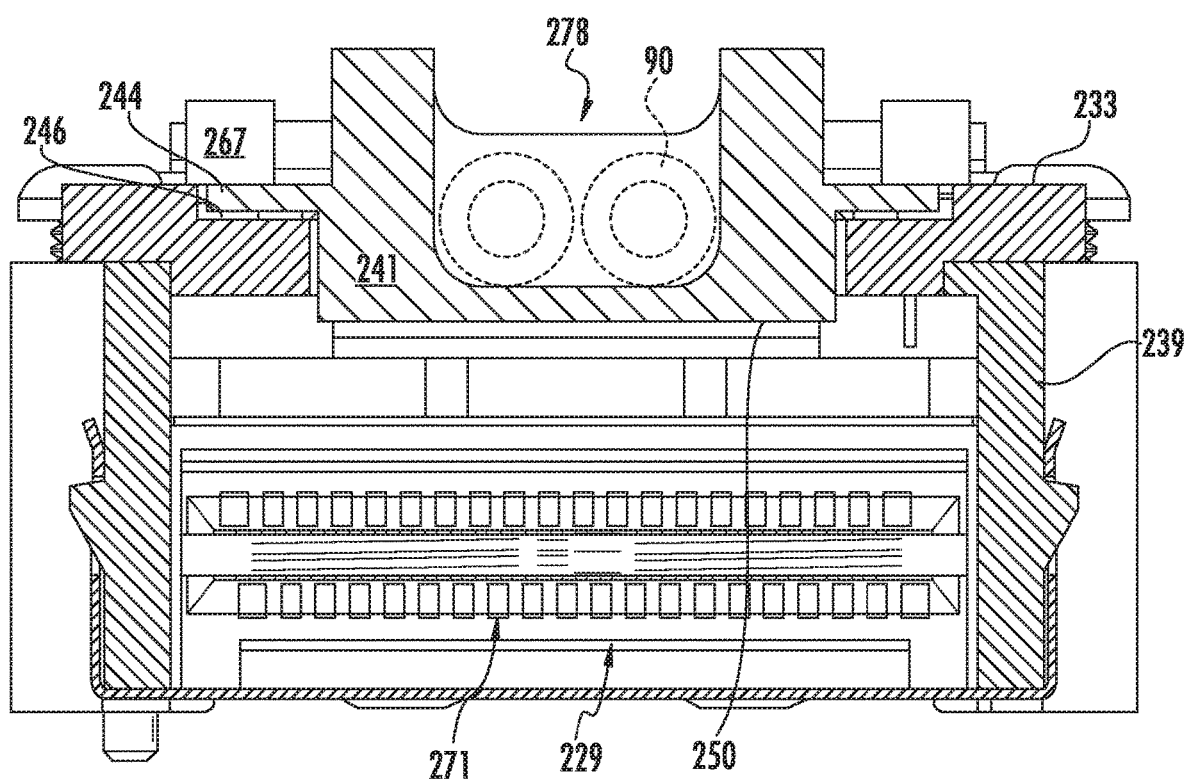
FIG. 19E is the same view as FIG. 19D, but with the heat pipe removed from the heat sink assembly for clarity and with an alternate configuration of a pair of heat pipes shown in phantom.
Figure 19F:
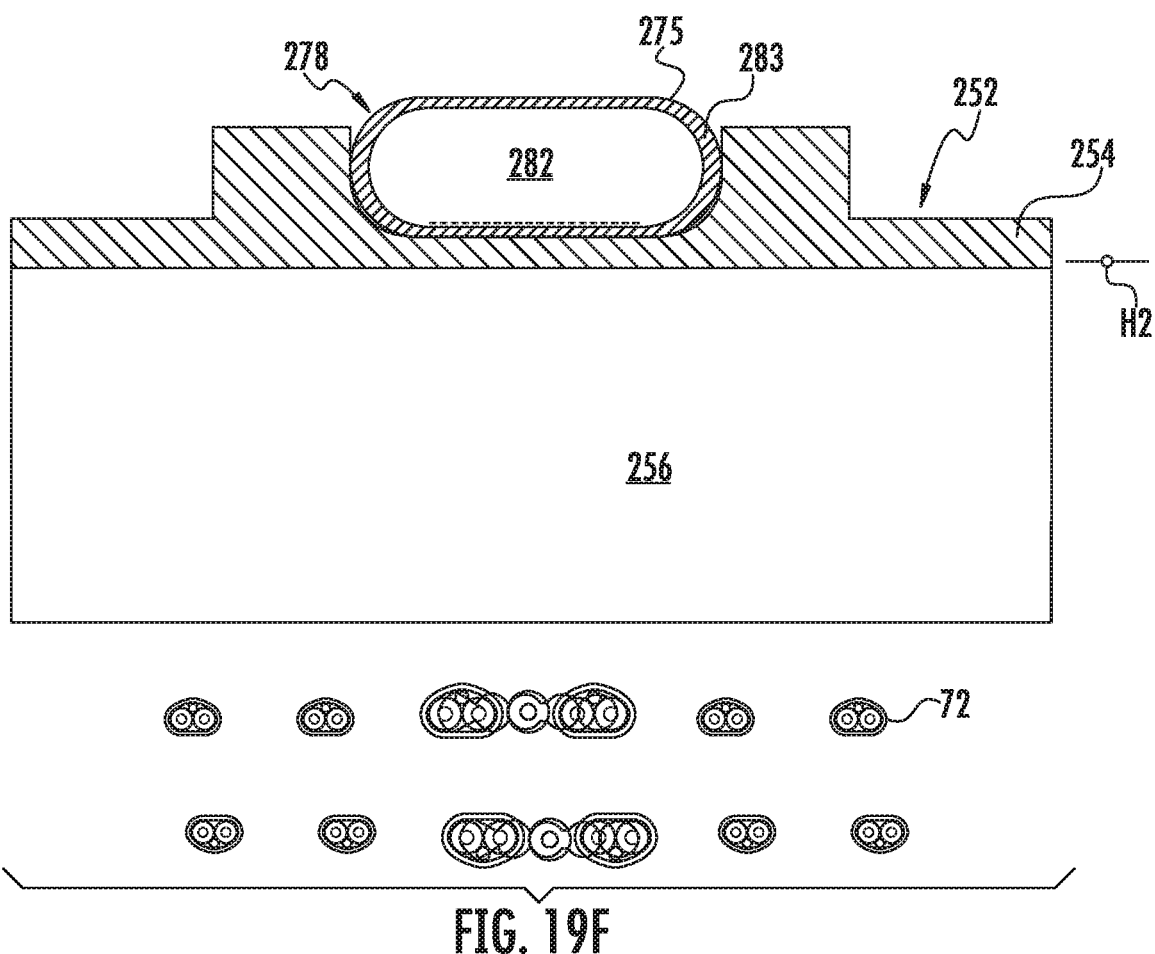
FIG. 19F is a transverse sectional view, looking rearwardly, taken through the cage-heat sink assembly in the dissipating portion of the heat sink assembly of FIG. 17, taken along lines F-F thereof.
Figure 19G:
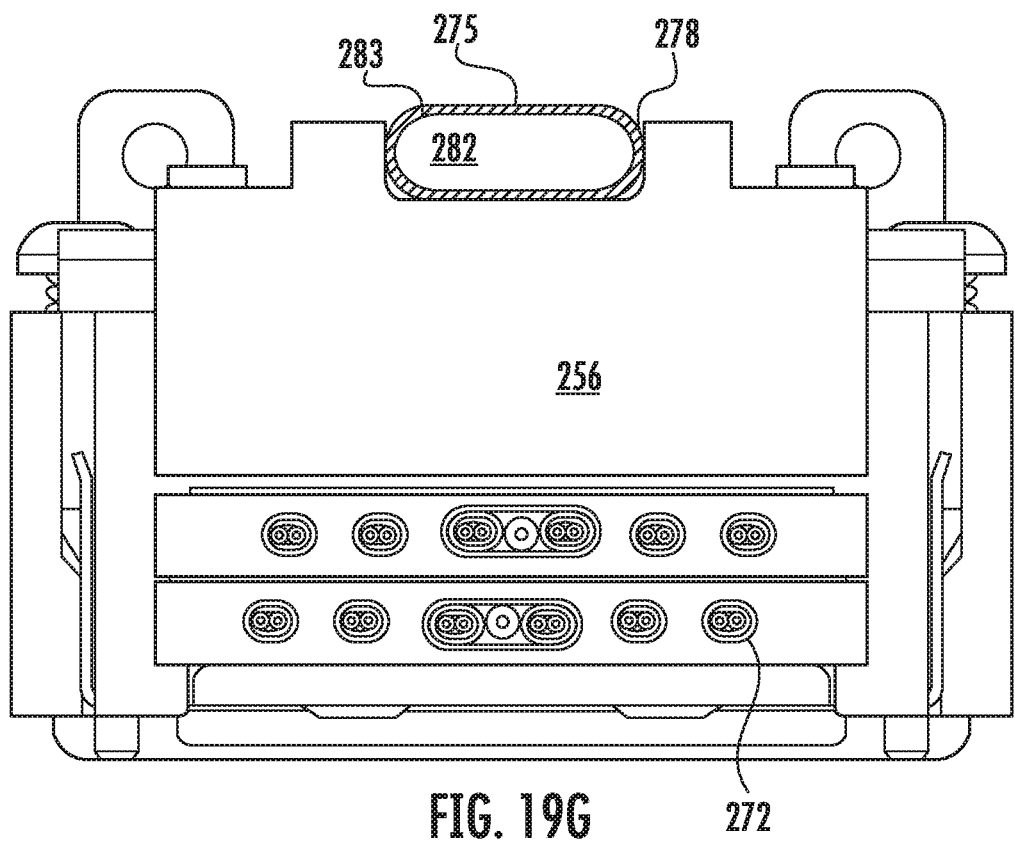
FIG. 19G is a transverse sectional view, looking forwardly, taken through the cage-heat sink assembly in the dissipating portion of the heat sink assembly of FIG. 17, taken along lines G-G thereof, illustrating the clearance between the heat-dissipating fins and the connector wires.

As illustrated, the heat transfer and heat dissipating portions 241, 252 of the heat sink assembly 240 extend longitudinally but extend at different elevations, with the heat dissipating portion 252 being raised with respect to the heat transfer portion 241. This difference in elevation facilitates, to some extent, the movement of the liquid vapor from the heat transfer portion 241 up into the heat dissipating portion 252, but its primary purpose is to accommodate the heat dissipating portion 252 in its horizontal extent without having to modify the frame 222 to accommodate it. If one desired to extend the heat dissipating portion 252 at the same elevation as the heat transfer portion 241, the rear wall 224 and a portion of the top surface 233, proximate thereto would need to be modified. A channel, or recess, may be formed in those two walls 224, 233 to accommodate the area of the heat sink assembly 40 between the heat transfer and dissipating portions 241, 252. Also, although mostly one heat pipe 275 has been discussed, it is understood that multiple heat pipes, such as a pair of heat pipes 290, as illustrated in phantom in FIG. 19E may be routed in the heat sink assembly channel. In this instance, the pair of pipes may be encapsulated in a medium that facilitates heat transfer to make up for the amount of direct contact lost between a pair of heat pipes and a single, oblong configured heat pipe as illustrated. Thermally conductive greases or other compounds may be applied to the heat pipes to enhance the thermal transfer.

This heat sink assembly thermally engages the cage and uniquely transfers heat therefrom to an area rearwardly of the cage. With this structure and its downwardly depending heat dissipating fins, the devices in which such heat sink assemblies are used can have a reduced height, permitting additional devices in closets and stacks. The location of heat dissipating tins is such that all of the spaces between the fins are used for cooling as none of them have light pipes or any other members extending therethrough. The heat sink heat-dissipating portion extend horizontally but spaced above the motherboard of the device so a designer can utilize this open space for additional functional components without increasing the lateral size and depth of the host device. Examples of the manner in which the connectors with the heat sinks integrated therewith can be arranged and mounted for use in a host device are illustrated in FIGS. 15-16A.

As noted above, the cage of the connector 80 can be formed in a manner that allows for positioning the connector 80 in manner where the connector 80 is not supported by a circuit board and instead can be supported by other structures (such as conductive or insulative frames). In such a configuration, all the terminals are preferably connected to conductors in a cable so that signals (high speed and low speed) can be directed appropriately. In many such embodiments, the cage of the connector may be formed using a die cast material. Such a construction is not required as convention stamped metal construction will also be suitable.

Figure 20:
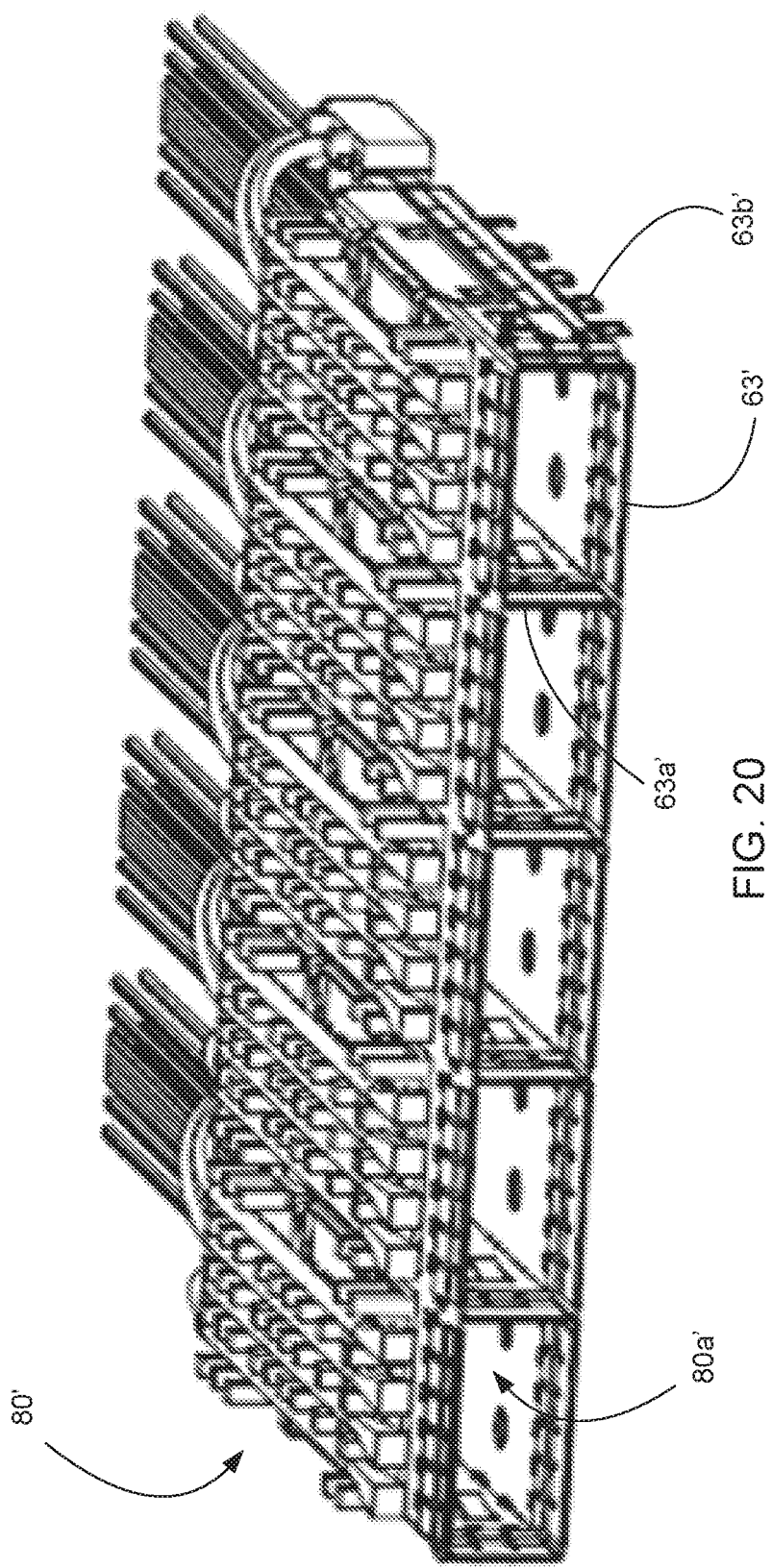
FIG. 20 is a perspective view of an alternative cage construction.

While a cage can be supported by a separate structure such as a frame, it should be noted that the connector can be mounted to a circuit board in a more conventional manner. For example, connector 80' in FIG. 20 is formed of stamped material and is configured to be press fit into a circuit board and provides multiple ports 80a' in a ganged configuration. The cage 63' includes dividing walls 63a' that help define the ports and the cage 63' includes tails 63b' that are configured to be pressed into a circuit board. For certain system configurations where extending a circuit board to an edge of the box is desired, it may be beneficial to have the connector 80' configured so that it can be mounted on the circuit board in a press-fit fashion as shown. In such a configuration, the high speed signal terminals are expected to be connector to cables but the low speed signals can be mounted to cables or connected to the circuit board in a desirable manner (for example, a connector such as is depicted in PCT Application No. PCT/US2014/054100, which is incorporated herein by reference in its entirety).

Figure 21:
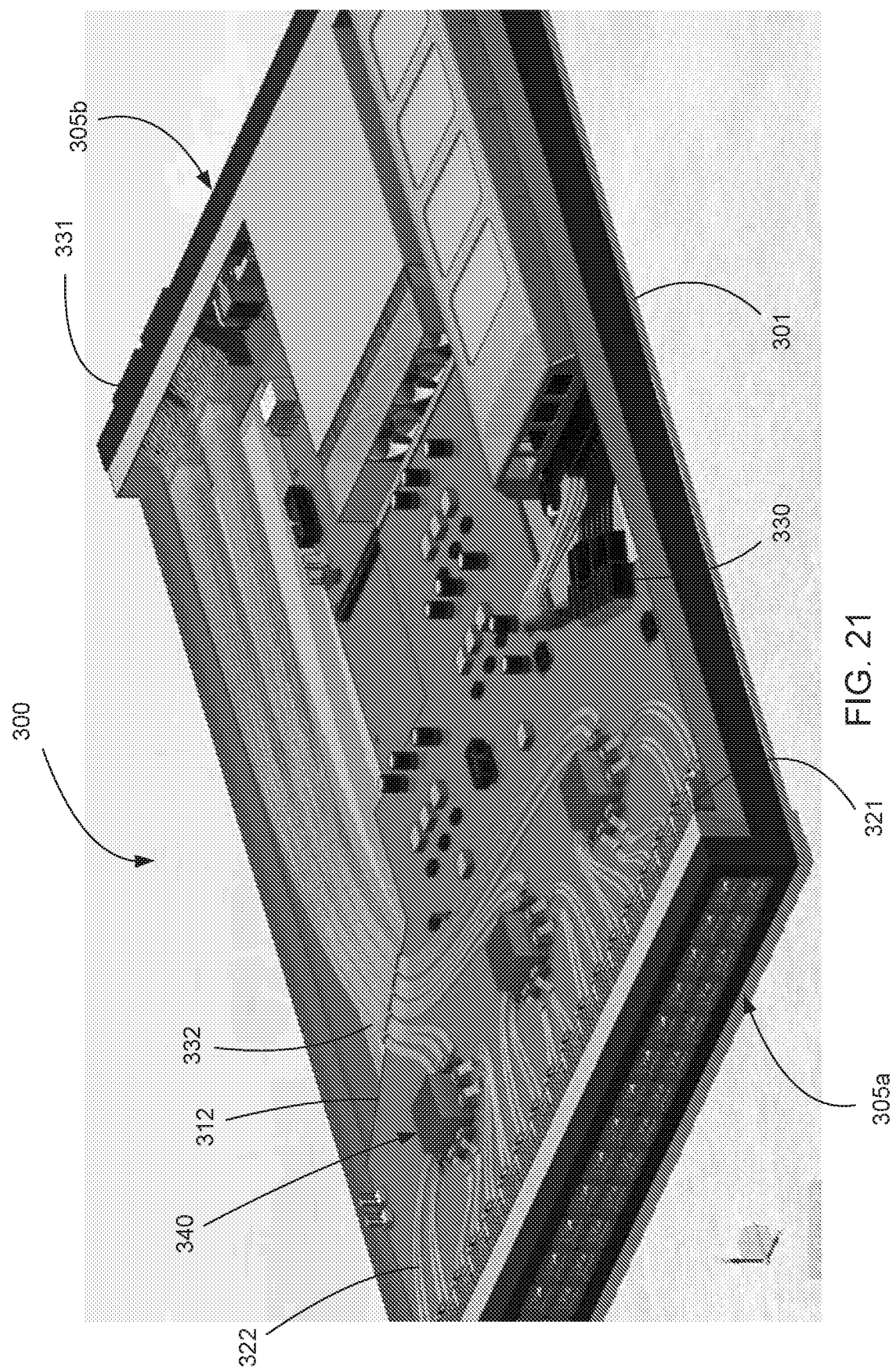
FIG. 21 is a perspective view of an embodiment of a computing device.
Figure 22:
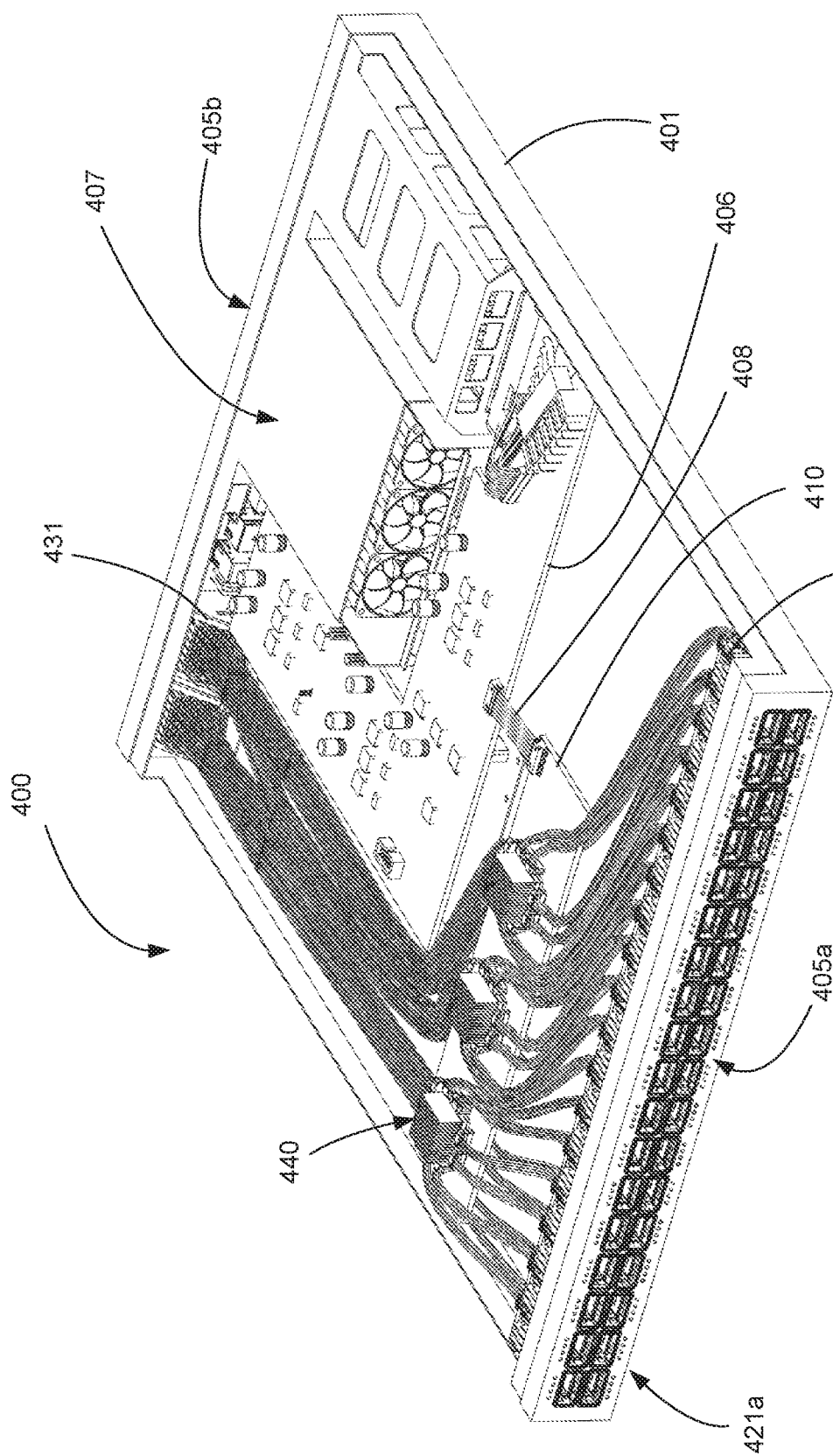
FIG. 22 is a perspective view of another embodiment of a computing device.
Figure 23:
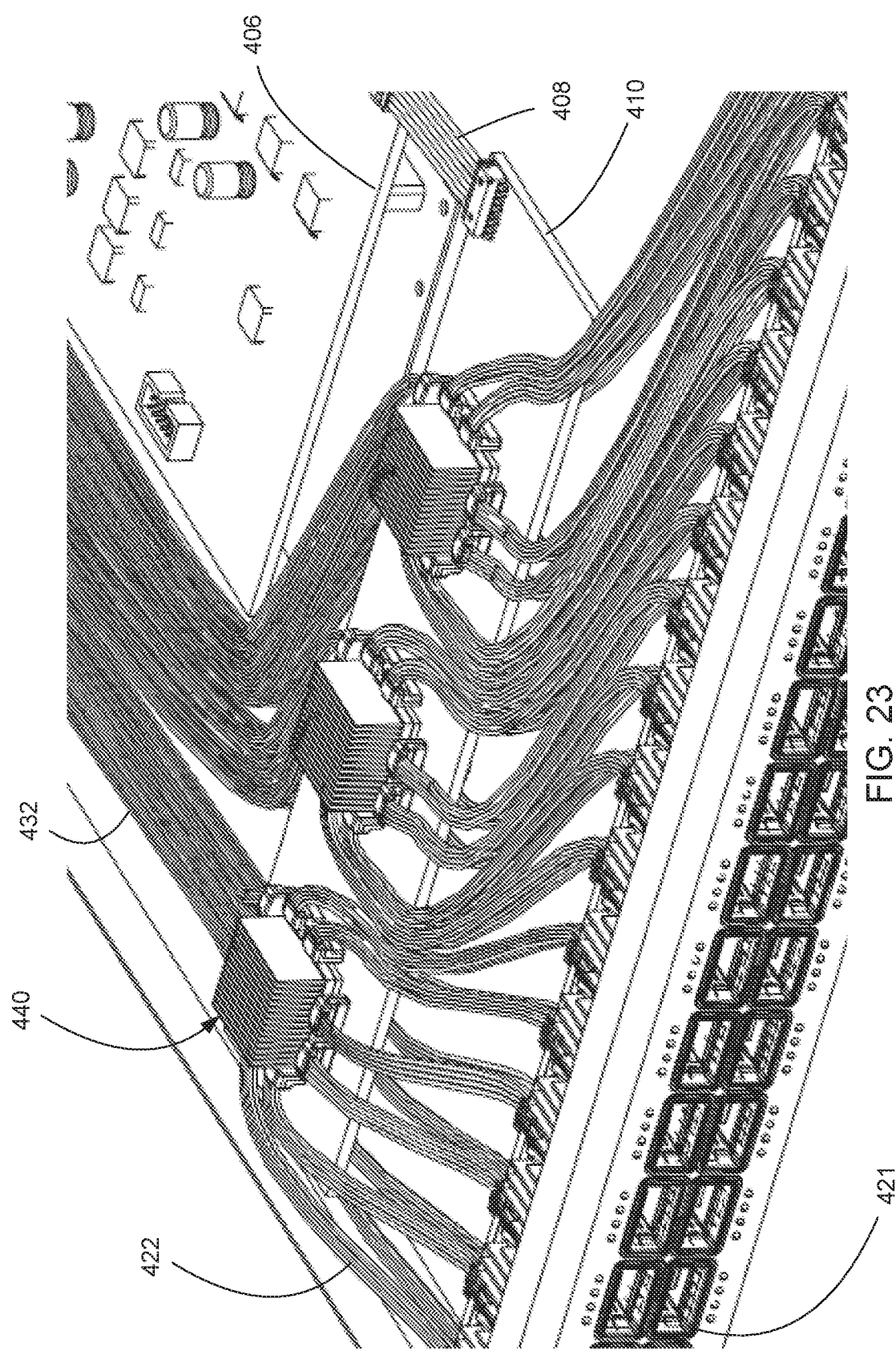
FIG. 23 is an enlarged perspective view of the embodiment depicted in FIG. 22.
Figure 24:
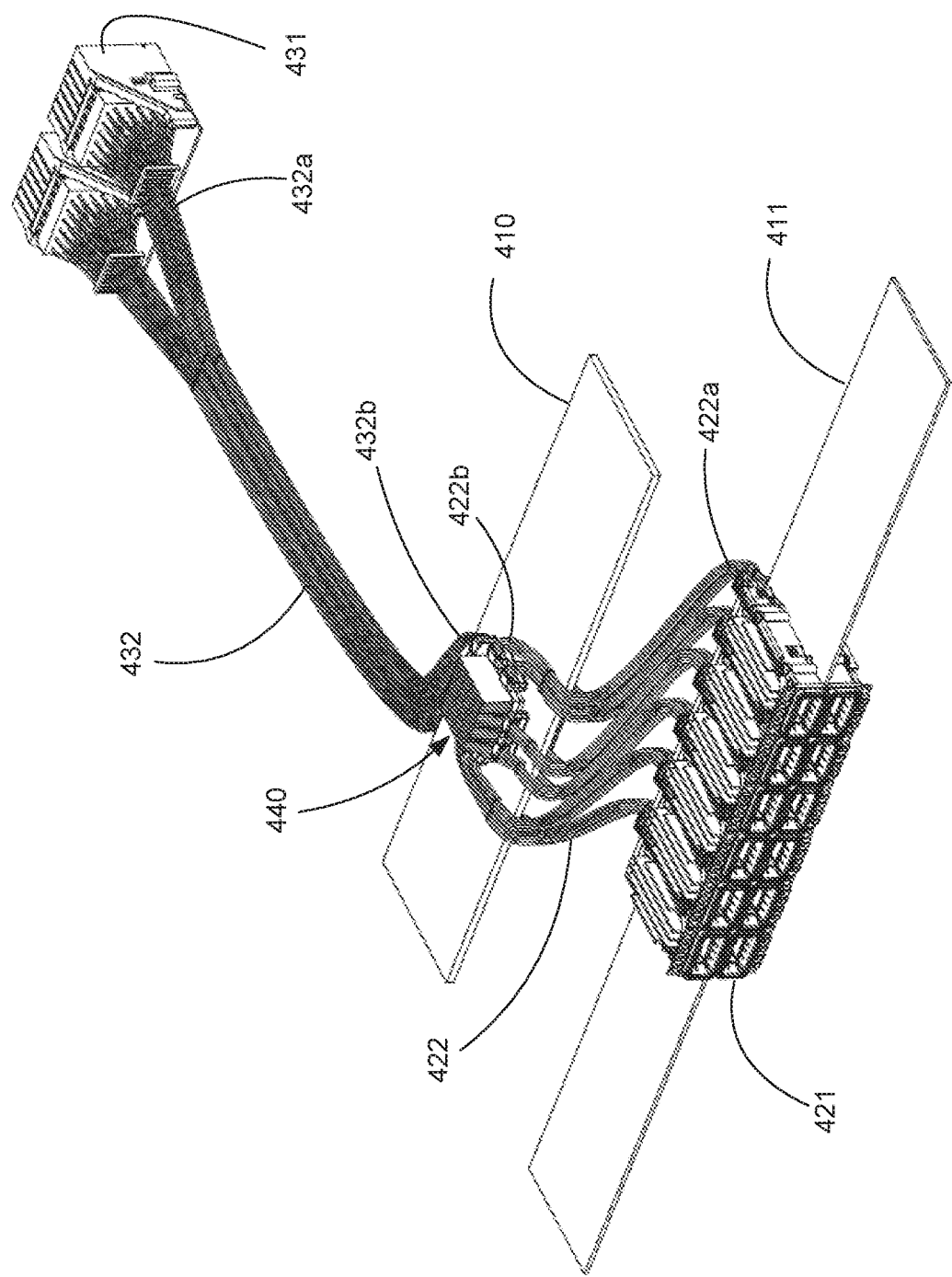
FIG. 24 is a simplified perspective view of an embodiment of bipass system.
Figure 25:
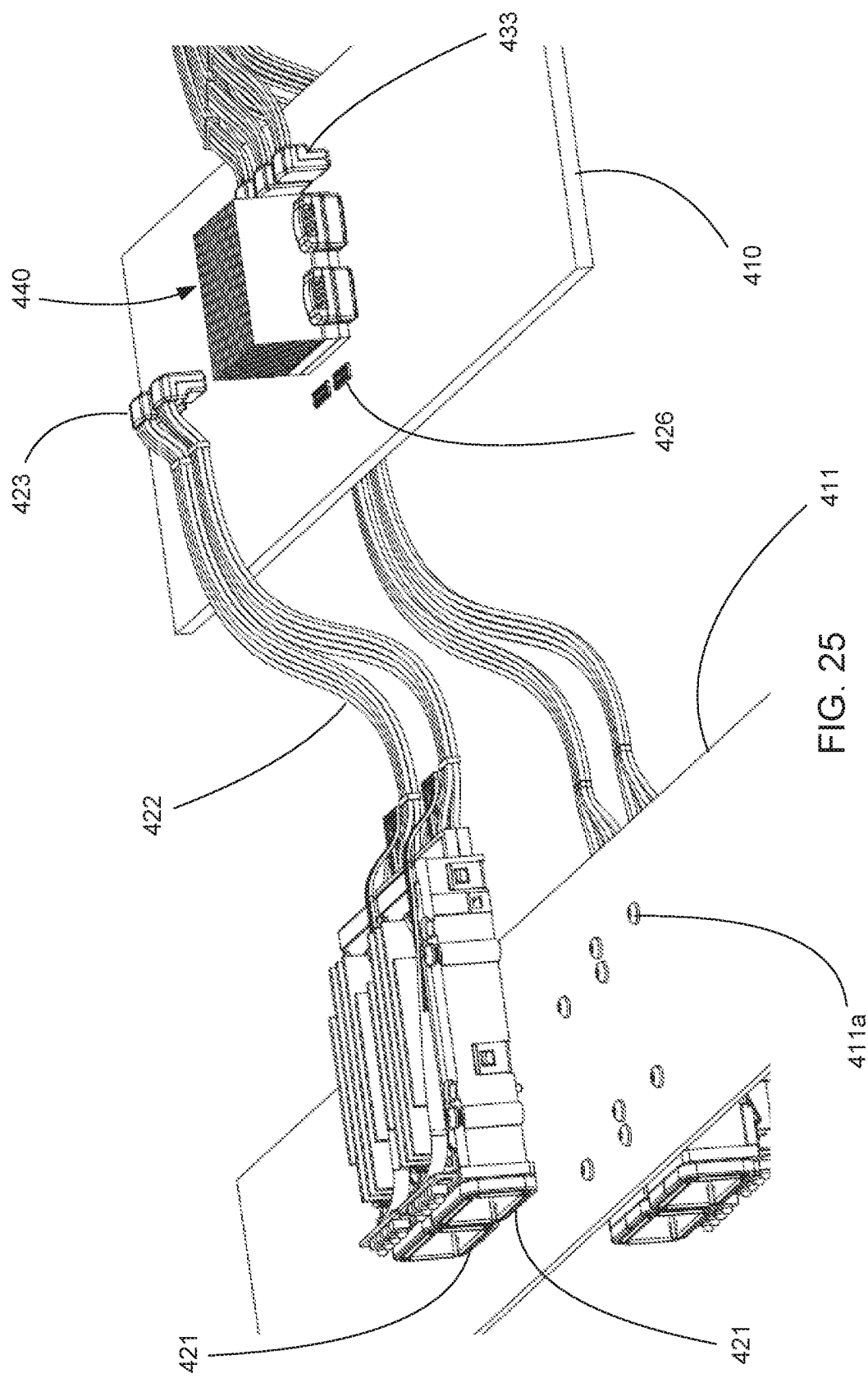
FIG. 25 is a simplified, partially exploded view of an embodiment of a bipass system.
Figure 26:
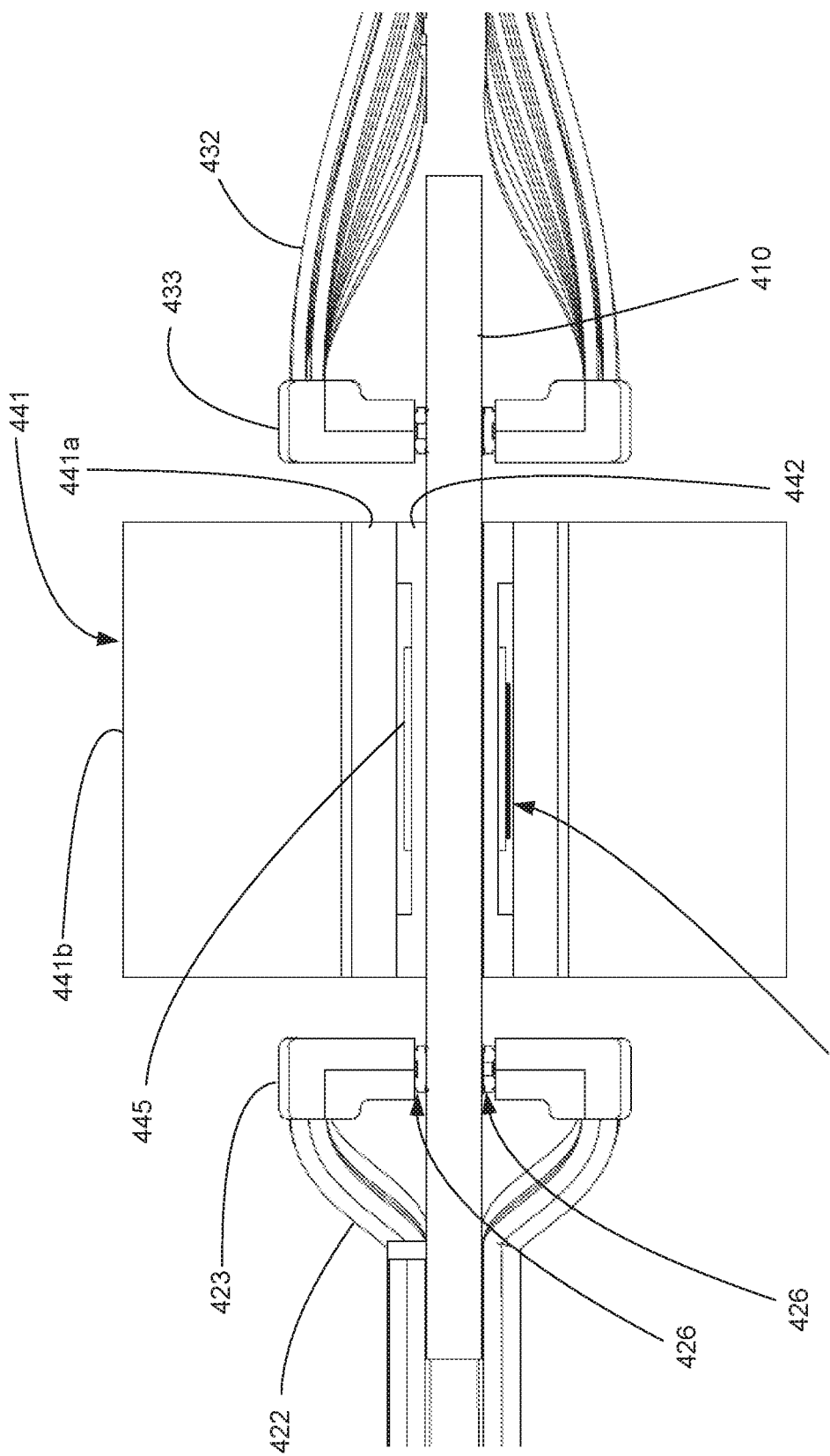
FIG. 26 is an elevated side view of a cross sectional of a chip package mounted on a signal circuit board.

FIG. 21 illustrates an embodiment of a computing device 300. The device 300 includes a chassis 301 with a first wall 305a and a second wall 305b. As depicted, the first wall 305a in a front wall and the second wall 305b is a rear wall (thus the first and second walls 305a, 305b are opposing) but the first and second walls 305a, 305b do not need to be on opposing sides and thus a number of configurations are possible.

The chassis 301 supports a main circuit board 312 that extends to adjacent the front wall 305a. A chip package 340 is provided on the circuit board 312 and first connectors 321 are connected to the chip package 340 by cables 322 that carry the high speed signals. A second connector 331 is positioned at the second wall 305b and is connected to the chip package 340 by cables 332. Power is provided to the circuit board 312 (and the various components supported thereby) via power connection 330. It should be noted that the distance between the first and second walls 305a, 305b can exceed 20 inches and thus would be problematic if the circuit boards were to be used to transmit the high speed signals, especially as the data rate approaches and exceeds 25 Gbps. Using non-return to zero (NRZ) encoding would require a signaling frequency of about 12.5 GHz and such frequencies are poorly compatible with conventional FR4 based circuit boards. In addition, as data rates approach 40 Gbps (and the signaling approaches 20 GHz) even the use of exotic materials would likely be insufficient to allow for convention circuit board techniques to be used.

FIGS. 22-27 illustrate another embodiment of a computing device. Specifically, computing device 400 includes a chassis 401 with a first wall 405a and a second wall 405b. A main circuit board 406 is provided and the main circuit board includes component circuitry 407. Component circuitry 407 can include power supplies, cooling fans and various digital signaling chips that either do not need to operate at high frequencies in order to support desired bandwidth or are intended to travel short distances. A support connection 408 (which is shown as a cable assembly for ease of assembly but could also be a two board connectors) can provide control signals and/or power signals to a signal board 410 that supports one or more chip packages 440.

First connectors 421 are positioned along the first wall 405a so as to provide ports 421a in the first wall 405a. Similarly, second connectors 431 are positioned along the second wall 405b so as to define an appropriate mating interface along the second wall 405b. As can be appreciated, however, the signal board 410 does not extend to first or second connectors. Instead, the first connectors 421 are coupled to the chip package 440 via cables 422 while the second connectors 431 are coupled to the chip package 440 via cables 432. The first connectors 421 can be formed in a manner similar to that which was discussed above and thus the internal details of connector 421 will not be repeated here for purposes of brevity. Instead it will just be noted that the above features of such a connector can be used herein in a desired manner and in a desired combination so as to provide a connector that meets the system requirements.

As can be appreciated, the first connectors 421 could be supported by a front circuit board 411. Alternatively, the front circuit board could be omitted and a frame such as frame 132 (discussed above) could be used to support the first connectors 421. If the front circuit board 411 is used then connector supports 411a can be used to secure the first connector 421 to the front circuit board 411.

Figure 27:
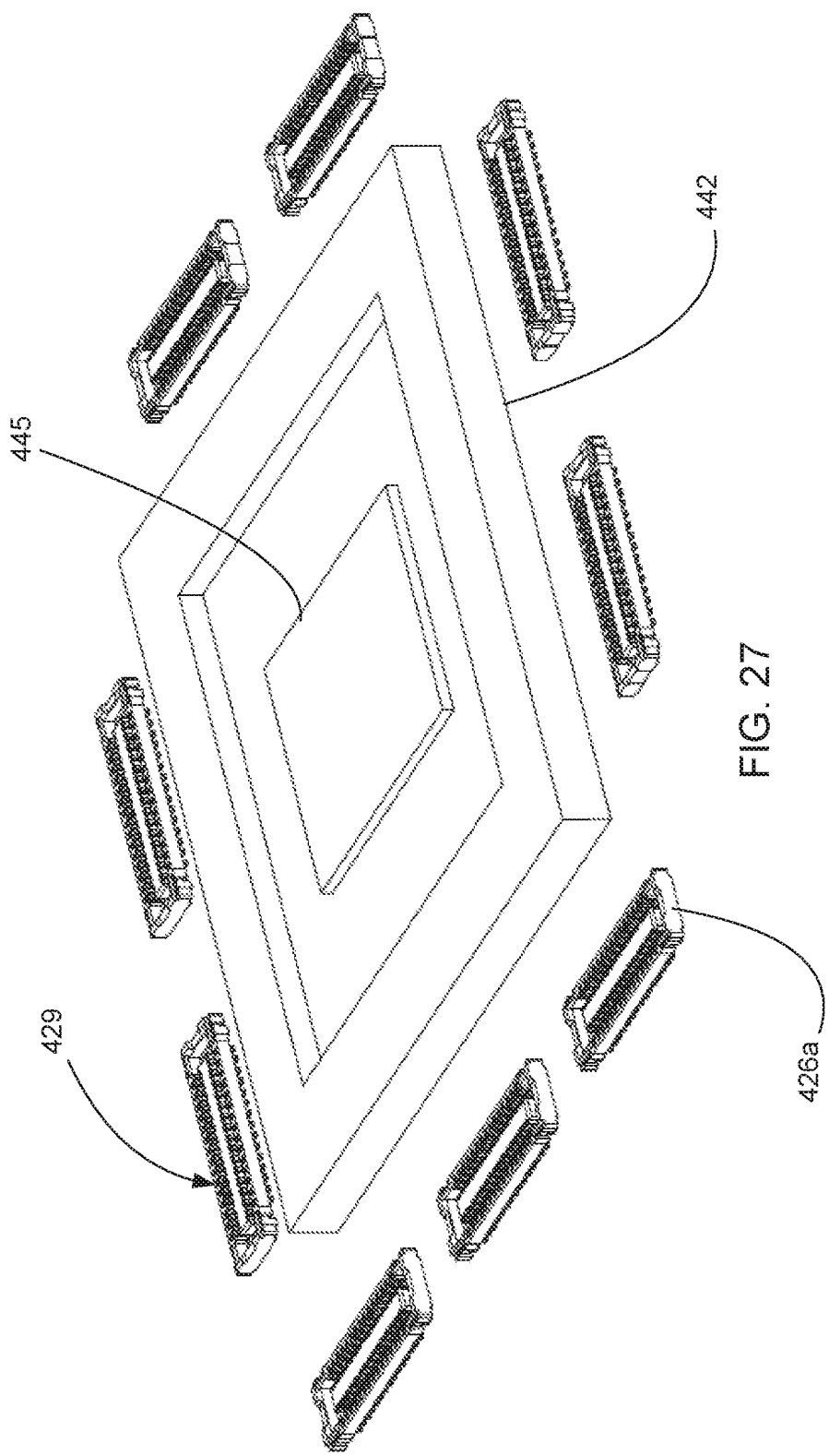
FIG. 27 is a simplified perspective view of an embodiment of a signal circuit board configuration.

The signal board 410 supports the chip package 440, which includes a chip 445, and arranged around the chip package 440 are a plurality of signal board connectors 426. Traces, as discussed above, can connect the chip 445 to the signal board connector(s) 426 and, as discussed above, an optional substrate can act as a connection between the chip 445 and the signal board 410. In an embodiment, such as is depicted in FIG. 27, the signal board connectors 426 can be positioned on at least two sides of the chip 445 and potentially can be positioned on four sides so as to increase system capacity. If desired, at least two signal board connectors 426 can be provided on each side of the chip 445. Naturally, further increases in density can be provided if the signal board 410 (or corresponding structure if a signal board is not used) has a chip on both sides (e.g., on top and bottom).

In operation it is expected that the signal board 410 will be prepared (which may include passing through a solder reflow operation) and then be mated to the first connector 421. To allow for such an installation process, the cable 422 has a first end 422a terminated to the first connector 421 and a second end 422b is terminated to first board connectors 423 and first board connectors 423 are mateable with the signal board connectors 426. Likewise, cable 432 can have a first end 432a terminated to the second connector 431 and a second end 432b terminated to the second board connectors 433. Such a configuration allows the signal board 410 to be mounted in the chassis 401 before being connected to the first connectors 421 and second connectors 433. In operation, it is expected that signal board connector 426 will include a housing 426a that supports a plurality of terminals 429 that are soldered to the signal board 410. Of course, in alternative embodiments a signal board connector could be press-fit onto the signal circuit board 410. As the use of solder or press-fit to mount a connector on a circuit board is well known, no further discussion of such connector details will be provided herein.

Regardless of how the signal board connector 426 is mounted on the signal connector board 410, it provides a mateable interface to the signal connector board 410. The signal connector board supports a chip 445 (which typically will be on a carrier or substrate of some nature). The chip 445 can be connected to the signal circuit board 410 as discussed above and can be supported by a thermal frame 442 that supports a cooling block 441. The cooling block 441, which can be in the form of a conventional heat sink, includes a cooling base 441a that will preferably be compressed against the chip 445 and may include cooling fins 441b to increase surface area and improve cooling of the chip. As can be appreciated, a thermal transfer compound 443 will thermally couple the chip 445 to the cooling base 441a.

The chip 445, which as discussed above can be an ASIC, DSP and/or any desired combination of controllers and processors, thus is connected to the first connector 421 and the second connector 431 via only a very short path through a signal circuit board 410. As signal loss is related to the distance traveled along the board, shortening the distance as depicted allows for much lower loss than convention systems while allowing for the use of conventional circuit board materials and constructions methods.

Figure 28A:
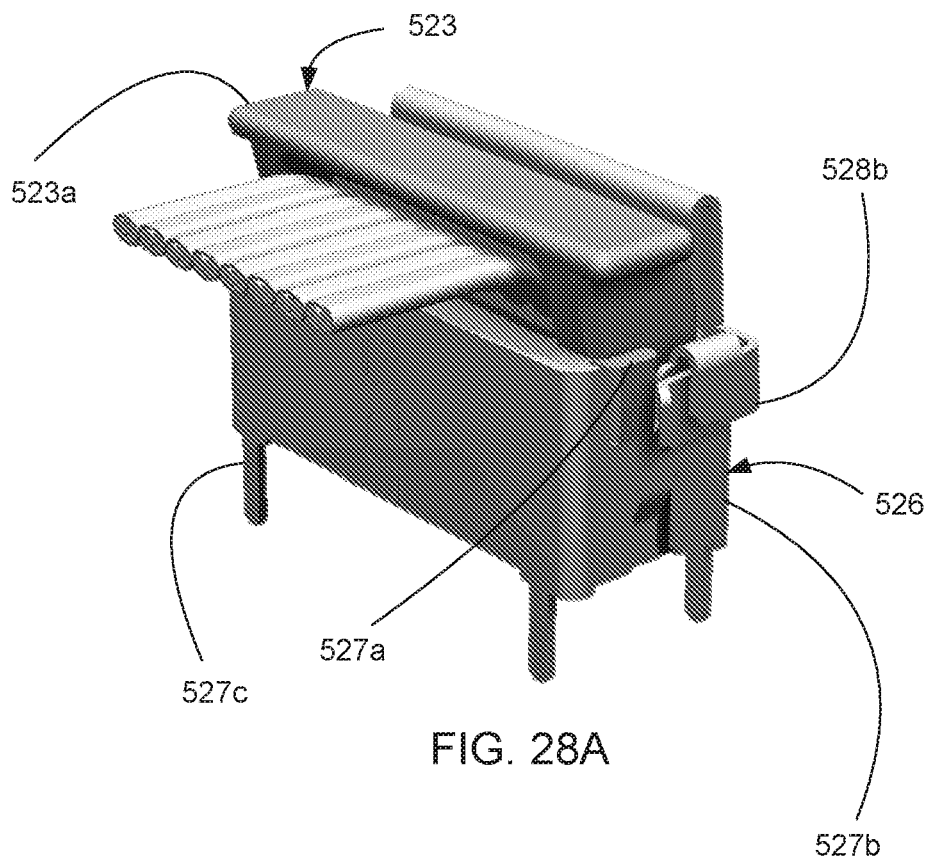
FIG. 28A is a perspective view of an embodiment of a connector system suitable for connecting to a signal circuit board.
Figure 28B:
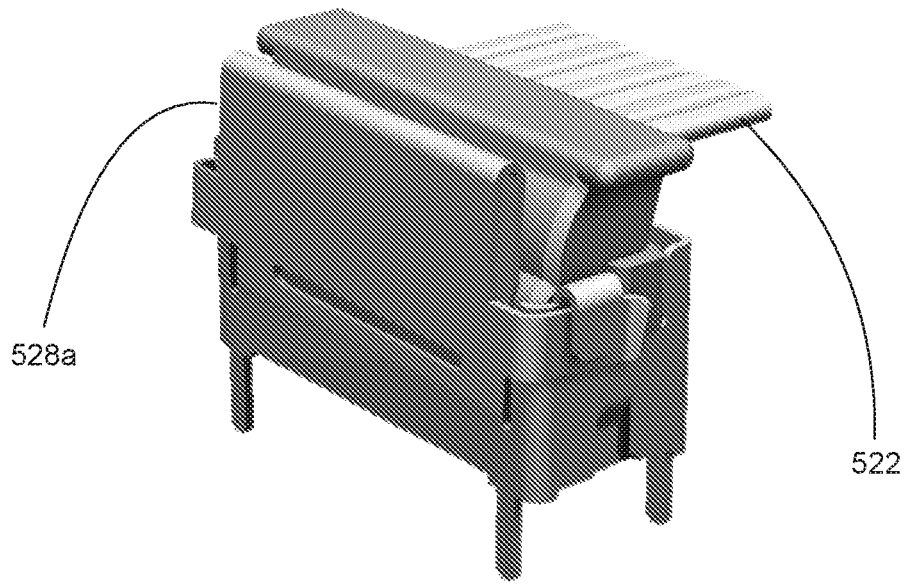
FIG. 28B is another perspective view of the embodiment depicted in FIG. 29A.

FIGS. 28A and 28B illustrate an alternative embodiment of a signal board connector and first board connector. Specifically, a first board connector 523 includes a housing 523a that supports one or more rows of cables 522. The housing 523a of the first board connector 523 mates with a signal board connector 526 that includes a housing 527a in a cage 527b that has legs 527c that, in operation, help secure the cage 527b to the corresponding signal circuit board. A biasing member 528a secures the first board connector 523 in the signal board connector 526 and includes an actuation member 528b that, when actuated, allows the first board connector 523 to be removed from the signal board connector 526.

Naturally, other configurations of the first board connector and signal board connector are possible and thus the depicted embodiments are not intended to be limiting unless otherwise noted. In addition, the first board connector and the second board connector may be the same or can be different so as to ensure that the proper connectors cannot be mounted in the wrong location. To further protect from potential installation problems, each of the first board connectors and second board connectors can be keyed differently so that only the desired configuration can be installed.

FIG. 29 illustrates an alternative embodiment of a chip package 640. A support layer 614 is provided that supports a flex layer 690, that in turn is supporting a substrate 646 and the substrate 646 supports a chip 645. The chip 645 and substrate 646 can be as described above. The support layer 614 could be a circuit board or some other material. While the support layer 614 is shown as being relatively comparable in size to the chip 645 and the substrate 646, in practice it is expected that the support layer will be larger than the chip 646 and the substrate 646 so as to provide additional support. As can be appreciated, rather than use a circuit board to couple the chip to a connector, the depicted embodiment uses a flex circuit to couple connectors 626 to the chip 645. The entire chip package 640 can be supported by a frame (not shown) or by the support layer 614, depending on the desired configuration and can include heat sinks to help dissipate heat away from the chip. In such a system the support layer 614 could provide a mounting point for the heat sink similar to that discussed above.

Flex circuits can be made with an intricate pattern as they can be multiple layers thick and the flex circuit 690 can terminate to multiple signal board connectors 626 (which would be configured to be connected to corresponding first board connectors so that the rest of the system was substantially the same). Thus, solder connections between the flex circuit 690 and the substrate 646 or chip 645 are possible. And, as can be appreciated, a flex circuit can provide high performance, relative to a circuit board. It should be noted that while the substrate 646 is depicted as a separate component, in an embodiment the flex circuit 690 could replace the substrate 646 and thus the use of the substrate 646 is optional in the chip package 640. As can be appreciated, therefore, a signal board connector can but does not have to be mounted on a circuit board.

It should also be noted that the flex circuit, which often is formed with KAPTON but can also be a rigid-flex circuit, can be formed with polyimide, acrylic adhesive, epoxy adhesive and fluoropolymer adhesive solutions. Thus the choice of material is not intended to be limiting as the design of the system allows even relatively lossy materials like FR4 to be used effectively.

Specifically, the path lengths of traces in the signal board (if a signal board is used) are kept short such that for frequencies around 15 GHz (which is slightly above to what is needed to support 25 Gbps using NRZ encoding and 50 Gbps using PAW encoding) it is expected that less than 2 dB (preferably less than 1 dB) of insertion loss due to the circuit board can be provided between the chip and the signal board connector. This is because even less expensive circuit board materials can provide less than 1 dB of loss per inch of travel at that frequency and the system design allows the traces to have a relatively short path length (often less than two inches long) between the chip and the signal board connector. Higher performance circuit board materials can provide loss in the range of about 0.5 dB per inch. Thus it is feasible to have less than 1 dB of loss between the chip and the signal board connector. Naturally, as the operation frequency increase and approaches 25 GHz the depicted configurations that allow for reducing insertion loss become even more important. Applicants have determined that even for 25 GHz signaling operation the depicted system can still provide relatively low insertion loss (less than 2 dB of insertion loss in the circuit board for well-designed systems) and thus the depicted configurations may be highly desirable for high performance applications. In addition, for more sensitive applications a conventional circuit board can be omitted and the chip can be connected to a flex circuit that is terminated to the signal board connector so as to potentially provide less insertion loss than is typically found with circuit boards.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A computing device, comprising:
   an enclosure with a first wall;
   a chip package including a chip electrically connected to a first signal board connector;
   a first connector supported near the first wall, the first connector including a cage and an internal connector with a mating interface, the internal connector supporting a first pair of terminals, each terminal of the first pair of terminals having a contact in the mating interface, the first connector being supported above a circuit board;
   a first cable with a pair of conductors, the cable including a first end and a second end, a first end of the cable terminated to the first pair of terminals;
   a first board connector, the first board connector terminated to the second end of the first cable and configured to mate with the first signal board connector; and
   component circuitry that provides power to the chip.

2. The computing device of claim 1, wherein the chip is supported by a signal board and the first signal board connector is mounted on the signal board.

3. The computing device of claim 2, wherein the enclosure includes a second wall, the computing device including a second connector supported near the second wall, the second connector terminated to a first end of a second cable, the second cable having a second end terminated to a second board connector, wherein the signal circuit board supports a second signal board connector that is electrically connected to the chip, the second board connector configured to mate with the second signal board connector.

4. The computing device of claim 2, wherein the component circuitry is connected to the signal board via a cable assembly.

5. The computing device of claim 1, wherein the chip package includes a substrate that supports the chip.

6. The computing device of claim 5, wherein the substrate is supported by a signal board, the signal board not extending to the first connector.

7. The computing device of claim 6, wherein the first connector is supported by a nest, the nest being supported in a cantilevered fashion from the first wall.

8. The computing device of claim 1, wherein the chip is electrically connected to a plurality of signal board connectors and each of the plurality of signal board connectors are mated to a different first connector via a corresponding board connector.

9. A connector system, comprising:
   a first connector including a cage and an internal connector supported by the cage, the internal connector including a card slot with a plurality of terminals positioned on two sides of the card slot, the plurality of terminals each including contacts that extend into the card slot and tail portions, the cage opening being orientated in a vertical alignment;

a plurality of cables, each of the cable with a first end and a second end, the first ends being terminated to the tail portions;

a first board connector terminated to the second ends of the plurality of cables;

a signal board supporting a chip, the signal board having traces connected to the chip; and a signal board connector mounted on the signal board, the signal board connector including terminals that are electrically connected to the traces, the signal board connector configured to mate with the first board connector.

10. The connector system of claim 9, wherein the signal board connector is a first signal board connector and a second signal board connector is mounted on the signal board, the first and second signal board connectors being positioned on two sides of the chip.

11. The connector system of claim 9, wherein the signal board connector is one of a plurality of signal board connectors and at least of the plurality of signal board connectors is mounted on each of four sides of the chip.

12. The connector system of claim 9, wherein the insertion loss in the signal board is less than 2 dB when operating at 15 GHz.

13. The connector system of claim 9, wherein the insertion loss in the signal board is less than 1 dB when operating at 15 GHz.

14. The connector system of claim 9, wherein the insertion loss between the chip and the signal board connector is less than 2 dB when operating at 15 GHz.

15. The connector system of claim 8, wherein the plurality of signal board connectors are arranged on a plurality of sides of the chip package.

16. The connector system of claim 15, wherein the plurality of signal board connectors are arranged on four sides of the chip package.

17. The connector system of claim 9, further comprising a thermal transfer portion that is positioned on top of the cage, the thermal transfer portion including a heat pipe that is configured to direct thermal energy from inside the cage to a location rearward of the cage.

18. The connector system of claim 1 further comprising a thermal transfer portion that is positioned in the cage, the thermal transfer portion including a heat pipe that is configured to direct thermal energy from inside the cage to a location rearward of the cage.

19. The connector system of claim 18, wherein the thermal transfer portion has a plurality of fins arranged rearward of the cage, the plurality of fins configured to act as a heat sink.

20. A computing device, comprising:
an enclosure with a first wall;
a chip package including a chip electrically connected to a plurality of signal board connector;
a plurality of first connectors supported near the first wall, each of the first connectors including a cage and an internal connector with a mating interface, each of the internal connectors supporting a first pair of terminals, each terminal of the first pair of terminals having a contact in the mating interface;
a plurality of cables, each of the cables having a pair of conductors and a first end and a second end, the first end of each of the cables terminated to a respective one of the first pair of terminals;
a plurality of board connector, the board connectors terminated to the second ends of the plurality of cable and configured to mate with first signal board connectors, wherein the plurality of signal board connectors are arranged on at least two sides of the chip package.

21. The computing device of claim 20, wherein the plurality of signal board connectors are arranged on two opposing sides of the chip package.

22. The computing device of claim 20, wherein the plurality of signal board connectors are arranged on three sides of the chip package.

* * * * *